(12) United States Patent
Oka et al.

(10) Patent No.: US 12,517,431 B2
(45) Date of Patent: Jan. 6, 2026

(54) PATTERN FORMING METHOD, ACTINIC RAY-SENSITIVE OR RADIATION-SENSITIVE COMPOSITION, AND METHOD FOR MANUFACTURING ELECTRONIC DEVICE

(71) Applicant: FUJIFILM Corporation, Tokyo (JP)

(72) Inventors: Hironori Oka, Haibara-gun (JP); Michihiro Shirakawa, Haibara-gun (JP); Mitsuhiro Fujita, Haibara-gun (JP); Kazunari Yagi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 653 days.

(21) Appl. No.: 17/955,863

(22) Filed: Sep. 29, 2022

(65) Prior Publication Data
US 2023/0087940 A1  Mar. 23, 2023

Related U.S. Application Data

(63) Continuation of application No. PCT/JP2021/006577, filed on Feb. 22, 2021.

(30) Foreign Application Priority Data

Mar. 31, 2020 (JP) .................... 2020-063236

(51) Int. Cl.
  *G03F 7/039* (2006.01)
(52) U.S. Cl.
  CPC .................... *G03F 7/0392* (2013.01)
(58) Field of Classification Search
  None
  See application file for complete search history.

(56) References Cited

U.S. PATENT DOCUMENTS

| 11,604,414 | B2 | 3/2023 | Shirakawa et al. | |
| 2003/0091930 | A1* | 5/2003 | Kishimura | G03F 7/0392 430/311 |
| 2008/0102407 | A1* | 5/2008 | Ohsawa | G03F 7/0392 430/286.1 |
| 2009/0017400 | A1* | 1/2009 | Tarutani | G03F 7/2022 430/322 |
| 2012/0077131 | A1 | 3/2012 | Enomoto et al. | |
| 2017/0059995 | A1 | 3/2017 | Furutani et al. | |
| 2018/0243689 | A1* | 8/2018 | Langer | B01J 20/12 |
| 2021/0011378 | A1 | 1/2021 | Yamamoto et al. | |

FOREIGN PATENT DOCUMENTS

| JP | 11-95450 A | 4/1999 |
| JP | 2005-150182 A | 6/2005 |
| JP | 2011-123469 A | 6/2011 |
| JP | 2017-222835 A | 12/2017 |
| KR | 10-2019-0124316 A | 11/2019 |
| WO | 2015190174 A1 | 12/2015 |
| WO | 2019188595 A1 | 10/2019 |

OTHER PUBLICATIONS

Office Action issued May 9, 2023 in Japanese Application No. 2022-511656.
Communication dated Oct. 23, 2024 in Korean Application No. 10-2022-7033713.
Communication dated Feb. 19, 2024 issued by the Korean Patent Office in application No. 10-2022-7033713.
International Search Report dated May 11, 2021 in International Application No. PCT/JP2021/006577.
Written Opinion of the Internation Searching Authority dated May 11, 2021 in International Application No. PCT/JP2021/006577.
International Preliminary Report on Patentability with translation of the Written Opinion of the International Searching Authority dated Sep. 29, 2022 in International Application No. PCT/JP2021/006577.

* cited by examiner

*Primary Examiner* — Anca Eoff
(74) *Attorney, Agent, or Firm* — Sughrue Mion, PLLC

(57) ABSTRACT

A pattern forming method produces a pattern having excellent LER performance. Additionally, an actinic ray-sensitive or radiation-sensitive composition and a method for manufacturing an electronic device, which relate to the pattern forming method are disclosed. The pattern forming method includes: exposing a resist film, the resist film including an acid-decomposable group a which reacts to generate a polar group having a pKa of 6.0 or more, an acid-decomposable group b which reacts to generate a polar group having a pKa of less than 6.0, and a photoacid-generating component, a first heating step for reacting at least a part of the acid-decomposable group a with an acid to generate the polar group having a pKa of 6.0 or more, a second heating step for reacting at least a part of the acid-decomposable group b to generate the polar group having a pKa of less than 6.0, and a development step.

15 Claims, No Drawings

PATTERN FORMING METHOD, ACTINIC RAY-SENSITIVE OR RADIATION-SENSITIVE COMPOSITION, AND METHOD FOR MANUFACTURING ELECTRONIC DEVICE

CROSS-REFERENCE TO RELATED APPLICATIONS

This application is a Continuation of PCT International Application No. PCT/JP2021/006577 filed on Feb. 22, 2021, which claims priority under 35 U.S.C. § 119(a) to Japanese Patent Application No. 2020-063236 filed on Mar. 31, 2020. The above application is hereby expressly incorporated by reference, in its entirety, into the present application.

BACKGROUND OF THE INVENTION

1. Field of the Invention

The present invention relates to a pattern forming method, an actinic ray-sensitive or radiation-sensitive composition, and a method for manufacturing an electronic device.

2. Description of the Related Art

In processes for manufacturing semiconductor devices such as an integrated circuit (IC) and a large scale integrated circuit (LSI), microfabrication by lithography using a photosensitive composition has been performed.

Examples of the lithographic method include a method in which a resist film is formed with the photosensitive composition, and then the obtained film is exposed and then developed.

For example, JP2017-222835A discloses a resist composition which contains a resin having a structural unit including a group represented by Formula (aa1) and a structural unit represented by Formula (a1-0-X) and an acid generator (claims 1 and 6).

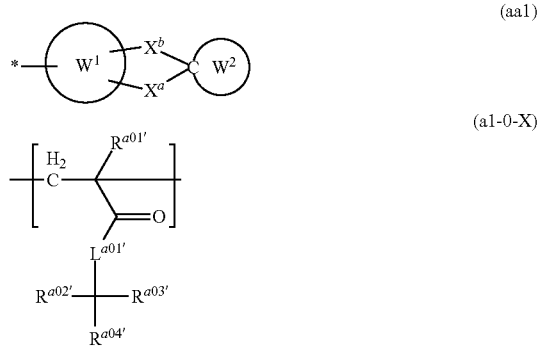

SUMMARY OF THE INVENTION

In a case of specifically studying the technique disclosed in JP2017-222835A, the present inventors have found that there is room for improvement in line edge roughness (LER) performance in a pattern formed according to the method described in JP2017-222835A.

Therefore, an object of the present invention is to provide a pattern forming method with which a pattern having excellent LER performance is obtained.

Another object of the present invention is to provide an actinic ray-sensitive or radiation-sensitive composition and a method for manufacturing an electronic device, which relate to the pattern forming method.

The present inventors have found that the above-described objects can be achieved by the following configurations.

[1]

A pattern forming method comprising, in the following order:
- an exposure step of exposing a resist film to generate an acid in the resist film, the resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component;
- a first heating step of heating the exposed resist film and reacting at least a part of the acid-decomposable group a with the acid to generate the polar group having a pKa of 6.0 or more;
- a second heating step of heating the resist film obtained by the first heating step and reacting at least a part of the acid-decomposable group b with the acid to generate the polar group having a pKa of less than 6.0; and
- a development step of developing the resist film with a developer to form a pattern.

[2]

The pattern forming method according to [1],
in which the resist film includes a resin,
the resin is one or more kinds selected from the group consisting of a resin W which does not have the acid-decomposable group a and the acid-decomposable group b, a resin X which has the acid-decomposable group a and the acid-decomposable group b, a resin Y which has the acid-decomposable group a and does not have the acid-decomposable group b, and a resin Z which has the acid-decomposable group b and does not have the acid-decomposable group a, and
the resin satisfies at least one of a requirement of including the resin X or a requirement of including the resin Y and the resin Z.

[3]

The pattern forming method according to [2],
in which a segregation index of the resin, which is obtained by the following expression (SP), is more than 1.0, segregation index=$[[\delta D3-(\delta D1+\delta D2)/2]^2+[\delta P3-(\delta P1+\delta P2)/2]^2+[\delta H3-(\delta H1+\delta H2)/2]^2]^{0.5} \times [(\delta D2-\delta D1)^2+(\delta P2-\delta P1)^2+(\delta H2-\delta H1)^2]^{0.5}$   expression (SP):

$\delta D1$: a dispersion element of the resin (unit: $MPa^{0.5}$)
$\delta P1$: a dipole-dipole element of the resin (unit: $MPa^{0.5}$)
$\delta H1$: a hydrogen bond element of the resin (unit: $MPa^{0.5}$)
$\delta D2$: a dispersion element of the resin in a case where all the acid-decomposable groups a of the resin react with the acid (unit: $MPa^{0.5}$)
$\delta P2$: a dipole-dipole element of the resin in a case where all the acid-decomposable groups a of the resin react with the acid (unit: $MPa^{0.5}$)
$\delta H2$: a hydrogen bond element of the resin in a case where all the acid-decomposable groups a of the resin react with the acid (unit: $MPa^{0.5}$)
$\delta D3$: a dispersion element of the acid generated from the photoacid-generating component (unit: $MPa^{0.5}$)
$\delta P3$: a dipole-dipole element of the acid generated from the photoacid-generating component (unit: $MPa^{0.5}$)

δH3: a hydrogen bond element of the acid generated from the photoacid-generating component (unit: $MPa^{0.5}$).

[4]

The pattern forming method according to [2] or [3],
in which at least one of the resin X or the resin Y has an acid-decomposable group a-containing repeating unit having the acid-decomposable group a, and
a content of the acid-decomposable group a-containing repeating unit is 5% by mass or more with respect to a total mass of the resin.

[5]

The pattern forming method according to any one of [2] to [4],
in which an amount of change in SP value of the resin, which is obtained by the following expression (DSP), is 0.3 $MPa^{0.5}$ or more, $$\text{amount of change in SP value} = [(\delta D1 - \delta D2)^2 + (\delta P1 - \delta P2)^2 + (\delta H1 - \delta H2)^2]^{0.5} \quad \text{expression (DSP)}$$

δD1: a dispersion element of the resin (unit: $MPa^{0.5}$)
δP1: a dipole-dipole element of the resin (unit: $MPa^{0.5}$)
δH1: a hydrogen bond element of the resin (unit: $MPa^{0.5}$)
δD2: a dispersion element of the resin in a case where all the acid-decomposable groups a of the resin react with the acid (unit: $MPa^{0.5}$)
δP2: a dipole-dipole element of the resin in a case where all the acid-decomposable groups a of the resin react with the acid (unit: $MPa^{0.5}$)
δH2: a hydrogen bond element of the resin in a case where all the acid-decomposable groups a of the resin react with the acid (unit: $MPa^{0.5}$).

[6]

The pattern forming method according to any one of [2] to [5],
in which at least one of a requirement that the resin has a specific repeating unit having both the acid-decomposable group a and the photoacid generating group, or a requirement that the resist film includes a photoacid generator which is a low-molecular-weight compound having the acid-decomposable group a is satisfied.

[7]

The pattern forming method according to [6],
in which at least one of a requirement that the resin has the specific repeating unit, the specific repeating unit has an anionic moiety and a cationic moiety, and the anionic moiety has the acid-decomposable group a, or a requirement that the resist film includes the photoacid generator, the photoacid generator has an anion and a cation, and the anion has the acid-decomposable group a is satisfied.

[8]

The pattern forming method according to [6],
in which at least one of a requirement that the resin has the specific repeating unit, the specific repeating unit has an anionic moiety and a cationic moiety, and the cationic moiety has the acid-decomposable group a, or a requirement that the resist film includes the photoacid generator, the photoacid generator has an anion and a cation, and the cation has the acid-decomposable group a is satisfied.

[9]

The pattern forming method according to [6],
in which at least one of a requirement that the resin has the specific repeating unit, the specific repeating unit has an anionic moiety and a cationic moiety, and both the anionic moiety and the cationic moiety have the acid-decomposable group a, or a requirement that the resist film includes the photoacid generator, the photoacid generator has an anion and a cation, and both the anion and the cation have the acid-decomposable group a is satisfied.

[10]

The pattern forming method according to any one of [1] to [9],
in which a heating temperature of the resist film in the first heating step is 30° C. to 100° C.

[11]

The pattern forming method according to any one of [1] to [10],
in which a heating temperature of the resist film in the second heating step is 70° C. to 140° C.

[12]

The pattern forming method according to any one of [1] to [11],
in which a heating temperature of the resist film in the second heating step is 10° C. or more higher than a heating temperature of the resist film in the first heating step.

[13]

The pattern forming method according to any one of [1] to [12],
in which a heating time of the resist film in the first heating step is 30 seconds or longer.

[14]

The pattern forming method according to any one of [1] to [13],
in which the pattern forming method is performed in an environment in which a concentration of $NH_3$ is 1.0 ppq by volume or more and less than 1.0 ppm by volume.

[15]

An actinic ray-sensitive or radiation-sensitive composition for forming the resist film used in the pattern forming method according to any one of [1] to [14].

[16]

The actinic ray-sensitive or radiation-sensitive composition according to [15],
in which contents of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo are each independently 1.0 ppt by mass or more and less than 1.0 ppm by mass with respect to a total mass of the actinic ray-sensitive or radiation-sensitive composition.

[17]

A method for manufacturing an electronic device, comprising:
the pattern forming method according to any one of [1] to [14].

According to the present invention, it is possible to provide a pattern forming method with which a pattern having excellent LER performance is obtained.

In addition, according to the present invention, it is possible to provide an actinic ray-sensitive or radiation-sensitive composition and a method for manufacturing an electronic device, which relate to the pattern forming method.

DESCRIPTION OF THE PREFERRED EMBODIMENTS

Hereinafter, an example of forms for carrying out the present invention will be described.

In the present specification, a numerical value range expressed using "to" means a range that includes the preceding and succeeding numerical values of "to" as a lower limit value and an upper limit value, respectively.

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

A substituent is preferably a monovalent substituent unless otherwise specified.

An "organic group" in the present specification refers to a group including at least one carbon atom.

In the present specification, examples of the halogen atom include a fluorine atom, a chlorine atom, a bromine atom, and an iodine atom.

A bonding direction of divalent groups cited in the present specification is not limited unless otherwise specified. For example, in a case where Y in a compound represented by General Formula "X—Y—Z" is —COO—, Y may be —CO—O— or —O—CO—. In addition, the above-described compound may be "X—CO—O—Z" or "X—O—CO—Z".

"(Meth)acryl" in the present specification is a generic term encompassing acryl and methacryl, and means "at least one of acryl or methacryl". Similarly, "(meth)acrylic acid" means "at least one of acrylic acid or methacrylic acid".

"Actinic ray" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic ray or radiation.

Unless otherwise specified, "exposure" in the present specification encompasses not only exposure by a bright line spectrum of a mercury lamp, far ultraviolet rays typified by an excimer laser (ArF excimer laser and the like), extreme ultraviolet rays (EUV light), X-rays, or the like, but also drawing by particle beams such as electron beams and ion beams.

In the present specification, a weight-average molecular weight (Mw), a number-average molecular weight (Mn), and a dispersity (also referred to as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, "ppm" means "parts per million ($10^{-6}$)", "ppb" means "parts per billion ($10^{-9}$)", "ppt" means "parts per trillion ($10^{-12}$))", and "ppq" means "parts per quadrillion ($10^{-15}$)".

In the present specification, an acid dissociation constant (pKa) represents a pKa in an aqueous solution, and is specifically a value determined by computation from a value based on a Hammett's substituent constant and database of publicly known literature values, using the following software package 1. Any of the pKa values described in the present specification indicates values determined by computation using the software package.

Software Package 1: Advanced Chemistry Development (ACD/Labs) Software V 8.14 for Solaris (1994-2007 ACD/Labs).

On the other hand, the pKa can also be determined by a molecular orbital computation method. Examples of a specific method thereof include a method for performing calculation by computing $H^+$ dissociation free energy in a solvent based on a thermodynamic cycle. (in the present specification, water is usually used as the solvent, and in a case where a pKa is not determined with water, dimethyl sulfoxide (DMSO) is used)

With regard to a computation method for $H^+$ dissociation free energy, the $H^+$ dissociation free energy can be computed by, for example, density functional theory (DFT), but various other methods have been reported in literature and the like, and are not limited thereto. There are a plurality of software applications capable of performing DFT, and examples thereof include Gaussian 16.

As described above, the pKa in the present specification refers to a value determined by computation from a value based on a Hammett's substituent constant and database of publicly known literature values, using the software package 1, but in a case where the pKa cannot be calculated by the method, a value obtained by Gaussian 16 based on density functional theory (DFT) shall be adopted.

In the present specification, in a case of referring to a heating temperature of the resist film, it is intended that the temperature is a temperature measured by a radiation thermometer on a surface of the resist film to be heated.

[Pattern Forming Method]

A pattern forming method according to an embodiment of the present invention will be described.

The pattern forming method according to the embodiment of the present invention is a pattern forming method including, in the following order, an exposure step of exposing a resist film to generate an acid in the resist film, the resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component; a first heating step of heating the exposed resist film and reacting at least a part of the acid-decomposable group a with the acid to generate the polar group having a pKa of 6.0 or more; a second heating step of heating the resist film obtained by the first heating step and reacting at least a part of the acid-decomposable group b with the acid to generate the polar group having a pKa of less than 6.0; and a development step of developing the resist film with a developer to form a pattern.

A mechanism by which the objects of the present invention can be achieved through such configurations is not always clear, but is considered to be as follows by the present inventors.

In the pattern forming method in the related art, an acid may be generated from a photoacid-generating component by exposure, and then a resist film may be heated in order to promote a reaction of an acid-decomposable group by the acid. The present inventors have found that, by performing the heating of the resist film including a predetermined component in two stages of the first heating step and the second heating step, an LER performance of a pattern to be obtained is improved. That is, in the first heating step, the acid generated in the exposed portion reacts with the acid-decomposable group a to generate a polar group having a pKa of 6.0 more, which is relatively weakly acidic. The polar group with relatively weak acidity, which is generated in this way, has a high affinity with the acid in the resist film, and the acid generated from the photoacid-generating component can be attracted to the exposed portion. In a case where the second heating step is performed in the state in which the acid is attracted in this way and the acid-decomposable group b is reacted with the acid, the present inventors have considered that, as a whole, the polarity conversion of the resist film can be realized with higher contrast, and the LER performance of the developed pattern is improved.

In addition, the pattern forming method according to the embodiment of the present invention is also excellent in bridge defect suppression of the pattern.

In the following, the fact that the LER performance of the pattern to be obtained is more excellent and/or the fact that the bridge defect suppression of the pattern is more excellent is also referred to that the effects of the present invention are more excellent.

Hereinafter, the procedure of the pattern forming method according to the embodiment of the present invention will be described first, and then the resist film adoptable to the pattern forming method according to the embodiment of the present invention and an actinic ray-sensitive or radiation-sensitive composition (hereinafter, also referred to as a "resist composition") will be described.

[Pattern Forming Method]

In the pattern forming method according to the embodiment of the present invention, it is essential to include at least the exposure step, the first heating step, the second heating step, and the development step in this order.

It is also preferable that the pattern forming method according to the embodiment of the present invention further include a resist film forming step before the exposure step.

The resist film forming step, the exposure step, the first heating step, the second heating step, and the development step are the following steps, respectively.

Resist film forming step: step of forming a predetermined resist film to be subjected to an exposure step on a substrate using a resist composition Exposure step: step of exposing the predetermined resist film to generate an acid in the resist film The above-described predetermined resist film is a resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component.

First heating step: step of heating the above-described resist film and reacting at least a part of the above-described acid-decomposable group a to generate the polar group having a pKa of 6.0 or more Second heating step: step of heating the above-described resist film and reacting at least a part of the above-described acid-decomposable group b to generate the polar group having a pKa of less than 6.0

Development step: step of developing the above-described resist film using a developer to form a pattern <Resist Film Forming Step>

The resist film forming step is a step of forming a predetermined resist film on a substrate using a resist composition.

Details of the resist composition will be described later.

Examples of a method for forming a resist film on a substrate using the resist composition include a method in which a resist composition is applied to a substrate.

The resist composition can be applied to a substrate (for example, silicon substrate and silicon dioxide coated substrate) as used in the manufacture of integrated circuit elements by a suitable application method such as an application using a spinner or a coater. The application method is preferably a spin application using a spinner. A rotation speed upon the spin application using a spinner is preferably 1000 to 3000 rpm.

After the application of the resist composition, the substrate may be dried to form a resist film. In addition, various underlying films (an inorganic film, an organic film, or an antireflection film) may be formed on an underlayer of the resist film.

Examples of the drying method include a method of heating and drying. The heating can be carried out using a unit included in an ordinary exposure machine and/or development machine, and may also be carried out using a hot plate or the like. A heating temperature is preferably 80° C. to 150° C., more preferably 80° C. to 140° C., and still more preferably 80° C. to 130° C. A heating time is preferably 30 to 1000 seconds, more preferably 60 to 800 seconds, and still more preferably 60 to 600 seconds.

A film thickness of the resist film is not particularly limited, but from the viewpoint that a fine pattern having higher accuracy can be formed, is preferably 10 to 65 nm and more preferably 15 to 50 nm.

A topcoat may be formed on the upper layer of the resist film using a topcoat composition.

It is preferable that the topcoat composition is not mixed with the resist film and can be uniformly applied to the upper layer of the resist film.

The topcoat composition includes, for example, a resin, an additive, and a solvent.

The topcoat is not particularly limited, a topcoat known in the related art can be formed by the methods known in the related art, and for example, the topcoat can be formed based on the description in paragraphs [0072] to [0082] of JP2014-059543A.

For example, it is preferable that a topcoat including a basic compound as described in JP2013-61648A is formed on the resist film. Specific examples of the basic compound which can be included in the topcoat include a basic compound which may be included in the resist composition.

In addition, it is also preferable that the topcoat includes a compound which includes at least one group or bond selected from the group consisting of an ether bond, a thioether bond, a hydroxyl group, a thiol group, a carbonyl bond, and an ester bond.

<Exposure Step>

The exposure step is a step of exposing the predetermined resist film to generate an acid in the resist film. The above-described resist film is preferably a resist film produced in the above-described resist film forming step.

Due to the exposure, the acid is generated from the photoacid-generating component in the exposed portion of the resist film.

Requirements for the resist used in the exposure step, components which can be included in the resist film, and the like will be described in detail later.

Examples of an exposing method include a method in which the formed resist film is irradiated with light through a predetermined mask. The irradiated light is preferably in a patterned manner.

<First Heating Step>

The first heating step is a step of heating the resist film and reacting at least a part of the above-described acid-decomposable group a with the acid to generate the polar group having a pKa of 6.0 or more.

The acid-decomposable group is a group which is decomposed by the action of acid to form a polar group. The acid-decomposable group preferably has a structure in which a polar group is protected by a leaving group which is eliminated by the action of acid.

In the first heating step, the reaction of the acid-decomposable group a with the acid generated from the photoacid-generating component due to the exposure is promoted by the heating. As a result, at least a part of the acid-decomposable group a is reacted to generate the polar group having a pKa of 6.0 or more in the resist film.

The reaction of the acid-decomposable group is preferably a reaction in which the leaving group eliminated by the action of acid is deprotected from the polar group by the action of acid.

In this case, a part of the acid-decomposable group a may react, or the whole may react.

An amount of the acid-decomposable group a which reacts in the first heating step is preferably 10% to 100% by mole of the total acid-decomposable group a which is present in the exposed portion before the first heating step.

In addition, a part of the acid-decomposable group b may be reacted in the first heating step. However, it is necessary that at least a part of the acid-decomposable group b which is reacted in the second heating step described later remains without reacting even after passing through the first heating step.

The fact that at least a part of the acid-decomposable group a is reacted in the first heating step can be confirmed by, for example, a decrease in film thickness of the resist film. In a case where the acid-decomposable group a and the acid-decomposable group b coexist in the resist film, the acid-decomposable group a is more likely to react preferentially than the acid-decomposable group b, and in a case where the exposed resist film is heated and the decrease in film thickness is confirmed, at least the acid-decomposable group a is often reacted. In addition, the conditions under which the acid-decomposable group a reacts may be confirmed in advance by that a resist film having only the acid-decomposable group a and having no acid-decomposable group b is prepared and such a decrease in the resist film is observed.

A heating temperature of the resist film in the first heating step is preferably 30° C. to 100° C., more preferably 50° C. or higher and lower than 100° C., and still more preferably 65° C. to 95° C.

A heating time of the resist film in the first heating step is preferably 30 seconds or longer, more preferably 30 to 180 seconds, and still more preferably 30 to 120 seconds.

The heating of the resist film in the first heating step may be continuous or intermittent, and may be performed while changing the temperature such as raising the temperature. However, in any case, it is preferable that the integration of the time during which the resist film is heated at the above-described suitable heating temperature is within the above-described suitable heating time.

A heating method is not particularly limited, and for example, a heating function provided in the exposure or development apparatus may be used, or a hot plate or the like may be used.

<Second Heating Step>

The second heating step is a step of heating the resist film and reacting at least a part of the acid-decomposable group b with the acid to generate the polar group having a pKa of less than 6.0.

In the second heating step, the reaction of the acid-decomposable group b with the acid generated from the photoacid-generating component due to the exposure is promoted by the heating. As a result, at least a part of the acid-decomposable group b is reacted to generate the polar group having a pKa of less than 6.0 in the resist film.

An amount of the acid-decomposable group b which reacts in the second heating step is preferably 10% to 100% by mole of the total acid-decomposable group b which is present in the exposed portion before the first heating step.

An amount of the acid-decomposable group b which reacts in the second beating step is preferably 10% to 100% by mole of the total acid-decomposable group b which is present in the exposed portion after the first heating step.

In addition, in the second heating step, a part or all of the acid-decomposable groups a which have not completely been reacted in the first heating step may be reacted.

The fact that at least a part of the acid-decomposable group b is reacted in the second heating step can be confirmed by, for example, a decrease in film thickness of the resist film. In addition, for example, the conditions under which the acid-decomposable group b reacts may be confirmed in advance by that a resist film having only the acid-decomposable group b and having no acid-decomposable group a is prepared and such a decrease in the resist film is observed.

A heating temperature of the resist film in the second heating step is preferably 70° C. to 140° C., more preferably 100° C. to 135° C., and still more preferably 105° C. to 130° C. In addition, the heating temperature of the resist film in the second heating step is preferably higher than the heating temperature of the resist film in the first heating step by higher than 0° C., more preferably higher by 10° C. or higher, and still more preferably higher by 20° C. or higher.

A heating time of the resist film in the second heating step is preferably 30 seconds or longer, more preferably 30 to 180 seconds, and still more preferably 30 to 120 seconds.

The heating of the resist film in the second heating step may be continuous or intermittent, and may be performed while changing the temperature such as raising the temperature. However, in any case, it is preferable that the integration of the time during which the resist film is heated at the above-described suitable heating temperature is within the above-described suitable heating time.

A heating method is not particularly limited, and for example, a heating function provided in the exposure or development apparatus may be used, or a hot plate or the like may be used.

<Development Step>

The development step is a step of developing the above-described resist film using a developer to form a pattern.

The developer may be either an alkali developer or a developer containing an organic solvent (hereinafter, also referred to as an organic developer).

Examples of a developing method include a method in which the substrate is immersed in a tank filled with a developer for a certain period of time (a dipping method), a method in which a development is performed by heaping a developer up onto the surface of the substrate by surface tension, and then leaving it to stand for a certain period of time (a puddle method), a method in which a developer is sprayed on the surface of the substrate (a spraying method), and a method in which a developer is continuously jetted onto the substrate rotating at a constant rate while scanning a developer jetting nozzle at a constant rate (a dynamic dispensing method).

In addition, after the step of performing the development, a step of stopping the development may be carried out while replacing the solvent with another solvent.

A developing time is not particularly limited as long as it is a period of time where the non-exposed portion is sufficiently dissolved, and is preferably 10 to 300 seconds and more preferably 20 to 120 seconds.

A temperature of the developer is preferably 0° C. to 50° C. and more preferably 15° C. to 35° C.

As the alkali developer, it is preferable to use an alkali aqueous solution including an alkali. The type of the alkali aqueous solution is not particularly limited, and examples thereof include an alkali aqueous solution including a quaternary ammonium salt typified by tetramethylammonium hydroxide, an inorganic alkali, a primary amine, a secondary amine, a tertiary amine, an alcoholamine, a cyclic amine, or the like. Among these, the alkali developer is preferably aqueous solutions of the quaternary ammonium salts typified by tetramethylammonium hydroxide (TMAH). An appropriate amount of alcohols, a surfactant, or the like may be added to the alkali developer. An alkali concentration of the alkali developer is usually 0.1% to 20% by mass. In addition, a pH of the alkali developer is usually 10.0 to 15.0. A content of water in the alkali developer is preferably 50% or more and more preferably 80% or more.

The organic developer is preferably a developer containing at least one organic solvent selected from the group consisting of a ketone-based solvent, an ester-based solvent, an alcohol-based solvent, an amide-based solvent, an ether-based solvent, and a hydrocarbon-based solvent.

A plurality of the above-described solvents may be mixed, or the solvent may be used in admixture with a solvent other than those described above or water. A moisture content in the entire developer is preferably less than 50% by mass, more preferably less than 20% by mass, and still more preferably less than 10% by mass, and it is particularly preferable that the entire developer contains substantially no water.

A content of the organic solvent with respect to the organic developer is preferably 50% by mass to 100% by mass, more preferably 80% by mass to 100% by mass, still more preferably 90% by mass to 100% by mass, and particularly preferably 95% by mass to 100% by mass with respect to the total amount of the developer.

<Other Steps>

It is preferable that the above-described pattern forming method includes a step of performing washing using a rinsing liquid after the development step.

Examples of the rinsing liquid used in the rinsing step after the step of performing development using an alkali developer include pure water. An appropriate amount of a surfactant may be added to the pure water.

An appropriate amount of a surfactant may be added to the rinsing liquid.

The rinsing liquid used in the rinsing step after the development step with an organic developer is not particularly limited as long as the rinsing liquid does not dissolve the pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

A method for the rinsing step is not particularly limited, and examples thereof include a method in which the rinsing liquid is continuously jetted onto the substrate rotated at a constant rate (a spin coating method), a method in which the substrate is immersed in a tank filled with the rinsing liquid for a certain period of time (a dipping method), and a method in which the rinsing liquid is sprayed on the surface of the substrate (a spraying method).

In addition, the pattern forming method according to the embodiment of the present invention may include a heating step (post bake) after the rinsing step. By this step, the developer and the rinsing liquid remaining between and inside the patterns are removed by baking. In addition, this step also has an effect that a resist pattern is annealed and the surface roughness of the pattern is improved. The heating step after the rinsing step is usually performed at 40° C. to 250° C. (preferably 90° C. to 200° C.) for usually 10 seconds to 3 minutes (preferably 30 seconds to 120 seconds).

In addition, an etching treatment on the substrate may be carried out using the formed pattern as a mask. For etching, any of known methods can be used, and various conditions and the like are appropriately determined according to the type of the substrate, usage, and the like. The etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with "Chapter 4 Etching" in "Semiconductor Process Text Book, $4^{th}$ Ed., published in 2007, publisher: SEMI Japan".

Various materials (for example, a developer, a rinsing liquid, a composition for forming an antireflection film, and a composition for forming a topcoat) other than the resist film and resist composition used in the pattern forming method according to the embodiment of the present invention preferably have smaller amounts of impurities such as a metal (for example, Na, K, Ca, Fe, Cu, Mg, Al, Li, Cr, Ni, Sn, Ag, As, Au, Ba, Cd, Co, Pb, Ti, V, W, and Zn). A content of the impurities included in these materials is preferably, for example, 1 ppm by mass or less.

Examples of a method for reducing the impurities such as metals in the various materials include filtration using a filter. As for a filter pore diameter, the pore size is preferably less than 100 nm, more preferably 10 nm or less, and still more preferably 5 nm or less. As a filter, a polytetrafluoroethylene-made filter, a polyethylene-made filter, or a nylon-made filter is preferable. The filter may be composed of a composite material in which the above-described filter material is combined with an ion exchange medium. As the filter, a filter which has been previously washed with an organic solvent may be used. In the step of filter filtration, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step.

In addition, examples of a method for reducing the impurities such as metals in the above-described various materials include a method of selecting raw materials having a low content of metals as raw materials constituting the various materials, a method of subjecting raw materials constituting the various materials to filter filtration, and a method of performing distillation under the condition for suppressing the contamination as much as possible by, for example, lining the inside of a device with TEFLON (registered trademark).

In addition, as the method for reducing impurities such as a metal in the above-described various materials, removal of impurities with an adsorbing material may be performed, in addition to the above-mentioned filter filtration, and the filter filtration and the adsorbing material may be used in combination. As the adsorbing material, known adsorbing materials can be used, and for example, inorganic adsorbing materials such as silica gel and zeolite and organic adsorbing materials such as activated carbon can be used. It is necessary to prevent the incorporation of metal impurities in the production process in order to reduce the impurities such as metals included in the above-described various materials. Sufficient removal of the metal impurities from a production device can be confirmed by measuring the content of metal components included in a washing solution used to wash the production device.

A conductive compound may be added to an organic treatment liquid such as the rinsing liquid in order to prevent breakdown of chemical liquid pipes and various parts (a filter, an O-ring, a tube, or the like) due to electrostatic charging, and subsequently generated electrostatic discharging. The conductive compound is not particularly limited, and examples thereof include methanol. An addition amount is not particularly limited, but from the viewpoint that preferred development characteristics or rinsing characteristics are maintained, the addition amount is preferably 10% by mass or less and more preferably 5% by mass or less.

For members of the chemical liquid pipe, various pipes coated with stainless steel (SUS), or a polyethylene, polypropylene, or a fluororesin (polytetrafluoroethylene, a perfluoroalkoxy resin, or the like) that has been subjected to an antistatic treatment can be used. In the same manner, for the filter or the O-ring, polyethylene, polypropylene, or a fluororesin (polytetrafluoroethylene, a perfluoroalkoxy resin, and the like) that has been subjected to an antistatic treatment can be used.

In the pattern forming method according to the embodiment of the present invention, the series of steps is preferably performed in a clean room atmosphere, and it is also preferable to be performed in an environment in which a concentration of $NH_3$ is 1.0 ppq by volume or more and less than 1.0 ppm by volume.

The above-described series of steps preferably includes at least the first heating step, the second heating step, and the development step, and more preferably includes at least the resist film forming step, the first heating step, the second heating step, and the development step.

Since this process includes a plurality of heating steps, it is easily affected by a basic compound such as $NH_3$. At high concentrations, the acid is inactivated and the performance may be unstable. On the other hand, an extremely low concentration, $NH_3$ included in the liquid in a small amount during the resist preparation is released into the atmosphere, causing non-uniform composition in the film, and there is a possibility that the performance is unstable. Therefore, it is considered that the environment in which a concentration of $NH_3$ is 1.0 ppq by volume or more and less than 1.0 ppm by volume is preferable.

For the concentration of $NH_3$ in the environment, the measurement can be performed by collecting ammonia gas included in the atmosphere in the environment (clean room or the like) to be measured by the impinger collection method and analyzing the obtained absorption liquid by the ion chromatograph method.

For the ion chromatograph method, ICA-2000 manufactured by DKK-TOA CORPORATION can be used.

In addition, the present invention further relates to a method for manufacturing an electronic device, including the above-described pattern forming method, and an electronic device manufactured by this manufacturing method.

The electronic device according to the embodiment of the present invention is suitably mounted on electric and electronic apparatus (for example, home appliances, office automation (OA)-related equipment, media-related equipment, optical equipment, telecommunication equipment, and the like).

[Resist Film (Actinic Ray-Sensitive or Radiation-Sensitive Film)]

The resist film adoptable to the pattern forming method according to the embodiment of the present invention (hereinafter, also referred to as a "resist film according to the present invention") will be described.

The resist film may be a positive tone resist film or a negative tone resist film. In addition, the resist film may be either a resist film for alkali development or a resist film for organic solvent development. The resist film adoptable to the pattern forming method according to the embodiment of the present invention is typically a chemically amplified resist film.

The resist film described here is intended to be a resist film in a state before being exposed.

The resist film according to the present invention has an acid-decomposable group a which reacts with the acid to generate a polar group having a pKa of 6.0 or more and an acid-decomposable group b which reacts with the acid to generate a polar group having a pKa of less than 6.0.

Examples of an aspect in which the resist film satisfies such a requirement include a method in which the resist film includes a resin A described later.

In addition, the resist film according to the present invention includes a photoacid-generating component.

The photoacid-generating component is a component which generates an acid by exposure.

Among these, the photoacid-generating component is preferably a component which generates an organic acid by irradiation with EUV light.

Examples of the above-described organic acid include sulfonic acids (an aliphatic sulfonic acid, an aromatic sulfonic acid, a camphor sulfonic acid, and the like), carboxylic acids (an aliphatic carboxylic acid, an aromatic carboxylic acid, an aralkylcarboxylic acid, and the like), a carbonylsulfonylimide acid, a bis(alkylsulfonyl)imide acid, and a tris(alkylsulfonyl)methide acid.

Examples of the photoacid-generating component include a photoacid generator described later and a resin having a photoacid generating group described later (preferably, resin A having a photoacid generating group described later). The photoacid-generating component may be used alone or in combination of two or more kinds thereof.

A content of the photoacid-generating component in the resist film according to the present invention is preferably 1% to 35% by mass, more preferably 3% to 30% by mass, and still more preferably 6% to 25% by mass with respect to the total mass of the resist film. However, in a case where the resin having a photoacid generating group is included as the photoacid-generating component, the mass of the repeating unit having a photoacid generating group in the resin, not the mass of the entire resin, is added up as the above-described content of the photoacid-generating component.

<Resin>

Examples of an aspect in which the resist film has the acid-decomposable group a and the acid-decomposable group b include the following aspects in which the resist film includes a predetermined resin.

That is, examples thereof include an aspect in which the resist film includes a resin, the resin is one or more kinds of resins (hereinafter, also referred to as a "resin A") selected from the group consisting of a resin W which does not have the acid-decomposable group a and the acid-decomposable group b, a resin X which has the acid-decomposable group a and the acid-decomposable group b, a resin Y which has the acid-decomposable group a and does not have the acid-decomposable group b, and a resin Z which has the acid-decomposable group b and does not have the acid-decomposable group a, and the resin satisfies at least one of a requirement of including the resin X or a requirement of including the resin Y and the resin Z.

That is, more specifically, the above-described aspect may be, for example, an aspect in which the resist film includes a single resin of the resin X, an aspect in which the resist film includes a mixed resin of the resin Y and the resin Z, an aspect in which the resist film includes a mixed resin of the resin X and the resin Y, an aspect in which the resist film includes a mixed resin of the resin X and the resin Z, or an aspect in which the resist film includes a mixed resin of the resin X, the resin Y, and the resin Z. The above-described single resin and the above-described mixed resin may or may not have the resin W.

The fact that the resin W and the resin Y do not have the acid-decomposable group b means that the resin W and the resin Y do not have substantially the acid-decomposable group b, and the contents of the acid-decomposable groups b may be each independently 0% to 0.5% by mass, preferably 0% to 0.1% by mass with respect to the total mass of the resin W or the resin Y.

The fact that the resin W and the resin Z do not have the acid-decomposable group a means that the resin W and the resin Z do not have substantially the acid-decomposable group a, and the contents of the acid-decomposable groups a may be each independently 0% to 0.5% by mass, preferably 0% to 0.1% by mass with respect to the total mass of the resin W or the resin Z.

A content of the resin A included in the resist film according to the present invention is preferably 40% to 100% by mass, more preferably 50% to 99.9% by mass, and still more preferably 60% to 99.0% by mass with respect to the total mass of the resist film.

In a case where the resist film according to the present invention includes the resin W, a content of the resin W is preferably more than 0% by mass and 20% by mass or less, and more preferably more than 0% by mass and 10% by mass or less with respect to the total mass of the resin A included in the resist film according to the present invention. The resin W may be used alone or in combination of two or more kinds thereof.

In a case where the resist film according to the present invention includes the resin X, a content of the resin X is preferably 30% to 100% by mass, and more preferably 80% to 100% by mass with respect to the total mass of the resin A included in the resist film according to the present invention. The resin X may be used alone or in combination of two or more kinds thereof.

In a case where the resist film according to the present invention includes the resin Y, a content of the resin Y is preferably 10% to 80% by mass, and more preferably 30% to 70% by mass with respect to the total mass of the resin A included in the resist film according to the present invention. The resin Y may be used alone or in combination of two or more kinds thereof.

In a case where the resist film according to the present invention includes the resin Z, a content of the resin Z is preferably 10% to 80% by mass, and more preferably 30% to 70% by mass with respect to the total mass of the resin A included in the resist film according to the present invention. The resin Z may be used alone or in combination of two or more kinds thereof.

(Acid-Decomposable Group a)

The acid-decomposable group is a group which is decomposed by the action of acid to form a polar group. The acid-decomposable group preferably has a structure in which a polar group is protected by a leaving group which is eliminated by the action of acid. That is, the resin A preferably has a repeating unit having a group which is decomposed by the action of acid to generate a polar group. The resin having this repeating unit has an increased polarity by the action of acid, an increased solubility in an alkali developer, and a decreased solubility in an organic solvent.

The resin X and/or the resin Y has the acid-decomposable group a. That is, the resin A has the acid-decomposable group a.

The acid-decomposable group a is an acid-decomposable group which reacts with the acid to generate a polar group having a pKa of 6.0 or more. The pKa of the above-described polar group is 6.0 or more, preferably more than 6.0 and 30.0 or less and more preferably 6.5 to 25.0.

Examples of the above-described polar group include an alcoholic hydroxy group, an aromatic hydroxy group such as a phenolic hydroxy group, and a carbonyl group.

The above-described alcoholic hydroxy group may be a non-fluorinated alcoholic hydroxy group or a fluorinated alcoholic hydroxy group such as a hexafluoroisopropanol group.

Examples of the acid-decomposable group a include General Formulae (II-1) to (II-4).

(II-1)

(II-2)

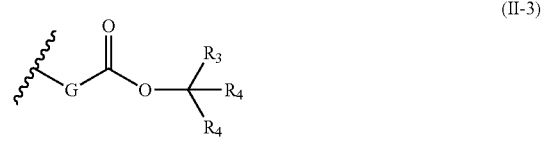

(II-3)

(II-4)

In the formula,

G represents an oxygen atom or a sulfur atom.

$R_3$'s each independently represent a hydrogen atom or a monovalent organic group. $R_3$'s may be bonded to each other to form a ring.

$R_4$'s each independently represent a monovalent organic group. $R_4$'s may be bonded to each other to form a ring. $R_3$ and $R_4$ may be bonded to each other to form a ring.

$R_5$'s each independently represent a hydrogen atom, an alkyl group, a cycloalkyl group, an aryl group, an alkenyl group, or an alkynyl group. At least two $R_5$'s may be bonded to each other to form a ring. However, in a case where one or two of the three $R_5$'s are hydrogen atoms, at least one of the remaining $R_5$'s represents an aryl group, an alkenyl group, or an alkynyl group.

Examples of the monovalent organic group in $R_3$ and $R_4$ include an alkyl group, a cycloalkyl group, an aryl group, an alkenyl group, and an alkynyl group.

The alkyl group in $R_3$, $R_4$, and $R_5$ may be linear or branched. The above-described alkyl group is preferably an alkyl group having 1 to 30 carbon atoms, such as a methyl group, an ethyl group, an n-propyl group, an isopropyl group, an n-butyl group, an isobutyl group, and a t-butyl group, more preferably an alkyl group having 1 to 10 carbon atoms, and still more preferably an alkyl group having 1 to 5 carbon atoms.

As the cycloalkyl group in $R_3$, $R_4$, and $R_5$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable. The number of carbon atoms in the above-described cycloalkyl group is preferably 3 to 10 and more preferably 4 to 8.

The aryl group in $R_3$, $R_4$, and $R_5$ may be monocyclic or polycyclic. As the above-described aryl group, an aryl group having 6 to 10 carbon atoms is preferable, and examples thereof include a phenyl group, a naphthyl group, and an anthryl group.

The alkenyl group and alkynyl group in $R_3$, $R_4$, and $R_5$ may be linear or branched. The number of carbon atoms in the above-described alkenyl group and the above-described alkynyl group is preferably 1 to 5.

In a case where the combination of $R_3$'s, the combination of $R_4$'s, the combination of $R_5$'s, or the combination of $R_3$ and $R_4$ is bonded to each other to form a ring, the ring is preferably a 4- to 8-membered ring and more preferably a 5- to 7-membered ring. The above-described ring may be monocyclic or polycyclic. The above-described ring is preferably a non-aromatic ring.

The groups represented by General Formulae (II-1) to (II-4) are preferably bonded to a carbon atom other than a carbonyl carbon. Examples of the above-described carbon atom include a carbon atom which is a ring member atom of an aromatic ring, a carbon atom which is a ring member atom of a non-aromatic ring, and a carbon atom which is neither a ring member atom nor a carbonyl carbon of a ring.

The atoms (the above-described carbon atom and the like) to which the groups represented by General Formulae (II-1) to (II-4) are bonded is not an atom in which the pKa of the polar group generated by the reaction of General Formulae (II-1) to (II-4) with the acid is less than 6.0.

The acid-decomposable group a may be a group represented by General Formulae (II-5) to (II-9).

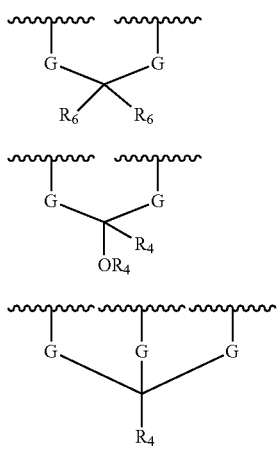

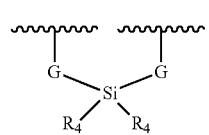

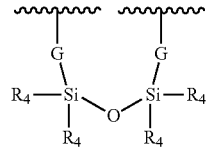

In the formula,

G represents an oxygen atom or a sulfur atom. A plurality of G's may be the same or different from each other.

$R_4$ is the same as $R_4$ in General Formulas (II-1) to (II-3).

$R_6$'s each independently represent a hydrogen atom or a monovalent organic group. $R_6$'s may be bonded to each other to form a ring. $R_6$ is the same as, for example, $R_3$ in General Formula (II-1).

It is preferable that the bonding positions (bonding site with a wavy line) in the groups represented by General Formulae (II-5) to (II-9) are bonded to the same or different carbon atoms, respectively. The above-described carbon atom is preferably a carbon atom which is not a carbonyl carbon. Examples of the above-described carbon atom include a carbon atom which is a ring member atom of an aromatic ring, a carbon atom which is a ring member atom of a non-aromatic ring, and a carbon atom which is neither a ring member atom nor a carbonyl carbon of a ring.

The atoms (the above-described carbon atom and the like) to which the groups represented by General Formulae (II-5) to (II-9) are bonded is not an atom in which the pKa of the polar group generated by the reaction of General Formulae (II-5) to (II-9) with the acid is less than 6.0.

The groups represented by General Formulae (II-5) to (II-9) usually form a ring structure. The above-described ring structure may be a ring structure as a polycyclic partial structure, or a ring structure constituting a single ring.

Specific examples of the acid-decomposable group a are shown below.

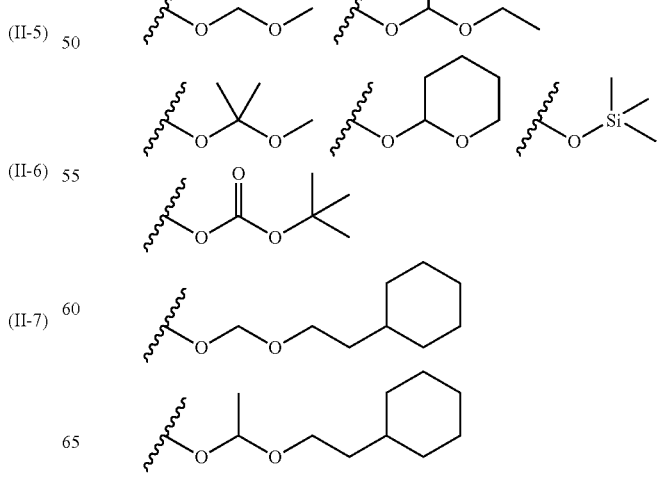

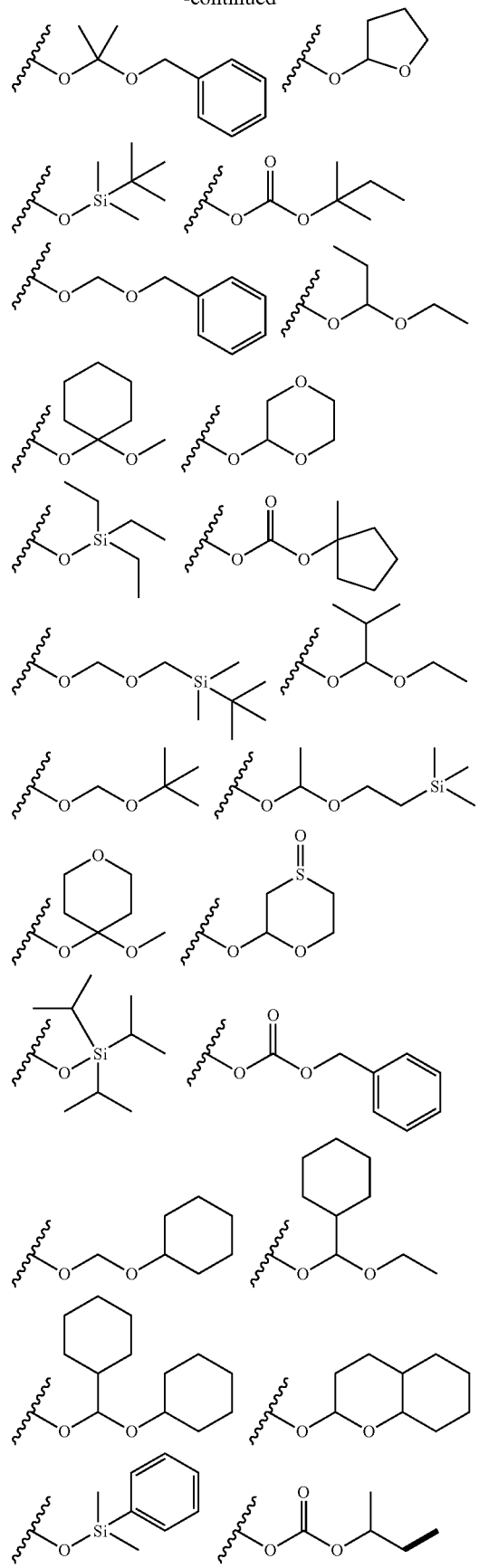
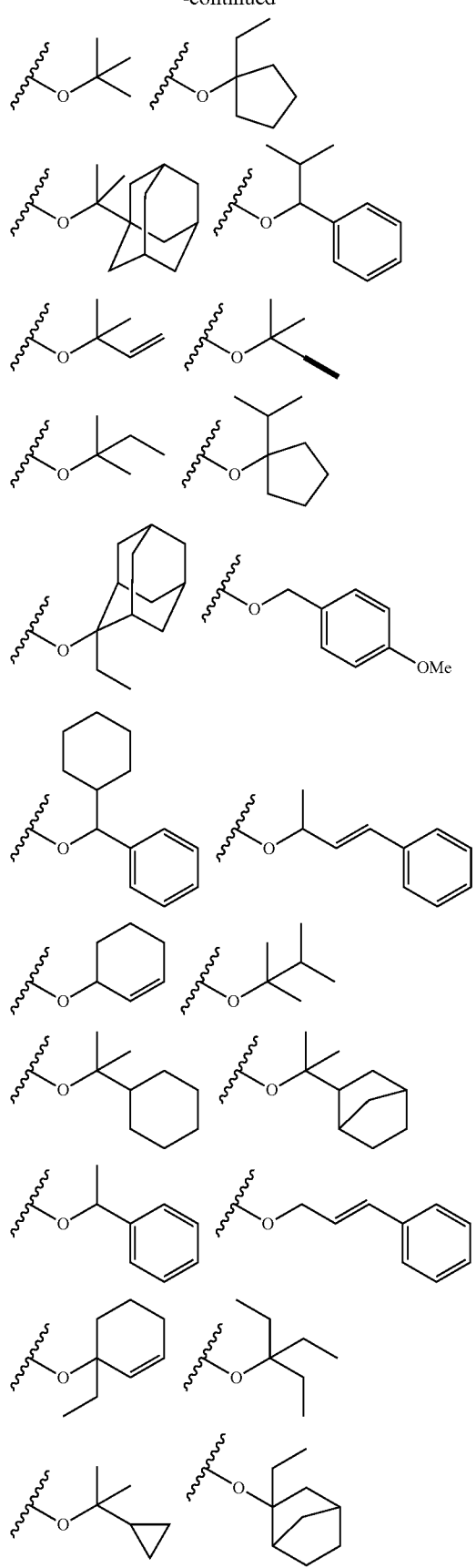

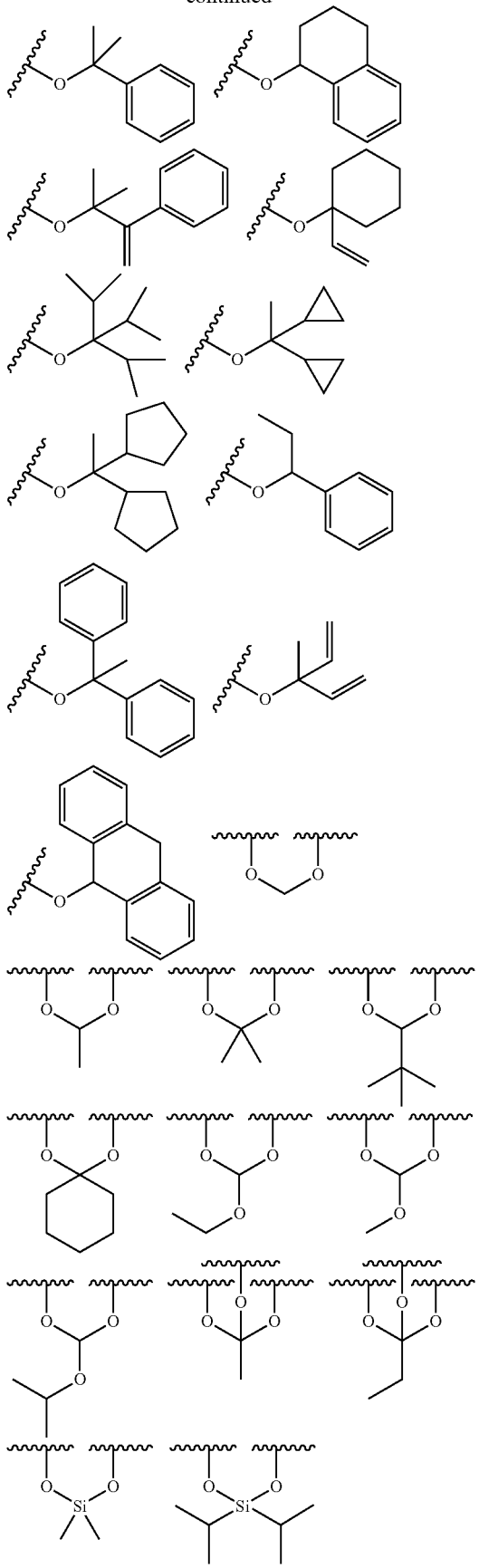

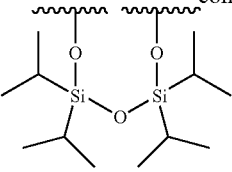

(Acid-Decomposable Group b)

The resin X and/or the resin Z has the acid-decomposable group b. That is, the resin A has the acid-decomposable group b.

The acid-decomposable group b is an acid-decomposable group which reacts with the acid to generate a polar group having a pKa of less than 6.0. The pKa of the above-described polar group is less than 6.0, preferably −15.0 or more and less than 6.0 and more preferably −0.0 to 5.5.

Examples of the above-described polar group include a carboxy group.

Examples of the acid-decomposable group b include groups represented by Formulae (Y1) to (Y4).

$$-B^b-O-C(Rx_1)(Rx_2)(Rx_3) \quad \text{Formula (Y1):}$$

$$-B^b-O-C(=O)OC(Rx_1)(Rx_2)(Rx_3) \quad \text{Formula (Y2):}$$

$$-B^b-O-C(R_{36})(R_{37})(OR_{38}) \quad \text{Formula (Y3):}$$

$$-B^b-O-C(Rn)(H)(Ar) \quad \text{Formula (Y4):}$$

In Formulae (Y1) to (Y4), $B^b$ represents —CO— or an aromatic ring group having an electron withdrawing group as a substituent.

The above-described aromatic ring group in the aromatic ring group having an electron withdrawing group as a substituent may be monocyclic or polycyclic, and may have a heteroatom. In addition, the number of ring member atoms is preferably 5 to 15. Among these, the above-described aromatic ring group is preferably a benzene ring group or a naphthalene ring group, and more preferably a benzene ring group.

The electron withdrawing group refers to a substituent which is more likely to attract an electron from a bonded atom than a hydrogen atom. Examples of the above-described electron withdrawing group in the aromatic ring group having an electron withdrawing group as a substituent include a halogen atom such as a fluorine atom, a cyano group, a nitro group, and a perfluoroalkyl group.

The number of electron withdrawing groups in the aromatic ring group having an electron withdrawing group as a substituent is preferably 1 to 10. As the substituent which can be included in the above-described aromatic ring group, except for "—O—C(Rx$_1$)(Rx$_2$)(Rx$_3$)", "—O—C(=O)OC (Rx$_1$)(Rx$_2$)(Rx$_3$)", "—O—C(R$_{36}$)(R$_{37}$)(OR$_{38}$)", and "—O—C(Rn)(H)(Ar)" in Formulae (Y1) to (Y4), all are preferably the above-described electron withdrawing groups.

In a case where $B^b$ is the aromatic ring group having an electron withdrawing group as a substituent, the "—O—C (Rx$_1$)(Rx$_2$)(Rx$_3$)", "—O—C(=O)OC(Rx$_1$)(Rx$_2$)(Rx$_3$)", "—O—C(R$_{36}$)(R$_{37}$)(OR$_{38}$)", and "—O—C(Rn)(H)(Ar)" in Formulae (Y1) to (Y4) are directly bonded to a carbon atom which is a ring member atom in $B^b$. In addition, as $B^b$, a plurality of groups represented by Formulae (Y1) to (Y4) may share one of the aromatic ring groups having an electron withdrawing group as a substituent.

Examples of the aromatic ring group having an electron withdrawing group as a substituent include a tetrafluorophenylene group.

In Formula (Y1) and Formula (Y2), $Rx_1$ to $Rx_3$ each independently represent a (linear or branched) alkyl group, a (monocyclic or polycyclic) cycloalkyl group, an (linear or branched) alkenyl group, or a (monocyclic or polycyclic) aryl group. If possible, these groups preferably have a fluorine atom or a group having a fluorine atom as a substituent.

In a case where all of $Rx_1$ to $Rx_3$ are (linear or branched) alkyl groups, it is preferable that at least two of $Rx_1$, $Rx_2$, or $Rx_3$ are methyl groups.

Among these, it is preferable that $Rx_1$ to $Rx_3$ each independently represent a linear or branched alkyl group, and it is mom preferable that $Rx_1$ to $Rx_3$ each independently represent a linear alkyl group.

Two of $Rx_1$ to $Rx_3$ may be bonded to each other to form a monocycle or a polycycle.

As the alkyl group of $Rx_1$ to $Rx_3$, an alkyl group having 1 to 5 carbon atoms, such as a methyl group, an ethyl group, an n-propyl group, an isopropyl group, an n-butyl group, an isobutyl group, and a t-butyl group is preferable. A fluorine atom is preferable as the substituent which can be included in the above-described alkyl group.

As the cycloalkyl group of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group of $Rx_1$ to $Rx_3$, an aryl group having 6 to 10 carbon atoms is preferable, and examples thereof include a phenyl group, a naphthyl group, and an anthryl group.

As the alkenyl group of $Rx_1$ to $Rx_3$, a vinyl group is preferable.

A cycloalkyl group is preferable as the ring formed by the bonding of two of $Rx_1$ to $Rx_3$. As a cycloalkyl group formed by the bonding of two of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of methylene groups constituting the ring may be substituted with a heteroatom such as an oxygen atom, with a group having a heteroatom, such as a carbonyl group, or with a vinylidene group. In addition, in the cycloalkyl group, one or more of the ethylene groups constituting the cycloalkane ring may be substituted with a vinylene group.

With regard to the group represented by Formula (Y1) or Formula (Y2), for example, an aspect in which $Rx_1$ is a methyl group or an ethyl group and $Rx_2$ and $Rx_3$ are bonded to each other to form the above-described cycloalkyl group is also preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is a hydrogen atom.

The alkyl group, the cycloalkyl group, the aryl group, and the aralkyl group may include a heteroatom such as an oxygen atom, and/or a group having a heteroatom, such as a carbonyl group. For example, in the above-described alkyl group, cycloalkyl group, aryl group, and aralkyl group, one or more of methylene groups may be substituted with a heteroatom such as an oxygen atom and/or with a group having a heteroatom, such as a carbonyl group.

In addition, $R_{38}$ and another substituent included in the main chain of the repeating unit may be bonded to each other to form a ring. A group formed by the mutual bonding of $R_{38}$ and another substituent on the main chain of the repeating unit is preferably an alkylene group such as a methylene group.

The portion of "—$C(R_{36})(R_{37})(OR_{38})$" in Formula (Y3) is preferably a group represented by Formula (Y3-1).

(Y3-1)

Here, $L_1$ and $L_2$ each independently represent a hydrogen atom, an alkyl group, a cycloalkyl group, an aryl group, or a group formed by a combination thereof (for example, a group formed by a combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by a combination thereof (for example, a group formed by a combination of an alkyl group and a cycloalkyl group).

In the alkyl group and the cycloalkyl group, for example, one of methylene groups may be substituted with a heteroatom such as an oxygen atom or with a group having a heteroatom, such as a carbonyl group.

It is preferable that one of $L_1$ or $L_2$ is a hydrogen atom, and the other is an alkyl group, a cycloalkyl group, an aryl group, or a group formed by a combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably a tertiary alkyl group. Examples of the secondary alkyl group include an isopropyl group, a cyclohexyl group, and a norbornyl group, and examples of the tertiary alkyl group include a tert-butyl group and an adamantane group. In these aspects, since a glass transition temperature (Tg) and an activation energy are increased, it is possible to suppress fogging in addition to ensuring a film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

(Photoacid Generating Group)

It is also preferable that the resin A included in the resist film according to the present invention has a photoacid generating group.

The photoacid generating group is a group which generates an acid by exposure.

Among these, as the photoacid generating group, a compound which generates an organic acid by irradiation with EUV light is preferable, and a photoacid generating group having a fluorine atom or an iodine atom in the molecule is more preferable.

Examples of the above-described organic acid include sulfonic acids (an aliphatic sulfonic acid, an aromatic sulfonic acid, a camphor sulfonic acid, and the like), carboxylic acids (an aliphatic carboxylic acid, an aromatic carboxylic acid, an aralkylcarboxylic acid, and the like), a carbonylsulfonylimide acid, a bis(alkylsulfonyl)imide acid, and a tris(alkylsulfonyl)methide acid.

Examples of the photoacid generating group include a group represented by Formula (OP).

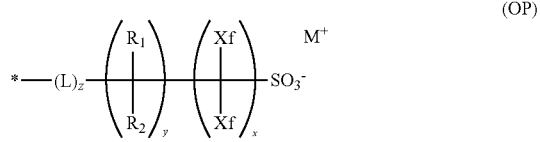

(OP)

In General Formula (OP), Xf's each independently represent a hydrogen atom, a fluorine atom, or an alkyl group substituted with at least one fluorine atom. However, at least one of two Xf's bonded to one carbon atom is other than the hydrogen atom.

$R^1$ and $R^2$ each independently represent a hydrogen atom, a fluorine atom, or an alkyl group. In a case where a plurality of $R^1$'s and $R^2$'s are present, $R^1$'s and $R^2$'s may each be the same or different from each other.

L represents a divalent linking group, and in a case where a plurality of L's are present, L's may be the same or different from each other.

Examples of the divalent linking group of L include —COO—, —CO—, —O—, —S—, —SO—, —SO$_2$—, an alkylene group, a cycloalkylene group, an alkenylene group, a linking group consisting of a plurality of these groups linked to each other, and the like. The total number of carbon atoms in these linking groups is preferably 12 or less. The substituent which may be included in the above-described alkylene group, the above-described cycloalkylene group, and the above-described alkenylene group may be an acid-decomposable group (acid-decomposable group a and/or acid-decomposable group b) itself, or may be a group including the acid-decomposable group as a part.

In General Formula (OP), x represents an integer of 1 to 20, y represents an integer of 0 to 10, and z represents an integer of 0 to 10.

In General Formula (OP), $M^+$ represents a cation. As the cation, a cation mentioned in the description of the photoacid generator described later can be used in the same manner.

(Acid-Decomposable Group a-Containing Repeating Unit)

It is preferable that the resin X and/or the resin Y has an acid-decomposable group a-containing repeating unit (repeating unit having the acid-decomposable group a). That is, the resin A included in the resist film according to the present invention preferably has an acid-decomposable group a-containing repeating unit.

The acid-decomposable group a-containing repeating unit may or may not have the above-described acid-decomposable group b in addition to the acid-decomposable group a.

The acid-decomposable group a-containing repeating unit may or may not have a photoacid generating group described later in addition to the acid-decomposable group a.

The acid-decomposable group a-containing repeating unit may or may not have a lactone group, sultone group, or carbonate group described later in addition to the acid-decomposable group a.

A content of the acid-decomposable group a-containing repeating unit is preferably 5% by mass or more, more preferably 5% to 50% by mass, and still more preferably 5% to 40% by mass with respect to the total mass of the resin A included in the resist film according to the present invention. It is also preferable that the content of the acid-decomposable group a-containing repeating unit is within the above-described range with respect to the total mass of the resin X and/or the resin Y.

The acid-decomposable group a-containing repeating unit may have one or more acid-decomposable group a, and preferably has one to four acid-decomposable groups a.

Examples of the acid-decomposable group a-containing repeating unit include repeating units represented by General Formula (I-1) to (I-11).

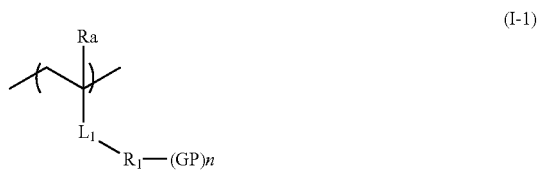

(I-1)

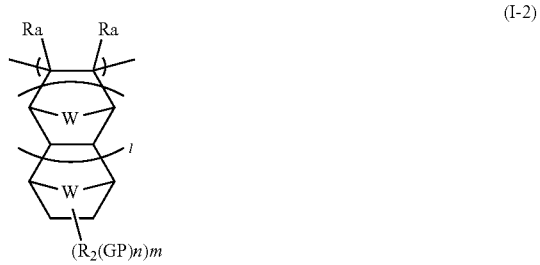

(I-2)

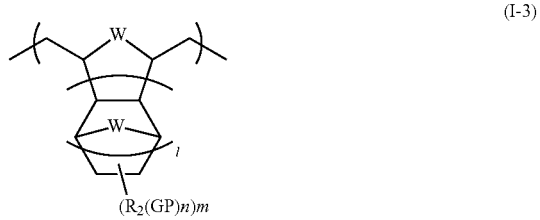

(I-3)

(I-4)

(I-5)

(I-6)

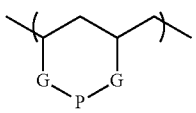
(I-7)

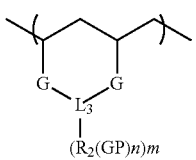
(I-8)

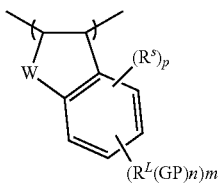
(I-9)

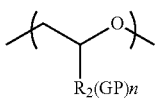
(I-10)

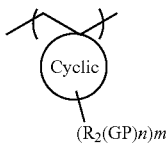
(I-11)

In the formula,

Ra's each independently represent a hydrogen atom, an alkyl group, a halogen atom, or a group represented by —CH$_2$—O—Ra$_2$. Here, Ra$_2$ represents a hydrogen atom, an alkyl group, or an acyl group.

R$_1$ represents an (n+1)-valent organic group.

R$_2$ represents a single bond or an (n+1)-valent organic group.

GP and GPG each independently represent the acid-decomposable group a. The acid-decomposable group a is as described above. In the group represented by GP, General Formulae (II-1) to (II-4) are preferable. In addition, in the group represented by "-G-P-G-" such as General Formula (I-7), the group represented by General Formulae (II-5) to (II-9) is preferable. In a case where n and/or m is an integer of 2 or more, two or more GP's may be bonded to each other to form a ring. For example, two or more GP's may be bonded to each other to form the group represented by General Formulae (II-5) to (II-9).

W represents a methylene group, an oxygen atom, or a sulfur atom.

n and m represent an integer of 1 or more. In a case where R$_2$ in General Formula (I-2), (I-3), or (I-8) represents a single bond, n is 1.

"Cyclic" in General Formula (I-11) represents a cyclic group including a carbon atom of a main chain. The cyclic group may be monocyclic or polycyclic, and may be a spiro ring. The cyclic group may have a substituent other than (R$_2$(GP)$_n$)$_m$.

l represents an integer of 0 or more.

L$_1$ represents a single bond, or a linking group represented by —COO—, —OCO—, —CONH—, —O—, —Ar—, —SO$_3$—, or —SO$_2$NH—. Here, Ar represents a divalent aromatic ring group.

R's each independently represent a hydrogen atom or an alkyl group.

R$_0$ represents a hydrogen atom or an organic group.

L$_3$ represents an (m+2)-valent linking group.

A plurality of R$^L$'s each independently represent an (n+1)-valent linking group.

A plurality of R$^S$'s each independently represent a substituent. In a case where p≥2, the plurality of R$^S$'s may be bonded to each other to form a ring.

p represents an integer of 0 to 3.

Ra represents a hydrogen atom, an alkyl group, a halogen atom, or a group represented by —CH$_2$—O—Ra$_2$. Ra is preferably a hydrogen atom or an alkyl group having 1 to 10 carbon atoms, and more preferably a hydrogen atom or a methyl group.

Ra$_2$ represents a hydrogen atom, an alkyl group, or an acyl group.

W represents a methylene group, an oxygen atom, or a sulfur atom. W is preferably a methylene group or an oxygen atom.

R$_1$ represents an (n+1)-valent organic group. R$_1$ is preferably an aromatic ring group, a non-aromatic ring group, or a chain group. The above-described aromatic ring group or non-aromatic ring group may be monocyclic or polycyclic, and may have a heteroatom as a ring member atom or include a carbonyl carbon as a ring member atom. In addition, the number of ring member atoms is preferably 5 to 15. R$_1$ as the non-aromatic ring group is also preferably an alicyclic hydrocarbon group.

The above-described chain group may be either a linear group or a branched group, and may be a chain hydrocarbon group. In addition, the number of carbon atoms is preferably 1 to 10. R$_1$ as the chain group is also preferably a chain hydrocarbon group.

The above-described aromatic ring group, non-aromatic ring group, and chain group may have a substituent other than (GP)n.

R$_2$ represents a single bond or an (n+1)-valent organic group. R$_2$ may be a single bond or a hydrocarbon group, and the hydrocarbon group may be a chain hydrocarbon group or an alicyclic hydrocarbon group. In addition, the number of carbon atoms is preferably 1 to 15. A fluorine atom is preferable as the substituent which can be included in the above-described hydrocarbon group. For example, R$_2$ is also preferably a fluoroalkylene group.

In a case where there are a plurality of R$_2$'s, the plurality of R$_2$'s may be the same or different from each other.

In a case where R$_1$ and/or R$_2$ is a chain hydrocarbon group, the chain hydrocarbon group may be linear or branched. In addition, the number of carbon atoms in this chain hydrocarbon group is preferably 1 to 8. For example, in a case where R$_1$ and/or R$_2$ is an alkylene group, as R$_1$ and/or R$_2$, a methylene group, an ethylene group, an n-propylene group, an isopropylene group, an n-butylene group, an isobutylene group, or a sec-butylene group is preferable.

In a case where R$_1$ and/or R$_2$ is an alicyclic hydrocarbon group, the alicyclic hydrocarbon group may be monocyclic or polycyclic. The alicyclic hydrocarbon group includes, for example, a monocyclo, bicyclo, tricyclo, or tetracyclo structure. The number of carbon atoms in this alicyclic hydrocarbon group is usually 5 or more, preferably 6 to 30 and more preferably 7 to 25.

Examples of the alicyclic hydrocarbon group of R$_1$ and/or R$_2$ include groups having the partial structures listed below.

In addition, the cyclic group including a carbon atom of a main chain, which is represented by "Cyclic" in General Formula (I-11), may be a group in which two hydrogen atoms are removed from one of methylene groups, which are ring member atoms, in the partial structures listed below.

Each of these partial structures may have a substituent.

In addition, in each of these partial structures, the methylene group (—CH$_2$—) may be substituted with an oxygen atom (—O—), a sulfur atom (—S—), a carbonyl group [—C(=O)—], a sulfonyl group [—S(=O)$_2$—], a sulfinyl group [—S(=O)—], or an imino group [—N(R)—] (R represents a hydrogen atom or an alkyl group).

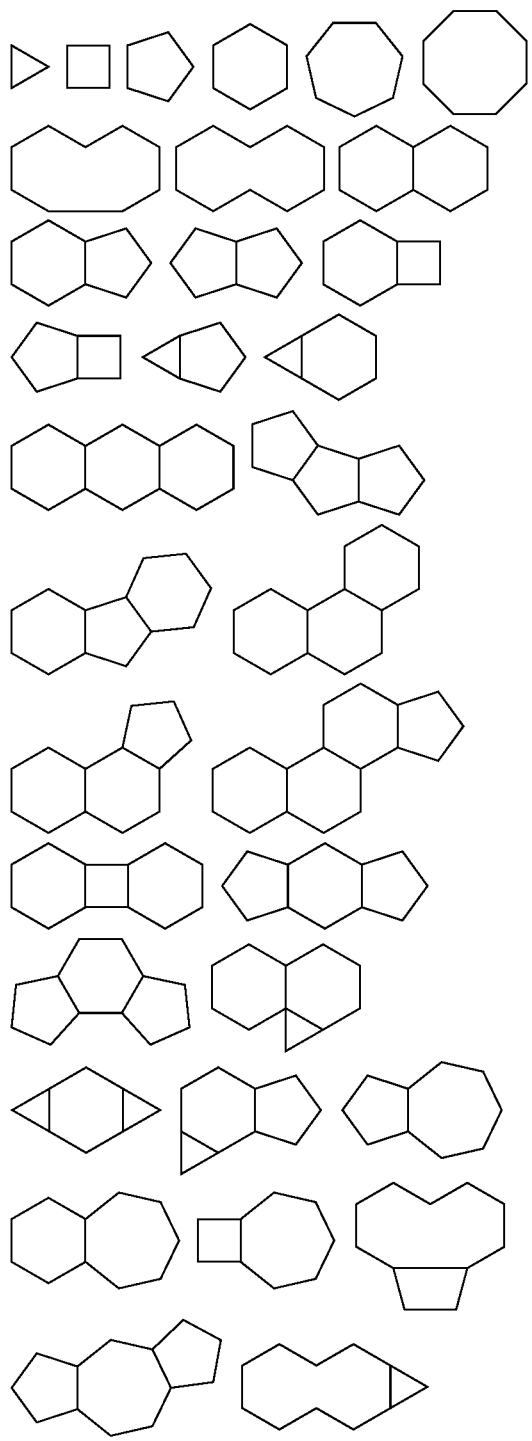

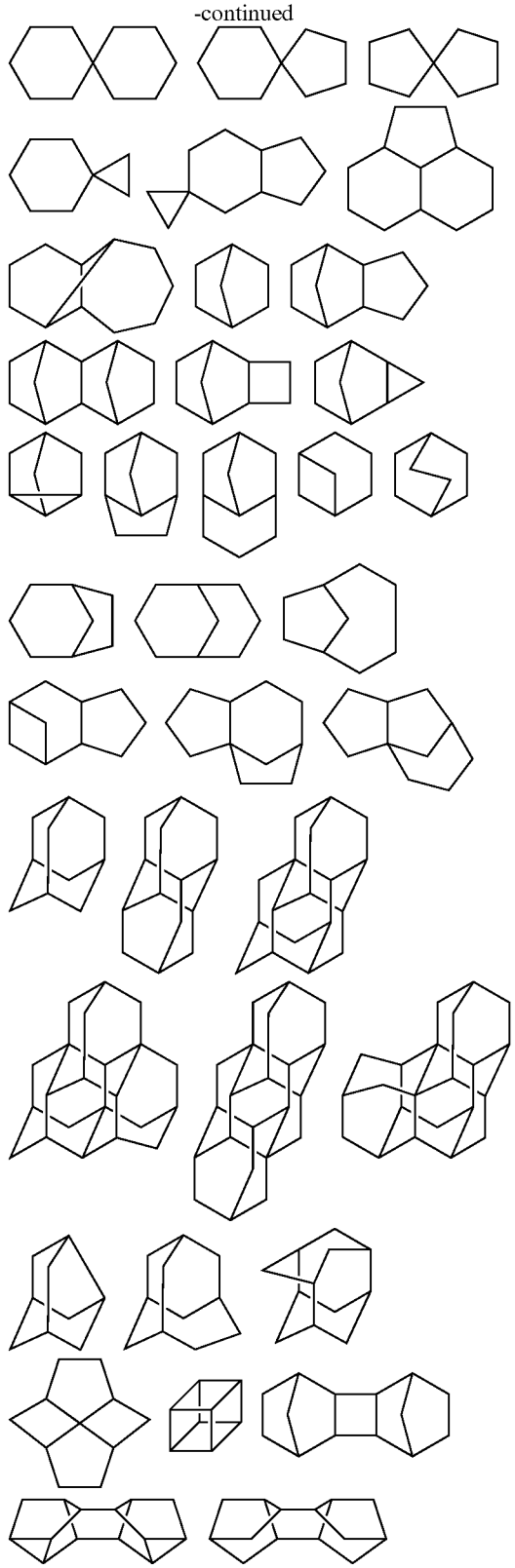

For example, in a case where $R_1$ and/or $R_2$ is a cycloalkylene group, as $R_1$ and/or $R_2$, an adamantylene group, a noradamantylene group, a decahydronaphthylene group, a tricyclodecanylene group, a tetracyclododecanylene group, a norbornene group, a cyclopentylene group, a cyclohexylene group, a cycloheptylene group, a cyclooctylene group, a cyclodecanylene group, or a cyclododecanylene group is preferable, and an adamantylene group, a norbornylene group, a cyclohexylene group, a cyclopentylene group, a tetracyclododecanylene group, or a tricyclodecanylene group is more preferable.

As the substituent which can be included in the chain hydrocarbon group and alicyclic hydrocarbon group of $R_1$ and/or $R_2$, an alkyl group having 1 to 4 carbon atoms, a halogen atom, a hydroxy group, an alkoxy group having 1 to 4 carbon atoms, a carboxy group, an alkoxycarbonyl group having 2 to 6 carbon atoms, or a group having a photoacid generating group is preferable. The above-described alkyl group, alkoxy group, and alkoxycarbonyl group may further have a substituent. Examples of the substituent include a hydroxy group, a halogen atom, and an alkoxy group.

$L_1$ represents a single bond, or a linking group represented by —COO—, —OCO—, —CONH—, —O—, —Ar—, —SO$_3$—, or —SO$_2$NH—. Here, Ar represents a divalent aromatic ring group.

$L_1$ is preferably a single bond, —COO—, —CONH—, or —Ar—.

$L_1$ and $R_1$ may be combined to form the acid-decomposable group b. For example, $L_1$ and $R_1$ may be combined to form the group represented by Formula (Y1). In this case, $(GP)_n$ may be bonded to the alkyl group, cycloalkyl group, alkenyl group, and/or aryl group represented by $Rx_1$ to $Rx_3$ in Formula (Y1) as a substituent, and $(GP)_n$ may be bonded as a monocyclic or polycyclic substituent formed by bonding two of $Rx_1$ to $Rx_3$.

R represents a hydrogen atom or an alkyl group. The alkyl group may be linear or branched. The number of carbon atoms in the above-described alkyl group is preferably 1 to 6 and more preferably 1 to 3. R is preferably a hydrogen atom or a methyl group, and more preferably a hydrogen atom.

$R_0$ represents a hydrogen atom or an organic group. Examples of the organic group include an alkyl group, a cycloalkyl group, an aryl group, an alkynyl group, and an alkenyl group. $R_0$ is preferably a hydrogen atom or an alkyl group, and more preferably a hydrogen atom or a methyl group.

$L_1$ and $R_0$ may be combined to form the acid-decomposable group b.

$L_3$ represents an (m+2)-valent linking group. That is, $L_3$ represents a linking group having a valence of 3 or more. Examples of the substituent include an alkylene group having m pieces of "$R_2(GP)_n$"s and having 2 or more carbon atoms. The number of carbon atoms in the above-described alkylene group is preferably 2 to 6.

$R^L$ represents an (n+1)-valent linking group. That is, $R^L$ represents a linking group having a valence of 2 or more. Examples of such a linking group include an alkylene group and a cycloalkylene group. $R^L$'s may be bonded to each other or may be bonded to $R^S$ below to form a ring structure.

$R^S$ represents a substituent not including the acid-decomposable group a. Examples of the substituent include an alkyl group, an alkenyl group, an alkynyl group, an aryl group, an alkoxy group, an acyloxy group, an alkoxycarbonyl group, and a halogen atom.

n is an integer of 1 or more. n is preferably an integer of 1 to 3, and more preferably 1 or 2. In addition, in a case where n is 2 or more, it is possible to further improve dissolution contrast for a developer including an organic solvent. Therefore, in this way, critical resolving power and roughness characteristics can be further improved.

m is an integer of 1 or more. m is preferably an integer of 1 to 3, and more preferably 1 or 2.

l is an integer of 0 or more. l is preferably 0 or 1.

p is an integer of 0 to 3.

As the acid-decomposable group a-containing repeating unit, for example, repeating units described in paragraph [0061] of JP2012-027438A can also be used, the contents of which are incorporated herein by reference.

(Acid-Decomposable Group b-Containing Repeating Unit)

It is preferable that the resin X and/or the resin Z has an acid-decomposable group b-containing repeating unit (repeating unit having the acid-decomposable group b). That is, the resin A included in the resist film according to the present invention preferably has an acid-decomposable group b-containing repeating unit.

The acid-decomposable group b-containing repeating unit may or may not have the above-described acid-decomposable group a in addition to the acid-decomposable group b, but it is preferable not to have the above-described acid-decomposable group a.

The acid-decomposable group b-containing repeating unit may have one or more acid-decomposable group b, and preferably has one to four acid-decomposable groups b.

A content of the acid-decomposable group b-containing repeating unit is preferably 5% to 75% by mass, more preferably 10% to 65% by mass, and still more preferably 20% to 55% by mass with respect to the total mass of the resin A included in the resist film according to the present invention. It is also preferable that the content of the acid-decomposable group b-containing repeating unit is within the above-described range with respect to the total mass of the resin X and/or the resin Z.

The acid-decomposable group b-containing repeating unit is preferably a repeating unit represented by General Formula (A).

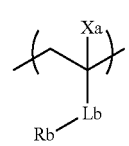

(A)

In General Formula (A),

Xa represents a hydrogen atom, an alkyl group, a halogen atom, or a group represented by —CH$_2$—O—Ra$_2$. Here, Ra$_2$ represents a hydrogen atom, an alkyl group, or an acyl group.

The number of carbon atoms in the above-described alkyl group in Xa and Ra$_2$ is preferably 1 to 5.

Lb represents a single bond or a divalent linking group.

Examples of the above-described divalent linking group include —CO—, —O—, —S—, —SO—, —SO$_2$—, a hydrocarbon group (for example, an alkylene group, a cycloalkylene group, an alkenylene group, an arylene group, and the like) which may have a fluorine atom or an iodine atom, and a linking group in which a plurality of these groups are linked. A fluorine atom or an iodine atom is preferable as the substituent which can be included in the above-described hydrocarbon group.

Lb is preferably a single bond.

Rb represents the acid-decomposable group b

Rb is preferably a group represented by any one of Formulae (Y1) to (Y4) described above.

(Repeating Unit Having Photoacid Generating Group)

The resin A may have, as a repeating unit other than those described above, a repeating unit having a group which generates an acid by irradiation with actinic rays or radiation (hereinafter, also referred to as a "photoacid generating group").

The repeating unit having a photoacid generating group may or may not have the acid-decomposable group a and/or the acid-decomposable group b.

That is, the repeating unit having a photoacid generating group may be a repeating unit which has a photoacid generating group and has the acid-decomposable group a and/or the acid-decomposable group b, or may be a repeating unit which does not have the acid-decomposable group a and/or the acid-decomposable group b and has a photoacid generating group.

Among these, in a case where the repeating unit having a photoacid generating group has the acid-decomposable group (acid-decomposable group a and/or acid-decomposable group b), the repeating unit having a photoacid generating group is also preferably a specific repeating unit having both the acid-decomposable group a and the photoacid generating group. That is, it is also preferable that the resin A has the above-described specific repeating unit.

In addition, the repeating unit having a photoacid generating group preferably has an anionic moiety and a cationic moiety.

In a case where the photoacid generating group included in the repeating unit having a photoacid generating group has a cation, the above-described cationic moiety is the cation, and in this case, the above-described anionic moiety is a portion other than the cation (cationic moiety) in the repeating unit having a photoacid generating group. In a case where the photoacid generating group included in the repeating unit having a photoacid generating group has an anion, the above-described anionic moiety is the anion, and in this case, the above-described cationic moiety is a portion other than the anion (anionic moiety) in the repeating unit having a photoacid generating group.

For example, in a case where the repeating unit having a photoacid generating group is the repeating unit having a group represented by Formula (OP) described above, the cation represented by $M^+$ is the cationic moiety, and the portion other than $M^+$ in the repeating unit having the group represented by Formula (OP) is the anionic moiety.

It is also preferable that the repeating unit which has the acid-decomposable group a and/or the acid-decomposable group b and has a photoacid generating group has an anionic moiety and a cationic moiety. In this case, the above-described anionic moiety and/or cationic moiety may have the acid-decomposable group a and/or the acid-decomposable group b.

Among these, it is preferable that the above-described specific repeating unit has the anionic moiety and the cationic moiety, and the above-described anionic moiety and/or cationic moiety has the acid-decomposable group a.

In a case where the resin A included in the resist film according to the present invention has the repeating unit having a photoacid generating group, a content thereof is preferably 1% to 30% by mass, more preferably 2% to 15% by mass, and still more preferably 3% to 10% by mass with respect to the total repeating unit of the resin A included in the resist film. It is also preferable that the content of the repeating unit having a photoacid generating group is within the above-described range with respect to the total repeating unit of the resin W, the resin X, the resin Y, and/or the resin Z.

It is also preferable that the total content of the repeating unit which has the acid-decomposable group a and/or the acid-decomposable group b and has a photoacid generating group and the repeating unit which does not have the acid-decomposable group a and/or the acid-decomposable group b and has a photoacid generating group satisfies the above-described range of content, it is also preferable that the content of only the repeating unit which has the acid-decomposable group a and/or the acid-decomposable group b and has a photoacid generating group satisfies the above-described range of content, it is also preferable that the content of only the repeating unit which does not have the acid-decomposable group a and/or the acid-decomposable group b and has a photoacid generating group satisfies the above-described range of content, it is also preferable that the total content of the specific repeating unit and the repeating unit having other photoacid generating groups satisfies the above-described range of content, and it is also preferable that the content of only the specific repeating unit satisfies the above-described range of content.

Examples of such a repeating unit include a repeating unit represented by General Formula (4).

(4)

$R^{41}$ represents a hydrogen atom or a methyl group.
$L^{41}$ represents a single bond or a divalent linking group.
$L^{42}$ represents a divalent linking group.
The above-described divalent linking group in $L^{41}$ and $L^{42}$ may have an acid-decomposable group (acid-decomposable group a and/or acid-decomposable group b).
$R^{40}$ represents a structural moiety which is decomposed by irradiation with actinic rays or radiation to generate an acid in a side chain. $R^{40}$ is preferably the above-described photoacid generating group, and more preferably General Formula (OP) described above.

In addition, examples of the repeating unit represented by General Formula (4) include repeating units described in paragraphs [0094] to [0105] of JP2014-041327A.

(Repeating Unit Having Lactone Group, Sultone Group, or Carbonate Group)

The resin A included in the resist film according to the present invention may have a repeating unit having at least one selected from the group consisting of a lactone group, a sultone group, and a carbonate group (hereinafter, also collectively referred to as a "repeating unit having a lactone group, a sultone group, or a carbonate group").

It is also preferable that the repeating unit having a lactone group, a sultone group, or a carbonate group has no acid group such as a hexafluoropropanol group.

The lactone group or the sultone group may have a lactone structure or a sultone structure. The lactone structure or the sultone structure is preferably a 5- to 7-membered ring lactone structure or a 5- to 7-membered ring sultone structure. Among these, the structure is more preferably a 5- to 7-membered ring lactone structure with which another ring structure is fused so as to form a bicyclo structure or a spiro structure or a 5- to 7-membered ring sultone structure with which another ring structure is fused so as to form a bicyclo structure or a spiro structure.

The resin A included in the resist film according to the present invention preferably has a repeating unit having a lactone group or a sultone group, formed by extracting one or more hydrogen atoms from a ring member atom of a lactone structure represented by any of General Formulae (LC1-1) to (LC1-21) or a sultone structure represented by any of General Formulae (SL1-1) to (SL1-3).

In addition, the lactone group or the sultone group may be bonded directly to the main chain. For example, a ring member atom of the lactone group or the sultone group may constitute the main chain of the resin A included in the resist film according to the present invention.

LC1-1

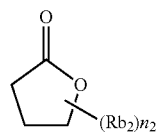

LC1-2

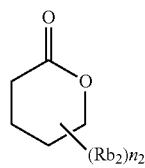

LC1-3

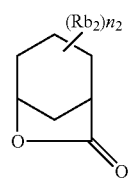

LC1-4

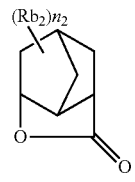

LC1-5

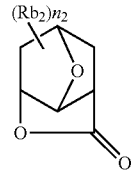

LC1-6

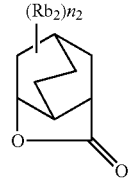

-continued

LC1-7

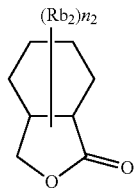

LC1-8

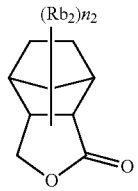

LC1-9

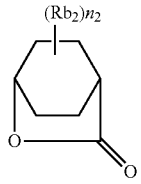

LC1-10

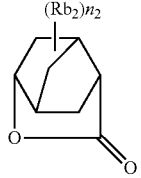

LC1-11

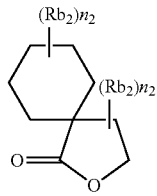

LC1-12

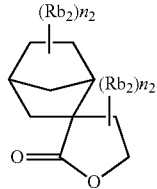

LC1-13

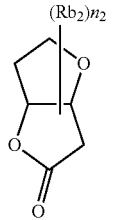

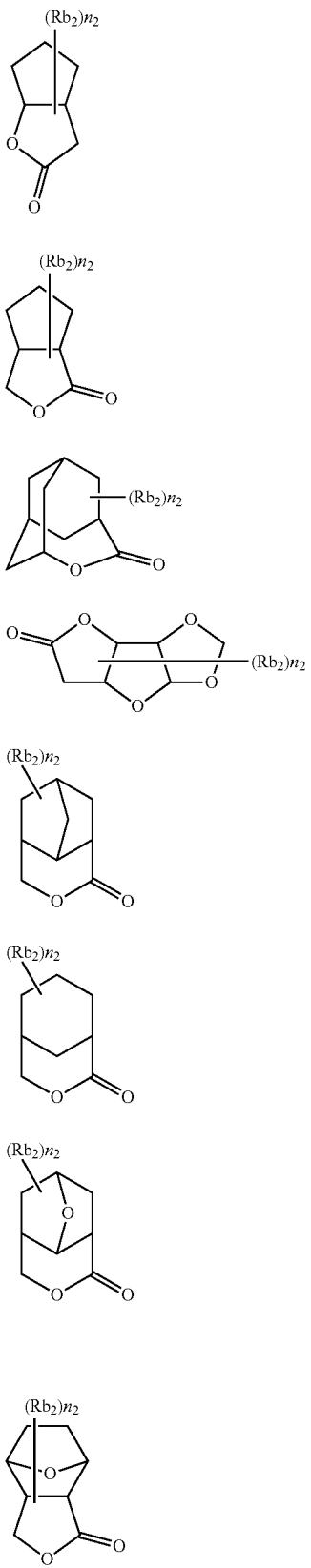

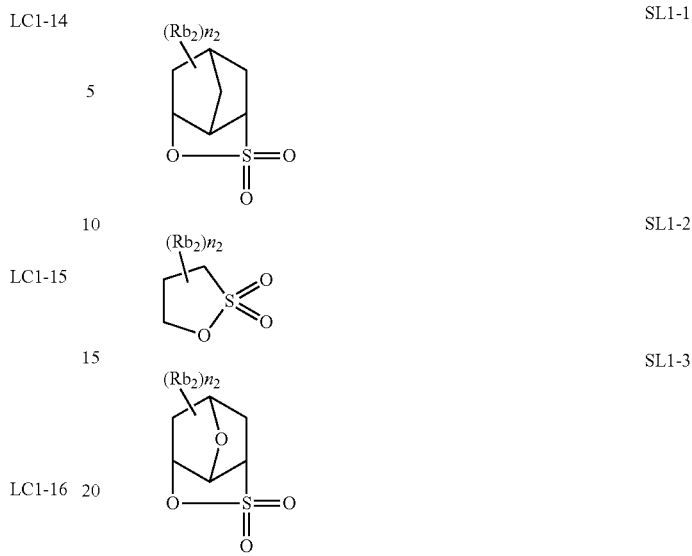

The above-described portion of lactone structure or sultone structure may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, and a cyano group. n2 represents an integer of 0 to 4. In a case where n2 is 2 or more, $Rb_2$'s which are present in a plural number may be different from each other, and $Rb_2$'s which are present in a plural number may be bonded to each other to form a ring.

Examples of the repeating unit having a group having the lactone structure represented by any of General Formulae (LC1-1) to (LC1-21) or the sultone structure represented by any of General Formulae (SL1-1) to (SL1-3) include a repeating unit represented by General Formula (AI).

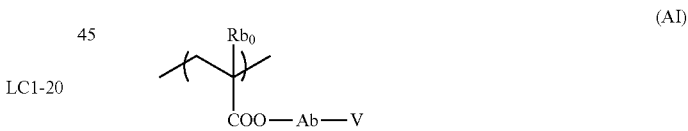

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by a combination thereof. Among these, a single bond or a linking group represented by -$Ab_1$-$CO_2$— is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

V represents a group formed by extracting one hydrogen atom from a ring member atom of the lactone structure represented by any of General Formulae (LC1-1) to (LC1-21) or a group formed by extracting one hydrogen atom from a ring member atom of the sultone structure represented by any of General Formulae (SL1-1) to (SL1-3).

In a case where an optical isomer is present in the repeating unit having a lactone group or a sultone group, any of optical isomers may be used. In addition, one optical isomer may be used alone or a mixture of a plurality of the optical isomers may be used. In a case where one kind of optical isomers is mainly used, an optical purity (ee) thereof is preferably 90 or more, and more preferably 95 or more.

As the carbonate group, a cyclic carbonate ester group is preferable.

As the repeating unit having a cyclic carbonate ester group, a repeating unit represented by General Formula (A-1) is preferable.

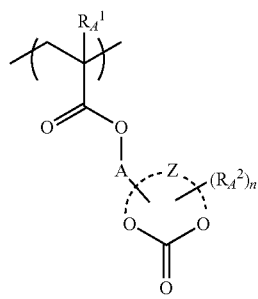

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in a plural number may be the same or different from each other.

A represents a single bond or a divalent linking group. As the above-described divalent linking group, an alkylene group, a divalent linking group having a monocyclic or polycyclic alicyclic hydrocarbon structure, an ether group, an ester group, a carbonyl group, a carboxyl group, or a divalent group formed by a combination thereof is preferable.

Z represents an atomic group which forms a monocycle or polycycle with a group represented by —O—CO—O— in the formula.

As the repeating unit having a lactone group or a sultone group, for example, repeating units described in paragraphs [0109] and [0120] of JP2014-010245A can also be used, the contents of which are incorporated herein by reference.

As the repeating unit having a carbonate group, for example, repeating units described in paragraphs [0121] to [0132] of JP2014-010245A can also be used, the contents of which are incorporated herein by reference.

A content of the repeating unit having a lactone group, a sultone group, or a carbonate group is preferably 1% to 70% by mass, more preferably 5% to 65% by mass, and still more preferably 5% to 60% by mass with respect to the total repeating unit of the resin A included in the resist film. It is also preferable that the content of the repeating unit having a lactone group, a sultone group, or a carbonate group is within the above-described range with respect to the total repeating unit of the resin W, the resin X, the resin Y, and/or the resin Z.

(Repeating Unit Having Acid Group)

The resin A included in the resist film may have a repeating unit having an acid group.

As the acid group, an acid group having a pKa of 13 or less is preferable.

As the acid group, for example, a carboxyl group, a phenolic hydroxyl group, a fluorinated alcohol group (preferably, a hexafluoroisopropanol group), a sulfonic acid group, a sulfonamide group, an isopropanol group, or the like is preferable.

In addition, in the above-described hexafluoroisopropanol group, one or more (preferably one or two) fluorine atoms may be substituted with a group (an alkoxycarbonyl group and the like) other than a fluorine atom. —C(CF$_3$)(OH)—CF$_2$— formed as above is also preferable as the acid group. In addition, one or more fluorine atoms may be substituted with a group other than a fluorine atom to form a ring including —C(CF$_3$)(OH)—CF$_2$—.

The repeating unit having an acid group is preferably a repeating unit different from the repeating unit having the structure in which a polar group is protected by the leaving group which is eliminated by the action of acid as described above, and the repeating unit having a lactone group, a sultone group, or a carbonate group, which will be described later.

The repeating unit having an acid group may have a fluorine atom or an iodine atom.

As the repeating unit having an acid group, a repeating unit represented by Formula (B) is preferable.

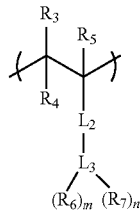

(B)

$R_3$ represents a hydrogen atom or a monovalent substituent which may have a fluorine atom or an iodine atom.

As the monovalent substituent which may have a fluorine atom or an iodine atom, a group represented by -$L_4$-$R_8$ is preferable. $L_4$ represents a single bond or an ester group. Examples of $R_8$ include an alkyl group which may have a fluorine atom or an iodine atom, a cycloalkyl group which may have a fluorine atom or an iodine atom, an aryl group which may have a fluorine atom or an iodine atom, and a group formed by a combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be monocyclic or polycyclic, and examples thereof include a cycloalkyl ring group.

$R_6$ represents a hydroxyl group, a fluorinated alcohol group (preferably, a hexafluoroisopropanol group), or —$SO_2$—$NHR^T$. $R^T$ represents a hydrogen atom or a substituent. The substituent of $R^T$ is preferably an arylcarbonyl group. In a case where $R_6$ is a hydroxyl group or —$SO_2$—$NHR^T$, $L_3$ is preferably the (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3 and more preferably an integer of 1 or 2.

n represents 0 or an integer of 1 or more. n is preferably an integer of 0 to 4.

(n+m+1) is preferably an integer of 1 to 5.

The repeating unit having an acid group may be a repeating unit composed of (meth)acrylic acid.

As the repeating unit having an acid group, for example, repeating units described in paragraphs [0050] to [0075] of JP2014-010245A can also be used, the contents of which are incorporated herein by reference.

A content of the repeating unit having an acid group is preferably 10% to 70% by mass, more preferably 15% to 65% by mass, and still more preferably 20% to 60% by mass with respect to the total repeating unit of the resin A included in the resist film. It is also preferable that the content of the repeating unit having an acid group is within the above-described range with respect to the total repeating unit of the resin W, the resin X, the resin Y, and/or the resin Z.

(Repeating Unit Having Hydroxyl Group)

The resin A included in the resist film may have a repeating unit having a hydroxyl group. As a result, adhesiveness to the substrate and affinity for a developer are improved.

The repeating unit having a hydroxyl group is preferably a repeating unit having an alicyclic hydrocarbon structure substituted with a hydroxyl group.

It is preferable that the repeating unit having a hydroxyl group does not have the acid-decomposable group.

It is preferable that the hydroxyl group in the repeating unit having a hydroxyl group is not a hydroxyl group constituting an acid group.

Examples of the repeating unit having a hydroxyl group include a repeating unit represented by General Formulae (AIIa) to (AIId).

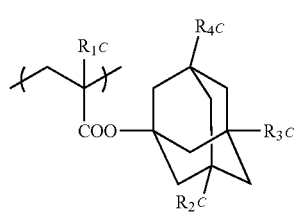
(AIIa)

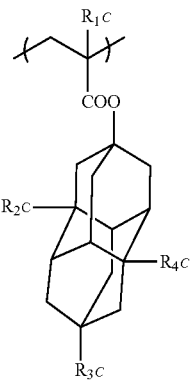
(AIIb)

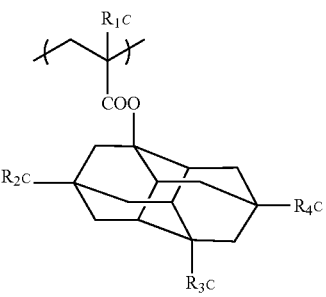
(AIIc)

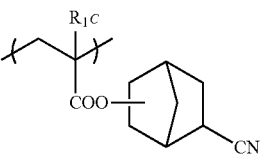
(AIId)

In General Formulae (AIIa) to (AIId), $R_{1c}$ represents a hydrogen atom, a methyl group, a trifluoromethyl group, or a hydroxymethyl group.

$R_{2c}$ to $R_{4c}$ each independently represent a hydrogen atom or a hydroxyl group. However, at least one of $R_{2c}$, $R_{3c}$, or $R_{4c}$ represents a hydroxyl group. It is preferable that one or two of $R_{2c}$ to $R_{4c}$ are hydroxyl groups and the remaining are hydrogen atoms. It is more preferable that two of $R_{2c}$ to $R_{4c}$ are hydroxyl groups and the remaining are hydrogen atoms.

As the repeating unit having a hydroxyl group, for example, repeating units described in paragraphs [0133] to [0142] of JP2014-010245A can also be used, the contents of which are incorporated herein by reference.

A content of the repeating unit having a hydroxyl group is preferably 5% to 75% by mass, more preferably 10% to 70% by mass, and still more preferably 15% to 65% by mass with respect to the total repeating unit of the resin A included in the resist film. It is also preferable that the content of the repeating unit having a hydroxyl group is within the above-described range with respect to the total repeating unit of the resin W, the resin X, the resin Y, and/or the resin Z.

(Repeating Unit for Reducing Mobility of Main Chain)

From the viewpoint that excessive diffusion of a generated acid or pattern collapse during development can be suppressed, the resin A included in the resist film preferably has a high glass transition temperature (Tg). The Tg is preferably higher than 90° C., more preferably higher than 100° C., still more preferably higher than 110° C., and particularly preferably higher than 125° C. Since an excessively high Tg causes a decrease in dissolution rate in a developer, the Tg is preferably 400° C. or lower and more preferably 350° C. or lower.

In order to increase the Tg of the resin A included in the resist film, it is preferable to reduce mobility of the main chain of the resin A. Examples of a method for reducing the mobility of the main chain of the resin A include a method of form a main chain in a cyclic structure and a method of connecting a cyclic structure to the main chain.

Repeating Unit Represented by Formula (D)

Examples of the method of form a main chain in a cyclic structure include a method of introducing a repeating unit represented by Formula (D) into the resin A included in the resist film.

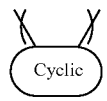
(D)

In Formula (D), "Cyclic" is a group which forms a main chain as a cyclic structure. The number of ring-constituting atoms is not particularly limited.

Examples of the repeating unit represented by Formula (D) include the following repeating units.

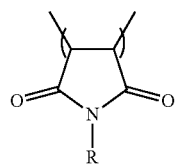
(D-1)

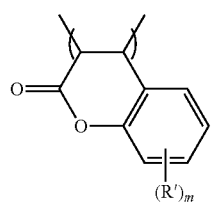
(D-2)

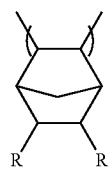
(D-3)

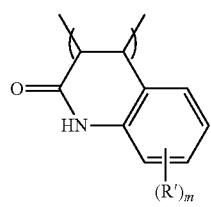
(D-4)

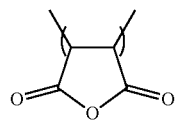
(D-5)

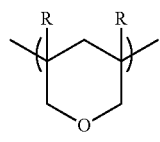
(D-6)

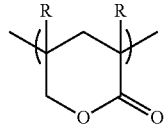
(D-7)

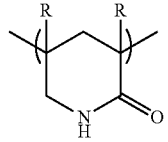
(D-8)

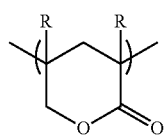
(D-9)

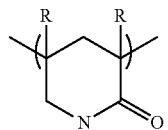
(D-10)

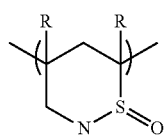
(D-11)

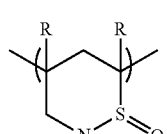
(D-12)

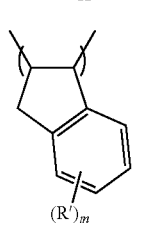
(D-13)

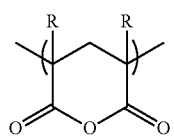
(D-14)

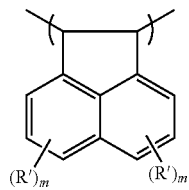
(D-15)

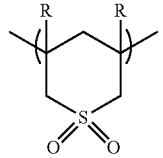
(D-16)

-continued

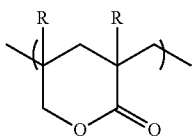
(D-17)

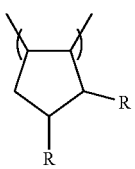
(D-18)

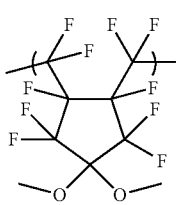
(D-19)

In the formulae, R's each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR"; R" is an alkyl group or fluorinated alkyl group having 1 to 20 carbon atoms), or a carboxylic acid group. The alkyl group, the cycloalkyl group, the aryl group, the aralkyl group, and the alkenyl group described above may each have a substituent. In addition, the hydrogen atom bonded to the carbon atom in the group represented by R may be substituted with a fluorine atom or an iodine atom.

In the formula, R"s each independently represent an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR"; R" is an alkyl group or fluorinated alkyl group having 1 to 20 carbon atoms), or a carboxylic acid group. The alkyl group, the cycloalkyl group, the aryl group, the aralkyl group, and the alkenyl group described above may each have a substituent. In addition, a hydrogen atom bonded to the carbon atom in the group represented by R' may be substituted with a fluorine atom or an iodine atom.

m represents an integer of 0 or more. An upper limit of m is not particularly limited, but is 2 or less in many cases and 1 or less in more cases.

A content of the repeating unit represented by Formula (D) is preferably 5% to 60% by mass and more preferably 10% to 55% by mass with respect to the total repeating unit of the resin A included in the resist film. It is also preferable that the content of the repeating unit represented by Formula (D) is within the above-described range with respect to the total repeating unit of the resin W, the resin X, the resin Y, and/or the resin Z.

Repeating Unit Represented by Formula (E)

Examples of the method of connecting a cyclic structure to the main chain include a method of introducing a repeating unit represented by Formula (E) into the resin A.

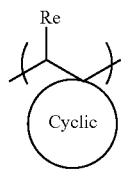
(E)

In Formula (E), Re's each independently represent a hydrogen atom or a substituent. Examples of the substituent include an alkyl group, a cycloalkyl group, an aryl group, an aralkyl group, and an alkenyl group, which may have a substituent.

"Cyclic" is a cyclic group including a carbon atom of a main chain. The number of atoms included in the cyclic group is not particularly limited.

Specific examples of the repeating unit represented by Formula (E) include the following repeating units.

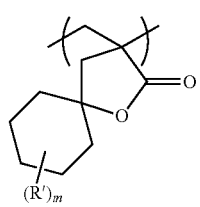
(E-1)

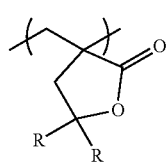
(E-2)

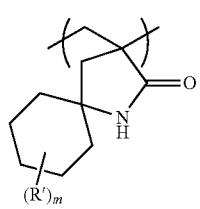
(E-3)

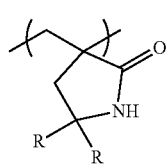
(E-4)

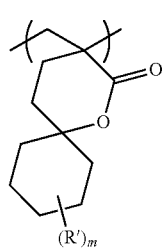
(E-5)

-continued

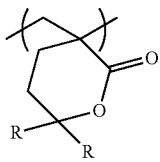
(E-6)

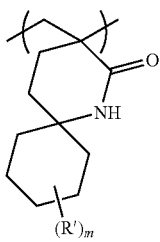
(E-7)

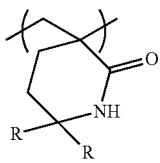
(E-8)

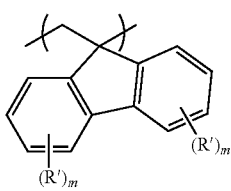
(E-9)

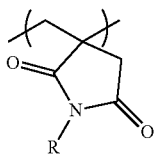
(E-10)

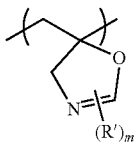
(E-11)

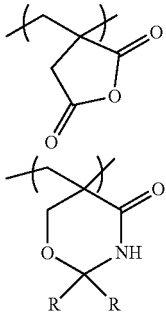
(E-12)

In the formula, R's each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR"; R" is an alkyl group or fluorinated alkyl group having 1 to 20 carbon atoms), or a carboxyl group. The alkyl group, the cycloalkyl group, the aryl group, the aralkyl group, and the alkenyl group described above may each have a substituent. In addition, the hydrogen atom bonded to the carbon atom in the group represented by R may be substituted with a fluorine atom or an iodine atom.

R"s each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR"; R" is an alkyl group or fluorinated alkyl group having 1 to 20 carbon atoms), or a carboxyl group. The alkyl group, the cycloalkyl group, the aryl group, the aralkyl group, and the alkenyl group described above may each have a substituent. In addition, a hydrogen atom bonded to the carbon atom in the group represented by R' may be substituted with a fluorine atom or an iodine atom.

m represents an integer of 0 or more. An upper limit of m is not particularly limited, but is 2 or less in many cases and 1 or less in more cases.

In addition, two R's bonded to the same carbon atom may be bonded to each other to form a ring.

In Formulae (E-2), (E-4), (E-6), and (E-8), two R's may jointly form "=O".

A content of the repeating unit represented by Formula (E) is preferably 5% to 60% by mass and more preferably 10% to 55% by mass with respect to the total repeating unit of the resin A included in the resist film. It is also preferable that the content of the repeating unit represented by Formula (E) is within the above-described range with respect to the total repeating unit of the resin W, the resin X, the resin Y, and/or the resin Z.

The method for increasing the Tg of the resin A included in the resist film is not limited, and examples thereof include a method of introducing the repeating unit described in paragraphs [0105] to [0128] of JP2019-045864A.

For the purpose of controlling dry etching resistance, suitability for a standard developer, substrate adhesiveness, resist profile, resolution, heat resistance, sensitivity, and the like, the resin A included in the resist film may have various repeating structural units in addition to the repeating structural units described above.

As the resin A included in the resist film, all the repeating units also preferably include (meth)acrylate-based repeating units (particularly, in a case where the composition is used as an actinic ray-sensitive or radiation-sensitive composition for ArF). In this case, any resin of a resin in which all repeating units are methacrylate-based repeating units, a resin in which all repeating units are acrylate-based repeating units, or a resin with all repeating units consisting of a methacrylate-based repeating unit and an acrylate-based repeating unit can be used. A resin in which the acrylate-based repeating unit is 50% by mole or less of all repeating units is preferable.

The resin A can be synthesized in accordance with an ordinary method (for example, a radical polymerization).

A weight-average molecular weight of the resin A (the resin W, the resin X, the resin Y, and/or the resin Z) included in the resist film as a value expressed in terms of polystyrene by a GPC method is preferably 1,000 to 200,000, more preferably 3,000 to 20,000, and still more preferably 5,000 to 15,000. By setting the weight-average molecular weight of the resin A included in the resist film to 1,000 to 200,000, deterioration of heat resistance and dry etching resistance can be further suppressed. In addition, deterioration of developability and deterioration of film-forming properties due to high viscosity can also be further suppressed.

A dispersity (molecular weight distribution) of the resin A (the resin W, the resin X, the resin Y, and/or the resin Z) included in the resist film is usually 1 to 5, preferably 1 to 3, more preferably 1.2 to 3.0, and still more preferably 1.2 to 2.0. As the dispersity is smaller, resolution and resist shape are more excellent, and a side wall of a resist pattern is smoother and roughness is also more excellent.

In the resin A included in the resist film, an amount of change in SP value determined by Expression (DSP) is preferably 0.1 MPa$^{0.5}$ or more, more preferably 0.3 MPa$^{0.5}$ or more, still more preferably 0.5 MPa$^{0.5}$ or more, and particularly preferably 0.7 MPa$^{0.5}$ or more. The upper limit of the amount of change in SP value is not limited, but is preferably 20.0 MPa$^{0.5}$ or less and more preferably 15.0 MPa$^{0.5}$ or less.

$$\text{Amount of change in SP value} = [(\delta D1 - \delta D2)^2 + (\delta P1 - \delta P2)^2 + (\delta H1 - \delta H2)^2]^{0.5} \quad \text{Expression (DSP):}$$

δD1: a dispersion element of the resin A (unit: MPa$^{0.5}$)

δP1: a dipole-dipole element of the resin A (unit: MPa$^{0.5}$)

δH1: a hydrogen bond element of the resin A (unit: MPa$^{0.5}$)

δD2: a dispersion element of the resin A in a case where all the acid-decomposable groups a of the resin A react with the acid (unit: MPa$^{0.5}$)

δP2: a dipole-dipole element of the resin A in a case where all the acid-decomposable groups a of the resin A react with the acid (unit: MPa$^{0.5}$)

δH2: a hydrogen bond element of the resin A in a case where all the acid-decomposable groups a of the resin A react with the acid (unit: MPa$^{0.5}$)

In the resin A, the "in a case where all the acid-decomposable groups a react with the acid" is assumed that only the acid-decomposable group a of the resin A reacts with the acid and the acid-decomposable group b does not react.

In the present specification, the dispersion element, the dipole-dipole element, and the hydrogen bond element of the compound including the resin A each are values calculated using HSPiP (software "Hansen Solubility Parameters in Practice (HSPiP) ver. 5.1.08").

Specifically, first, the dispersion element, the dipole-dipole element, and the hydrogen bond element of each repeating unit constituting the resin A to be calculated are calculated based on a structure in which each terminal (bonding site) in the main chain of each repeating unit is substituted with a hydrogen atom.

That is, the dispersion element, the dipole-dipole element, and the hydrogen bond element obtained by the above-descried software (HSPiP) for the structure in which each terminal in the main chain of a certain repeating unit is substituted with a hydrogen atom are set as the dispersion element, the dipole-dipole element, and the hydrogen bond element of the repeating unit.

In a case where the repeating unit to be calculated is a repeating unit P0 represented by the following structural formula, the "structure in which each terminal in the main chain of the repeating unit is substituted with a hydrogen atom" corresponds to a compound P0x represented by the following structural formula.

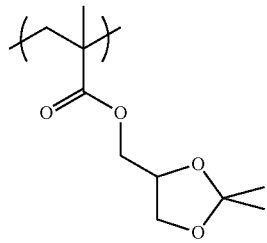

(P0)

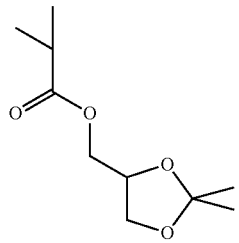

(P0x)

After obtaining the dispersion element, the dipole-dipole element, and the hydrogen bond element of each repeating unit constituting the resin A, based on the volume of each repeating unit occupied in the resin A, values obtained by weighted averaging the dispersion element, the dipole-dipole element, and the hydrogen bond element of each repeating unit are set as the dispersion element, the dipole-dipole element, and the hydrogen bond element in the resin A.

In addition, in obtaining the dispersion element, the dipole-dipole element, and the hydrogen bond element of the resin A in a case where all the acid-decomposable groups a of the resin A react with the acid, it is assumed that the resin A has a structure in which the acid-decomposable group a in the acid-decomposable group a-containing repeating unit of the resin A reacts with the acid, and the dispersion element, the dipole-dipole element, and the hydrogen bond element in the resin are computed in the same manner as described above. The obtained values are defined as the dispersion element, the dipole-dipole element, and the hydrogen bond element of the resin A in a case where all the acid-decomposable groups a of the resin A react with the acid.

Specifically, for example, in a case where the resin A includes only the repeating unit P0 represented by the following structural formula as the acid-decomposable group a-containing repeating unit, it is assumed that the repeating unit P0 is a repeating unit P1 represented by the following structural formula, and the dispersion element, the dipole-dipole element, and the hydrogen bond element in the resin are obtained in the same manner as described above. The obtained values are defined as the dispersion element, the dipole-dipole element, and the hydrogen bond element of the resin A in a case where all the acid-decomposable groups a of the resin A react with the acid.

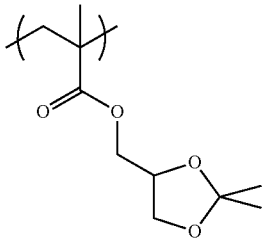

(P0)

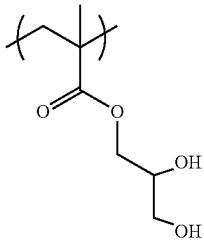

(P1)

In a case where the resin A is composed of two or more kinds of resins, based on the volume of each repeating unit occupied in the entire resin A composed of two or more kinds of resins, values obtained by weighted averaging the dispersion element, the dipole-dipole element, and the hydrogen bond element of each repeating unit are set as the dispersion element, the dipole-dipole element, and the hydrogen bond element in the resin A. The same applies to a case where the dispersion element, the dipole-dipole element, and the hydrogen bond element of the resin A are obtained in a case where all the acid-decomposable groups a of the resin A composed of two or more kinds of resins react with the acid.

In the resin A included in the resist film, a segregation index determined by Expression (SP) is, for example, 0.5 or more, preferably more than 1.0, more preferably 2.0 or more, still more preferably 3.8 or more, and particularly preferably 26.0 or more. The upper limit of the segregation index is not limited, and for example, 70 or less.

$$\text{Segregation index} = [[\delta D3-(\delta D1+\delta D2)/2]^2+[\delta P3-(\delta P1+\delta P2)/2]^2+[\delta H3-(\delta H1+\delta H2)/2]^2]^{0.5} \times [(\delta D2-\delta D1)^2+(\delta P2-\delta P1)^2+(\delta H2-\delta H1)^2]^{0.5}$$ Expression (SP):

$\delta D1$: a dispersion element of the resin A (unit: $MPa^{0.5}$)
$\delta P1$: a dipole-dipole element of the resin A (unit: $MPa^{0.5}$)
$\delta H1$: a hydrogen bond element of the resin A (unit: $MPa^{0.5}$)
$\delta D2$: a dispersion element of the resin A in a case where all the acid-decomposable groups a of the resin A react with the acid (unit: $MPa^{0.5}$)
$\delta P2$: a dipole-dipole element of the resin A in a case where all the acid-decomposable groups a of the resin A react with the acid (unit: $MPa^{0.5}$)
$\delta H2$: a hydrogen bond element of the resin A in a case where all the acid-decomposable groups a of the resin A react with the acid (unit: $MPa^{0.5}$)
$\delta D3$: a dispersion element of the acid generated from the photoacid-generating component (unit: $MPa^{0.5}$)
$\delta P3$: a dipole-dipole element of the acid generated from the photoacid-generating component (unit: $MPa^{0.5}$)
$\delta H3$: a hydrogen bond element of the acid generated from the photoacid-generating component (unit: $MPa^{0.5}$)

The dispersion element, the dipole-dipole element, and the hydrogen bond element of the resin A and the resin A in a case where all the acid-decomposable groups a of the resin A react with the acid are obtained in the same manner as described in relation to Expression (DSP).

In a case where the acid generated from the photoacid-generating component has the acid-decomposable group a, it is assumed that the acid-decomposable group a of the acid reacts with the acid, and the dispersion element, the dipole-dipole element, and the hydrogen bond element of the acid are computed by the above-described software (HSPiP).

In a case where the acid generated from the photoacid-generating component has the acid-decomposable group b, it is assumed that the acid-decomposable group b of the acid does not react with the acid, and the dispersion element, the dipole-dipole element, and the hydrogen bond element of the acid are computed by the above-described software (HSPiP).

In a case where there are two or more acids (generated acids) generated from the photoacid generator, in generated acids having a content of 10% by mass with respect to the total mass of all generated acids, the dispersion element, the dipole-dipole element, and the hydrogen bond element of a generated acid having the highest pKa are set to the values of $\delta D3$, $\delta P3$, and $\delta H3$. However, in a case where there is no generated acid in which the content is 10% by mass or more with respect to the total mass of all generated acids, in each generated acid in which the content is less than 10% by mass with respect to the total mass of all generated acids, the dispersion element, the dipole-dipole element, and the hydrogen bond element of a generated acid having the largest value of the product of the contained mass and pKa are set to the values of $\delta D3$, $\delta P3$, and $\delta H3$.

The value of $[(\delta D2-\delta D1)^2+(\delta P2-\delta P1)^2+(\delta H2-\delta H1)^2]^{0.5}$ in Expression (SP) is assumed to be an ideal value indicating the degree of difference between the dispersion element, the dipole-dipole element, and the hydrogen bond element of the resin A in the exposed portion before and after the first heating step. It is considered that, as this value is larger, a difference in SP value (Hildebrand solubility parameter) between the resin A in the exposed portion and the resin A in the non-exposed portion is large, and the affinity of the resin A in the exposed portion to the acid is relatively large. Therefore, it is considered that, as the value of $[(\delta D2-\delta D1)^2+(\delta P2-\delta P1)^2+(\delta H2-\delta H1)^2]$ is larger, the acid generated in the resist film is less likely to diffuse to the unexposed portion, and the acid is attracted to the exposed region, so that the effects of the present invention are more excellent. In a case where the resin A includes the resin Z having no acid-decomposable group a, the value of $[(\delta D2-\delta D1)^2+(\delta P2-\delta P1)^2+(\delta H2-\delta H1)^2]$ in a case of considering only the resin Z is 0, and the segregation index of the resin Z in the resin A is also 0. In the same way, the segregation index of the resin W in the resin A is also 0.

The "$(\delta D1+\delta D2)/2$", "$(\delta P1+\delta P2)/2$", and "$(\delta H1+\delta H2)/2$" in $[[\delta D3-(\delta D1+\delta D2)/2]^2+[\delta P3-(\delta P1+\delta P2)/2]^2+[\delta H3-(\delta H1+\delta H2)/2]^2]^{0.5}$ of Expression (SP) indicates each of the dispersion element, the dipole-dipole element, and the hydrogen bond element of the resin A in a case where the acid-decomposable group a reacts only half of the whole, and it is assumed as a realistic value for the dispersion element, the dipole-dipole element, and the hydrogen bond element of the resin A in the exposed portion after the first heating step.

The value of $[[\delta D3-(\delta D1+\delta D2)/2]^2+[\delta P3-(\delta P1+\delta P2)/2]^2+[\delta H3-(\delta H1+\delta H2)/2]^2]^{0.5}$ is assumed to be a realistic value indicating the degree of difference in the dispersion element, the dipole-dipole element, and the hydrogen bond element between the acid generated in the resist film and the resin A in the exposed portion. It is considered that, as this value is larger, a difference in SP value (Hildebrand solubility parameter) between the acid generated in the resist film and the resin A in the exposed portion is large, and the acid is strongly attracted to the resin A in the exposed portion, so that the effects of the present invention are more excellent.

As described above, it is considered that, as the value of $[[δD3-(δD1+δD2)/2]^2+[δP3-(δP1+δP2)/2]^2+[δH3-(δH1+δH2)/2]^2]^{0.5}$ and the value of $[(δD2-δD1)^2+(δP2-δP1)^2+(δH2-δH1)^2]^{0.5}$ are large, it is more advantageous for improving the effects of the present invention, and it is considered that, in a case where the segregation index, which is the product of these values, is also a large value, it is advantageous for improving the effects of the present invention.

<Photoacid Generator>

The resist film may include a photoacid generator.

The photoacid generator is different from an acid diffusion control agent described later (onium salt which is relatively a weak acid with respect to the photoacid-generating component, a compound (PA), and/or the like).

The photoacid generator referred to here is preferably a low-molecular-weight compound. The fact that the photoacid generator is a low-molecular-weight compound is intended that a molecular weight of the photoacid generator is 3000 or less. In a case where the photoacid generator as a low-molecular-weight compound has a molecular weight distribution, it is intended that a weight-average molecular weight is 3000 or less.

The molecular weight (in a case of having a molecular weight distribution, the weight-average molecular weight) of the photoacid generator is preferably 3000 or less, more preferably 2000 or less, and still more preferably 1000 or less. The lower limit of the above-described molecular weight is, for example, 150 or more.

A content of the photoacid generator in the resist film is preferably 1% to 35% by mass, more preferably 3% to 30% by mass, and still more preferably 6% to 25% by mass with respect to the total mass of the resist film. In addition, the content of the photoacid generator in the resist film is preferably 0.001 to 5 mmol/g, more preferably 0.01 to 2 mmol/g, and still more preferably 0.05 to 0.5 mmol/g with respect to the total mass of the resist film.

The photoacid generators may be used alone or in combination of two or more kinds thereof.

The photoacid generator is not particularly limited, but a compound which generates an organic acid by irradiation with EUV light is preferable, and a photoacid generator having a fluorine atom or an iodine atom in the molecule is more preferable.

Examples of the above-described organic acid include sulfonic acids (an aliphatic sulfonic acid, an aromatic sulfonic acid, a camphor sulfonic acid, and the like), a carbonylsulfonylimide acid, a bis(alkylsulfonyl)imide acid, and a tris(alkylsulfonyl)methide acid.

A structure of the acid generated from the photoacid generator is not particularly limited, but from the viewpoint that the diffusion of the acid is suppressed and the resolution is improved, it is preferable that an interaction between the acid generated from the photoacid generator and the resin A is strong. From this viewpoint, in a case where the acid generated from the photoacid generator is an organic acid, it is also preferable that a polar group is further included, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of polar groups included in the generated acid is not particularly limited, and is preferably 1 or more and more preferably 2 or more. However, from the viewpoint of suppressing excessive development, the number of polar groups is preferably less than 6 and more preferably less than 4.

Examples of the photoacid generator include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

The photoacid generator may be a zwitterion.

From the viewpoint that the effects of the present invention are more excellent, the photoacid generator is preferably a photoacid generator having an anion and a cation.

In addition, the photoacid generator preferably has an acid-decomposable group. The aspect in which the photoacid generator has an acid-decomposable group may be an aspect in which the above-described anion and/or cation which can constitute the photoacid generator has the acid-decomposable group.

Examples of the acid-decomposable group included in the photoacid generator include the acid-decomposable group a and the acid-decomposable group b, and the acid-decomposable group a is preferable.

Since the photoacid generator is an ionic substance and is hydrophilic, the photoacid generator may not be compatible with the resin. On the other hand, in a case where the acid is generated from the photoacid generator, a hydrophilic structure is preferable in that the difference in SP value is large. Therefore, it is considered that, in a case where an acid-decomposable group or the like is introduced into the photoacid generator, the compatibility with the resin can be improved and the generated acid can be hydrophilic.

Among these, it is preferable to satisfy at least one (one or both) of the requirement that the resin A has the above-described specific repeating unit or the requirement that the resist film includes the photoacid generator which is a low-molecular-weight compound having the acid-decomposable group a.

In addition, it is also preferable to satisfy at least one (one or both) of the requirement that the resin A has the specific repeating unit, the specific repeating unit has an anionic moiety and a cationic moiety, and the anionic moiety has the acid-decomposable group a, or the requirement that the resist film includes the photoacid generator, the photoacid generator has an anion and a cation, and the anion has the acid-decomposable group a.

In the same way, it is also preferable to satisfy at least one (one or both) of the requirement that the resin A has the specific repeating unit, the specific repeating unit has an anionic moiety and a cationic moiety, and the cationic moiety has the acid-decomposable group a, or the requirement that the resist film includes the photoacid generator, the photoacid generator has an anion and a cation, and the cation has the acid-decomposable group a.

In the same way, it is also preferable to satisfy at least one (one or both) of the requirement that the resin A has the specific repeating unit, the specific repeating unit has an anionic moiety and a cationic moiety, and both the anionic moiety and the cationic moiety have the acid-decomposable group a, or the requirement that the resist film includes the photoacid generator, the photoacid generator has an anion and a cation, and both the anion and the cation have the acid-decomposable group a.

The photoacid generator is preferably a compound represented by General Formula (PA) and/or a compound represented by General Formula (PB).

$M^+Z^-$ (PA)

$M^+A^--L-B^-M^+$ (PB)

$M^+$ in General Formula (PA) and General Formula (PB) is a cation, and $Z^-$ in General Formula (PA) and $A^-$-L-$B^-$ in General Formula (PB) are anions.

Hereinafter, the anion and the cation will be described separately.
(Cation)

In General Formula (PA) and General Formula (PB), $M^+$ represents a cation.

In General Formula (PB), $M^+$'s may be the same or different from each other.

The cation of $M^+$ is preferably an organic cation.

The above-described organic cations are each independently preferably a cation (cation (ZaI)) represented by General Formula (ZaI) or a cation (cation (ZaII)) represented by General Formula (ZaII).

In General Formula (ZaI), $R^{201}$, $R^{202}$, and $R^{203}$ each independently represent an organic group.

The number of carbon atoms in the organic group of $R^{201}$, $R^{202}$, and $R^{203}$ is usually 1 to 30, and preferably 1 to 20. In addition, two of $R^{201}$ to $R^{203}$ may be bonded to each other to form a ring structure, and the ring structure may include an oxygen atom, a sulfur atom, an ester group, an amide group, or a carbonyl group in the ring. Examples of the group formed by the bonding of two of $R^{201}$ to $R^{203}$ include an alkylene group (for example, a butylene group and a pentylene group) and —$CH_2$—$CH_2$—O—$CH_2$—$CH_2$—.

Examples of the cation in General Formula (ZaI) include a cation (ZaI-1) described later.

The cation (ZaI-1) will be described.

The cation (ZaI-1) is an arylsulfonium cation in which at least one of $R^{201}$, $R^{202}$, or $R^{203}$ of General Formula (ZaI) is an aryl group.

In the arylsulfonium cation, all of $R^{201}$ to $R^{203}$ may be aryl groups, or some of $R^{201}$ to $R^{203}$ may be an aryl group and the remaining may be an alkyl group or a cycloalkyl group.

In addition, one of $R^{201}$ to $R^{203}$ may be an aryl group, the remaining two of $R^{201}$ to $R^{203}$ may be bonded to each other to form a ring structure, and an oxygen atom, a sulfur atom, an ester group, an amide group, or a carbonyl group may be included in the ring. Examples of the group formed by the bonding of two of $R^{201}$ to $R^{203}$ include an alkylene group (for example, a butylene group, a pentylene group, or —$CH_2$—$CH_2$—O—$CH_2$—$CH_2$—) in which one or more methylene groups may be substituted with an oxygen atom, a sulfur atom, an ester group, an amide group, and/or a carbonyl group.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

The aryl group included in the arylsulfonium cation is preferably a phenyl group or a naphthyl group, and more preferably a phenyl group. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same or different from each other.

The alkyl group or the cycloalkyl group included in the arylsulfonium cation as necessary is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The substituents which may be included in the aryl group, the alkyl group, and the cycloalkyl group of $R^{201}$ to $R^{203}$ are each independently preferably a group having an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a cycloalkylalkoxy group (for example, having 1 to 15 carbon atoms), a halogen atom, a hydroxyl group, a phenylthio group, or an acid-decomposable group (acid-decomposable group a, acid-decomposable group b, and the like).

The substituent may further have a substituent if possible, and may be in a form of an alkyl halide group such as a trifluoromethyl group, for example, in which an alkyl group has a halogen atom as a substituent.

The above-described group having an acid-decomposable group may be the acid-decomposable group itself, or may be a group composed of a "-divalent linking group-acid-decomposable group". In addition, the above-described group having an acid-decomposable group may be bonded to the same or different carbon atom in the above-described cyclic organic group to form a cyclic group. In this case, the above-described group having an acid-decomposable group is, for example, the group represented by General Formulae (II-5) to (II-9).

Next, General Formula (ZaII) will be described.

In General Formula (ZaII), $R^{204}$ and $R^{205}$ each independently represent an aryl group, an alkyl group, or a cycloalkyl group.

The aryl group of $R^{204}$ and $R^{205}$ is preferably a phenyl group or a naphthyl group, and more preferably a phenyl group. The aryl group of $R^{204}$ and $R^{205}$ may be an aryl group which has a heterocyclic ring having an oxygen atom, a nitrogen atom, a sulfur atom, or the like. Examples of a skeleton of the aryl group having a heterocyclic ring include pyrrole, furan, thiophene, indole, benzofuran, and benzothiophene.

The alkyl group and cycloalkyl group of $R^{204}$ and $R^{205}$ are preferably a linear alkyl group having 1 to 10 carbon atoms or a branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group).

The aryl group, the alkyl group, and the cycloalkyl group of $R^{204}$ and $R^{205}$ may each independently have a substituent. Examples of the substituent which may be included in each of the aryl group, the alkyl group, and the cycloalkyl group of $R^{204}$ and $R^{205}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

(Anion)

Anion in General Formula (PA)

In General Formula (PA) ($M^+ Z^-$), $Z^-$ represents an anion, and an anion having a significantly low ability to cause a nucleophilic reaction is preferable.

Examples of the above-described anion include a sulfonate anion (an aliphatic sulfonate anion such as a fluoroalkyl sulfonate anion, an aromatic sulfonate anion, a camphor sulfonate anion, and the like), a carboxylate anion (an aliphatic carboxylate anion, an aromatic carboxylate anion, an aralkyl carboxylate anion, and the like), a sulfonylimide anion, and a tris(alkylsulfonyl)methide anion.

An aliphatic moiety in the aliphatic sulfonate anion and the aliphatic carboxylate anion may be an alkyl group or a cycloalkyl group, and a linear or branched alkyl group having 1 to 30 carbon atoms or a cycloalkyl group having 3 to 30 carbon atoms is preferable.

An aromatic ring group in the aromatic sulfonate anion and the aromatic carboxylate anion is preferably an aryl group having 6 to 14 carbon atoms, and examples thereof include a phenyl group, a tolyl group, and a naphthyl group.

Examples of the substituent which can be included in the alkyl group, cycloalkyl group, and aryl group mentioned above include a nitro group, a halogen atom such as a fluorine atom, a carboxylic acid group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

An aralkyl group in the aralkyl carboxylate anion is preferably an aralkyl group having 7 to 12 carbon atoms, and examples thereof include a benzyl group, a phenethyl group, a naphthylmethyl group, a naphthylethyl group, and a naphthylbutyl group.

An alkyl group in the tris(alkylsulfonyl)methide anion is preferably an alkyl group having 1 to 5 carbon atoms. Examples of a substituent of these alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and a fluorine atom or an alkyl group substituted with a fluorine atom is preferable.

The sulfonylimide anion is preferably a bis(alkylsulfonyl)imide anion or a bis(cycloalkylsulfonyl)imide anion. In addition, two alkyl groups in the bis(alkylsulfonyl)imide anion may be bonded to each other to form an alkylene group. The number of carbon atoms in the above-described alkylene group is preferably 2 to 5. In addition, the above-described alkylene group may be a fluoroalkylene group.

Examples of other anions include fluorinated phosphorus (for example, $PP_6^-$), fluorinated boron (for example, $BF_4^-$), and fluorinated antimony (for example, $SbF_6^-$).

As the anion, an aliphatic sulfonate anion in which at least α-position of sulfonic acid is substituted with a fluorine atom, an aromatic sulfonate anion substituted with a fluorine atom or a group having a fluorine atom, or a tris(alkylsulfonyl)methide anion in which an alkyl group is substituted with a fluorine atom is preferable. Among these, a perfluoroaliphatic sulfonate anion (preferably having 4 to 8 carbon atoms) or benzenesulfonate anion having a fluorine atom is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of acid strength, it is preferable that the pKa of the generated acid is −1 or less to improve the sensitivity.

In addition, as the non-nucleophilic anion, an anion represented by General Formula (AN1) is also preferable.

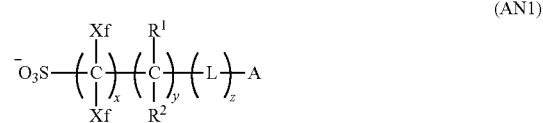

(AN1)

In the formula,

Xf's each independently represent a hydrogen atom, a fluorine atom, or an alkyl group substituted with at least one fluorine atom. However, at least one of two Xf's bonded to one carbon atom is other than the hydrogen atom.

$R^1$ and $R^2$ each independently represent a hydrogen atom, a fluorine atom, or an alkyl group. In a case where a plurality of $R^1$'s and $R^2$'s are present, $R^1$'s and $R^2$'s may each be the same or different from each other.

L represents a divalent linking group, and in a case where a plurality of L's are present, L's may be the same or different from each other.

A represents a cyclic organic group.

x represents an integer of 1 to 20, y represents an integer of 0 to 10, and z represents an integer of 0 to 10.

General Formula (AN1) will be described in more detail.

The number of carbon atoms in the alkyl group as the alkyl group substituted with a fluorine atom of Xf is preferably 1 to 10 and more preferably 1 to 4. In addition, the alkyl group substituted with a fluorine atom of Xf is preferably a perfluoroalkyl group.

Xf is preferably a fluorine atom or a perfluoroalkyl group having 1 to 4 carbon atoms. Examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom or $CF_3$ is preferable. In particular, it is preferable that both Xf's are fluorine atoms.

The alkyl group of $R^1$ and $R^2$ may have a substituent (preferably a fluorine atom), and the number of carbon atoms in the substituent is preferably 1 to 4. The substituent is preferably a perfluoroalkyl group having 1 to 4 carbon atoms. Examples of the alkyl group of $R^1$ and $R^2$, which has the substituent, include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

$R^1$ and $R^2$ are preferably a fluorine atom or $CF_3$.

x is preferably an integer of 1 to 10 and more preferably 1 to 5.

y is preferably an integer of 0 to 4 and more preferably 0.

z is preferably an integer of 0 to 5 and more preferably an integer of 0 to 3.

Examples of the divalent linking group of L include —COO—, —CO—, —O—, —S—, —SO—, —SO$_2$—, an alkylene group, a cycloalkylene group, an alkenylene group, a linking group consisting of a plurality of these groups linked to each other, and the like. The total number of carbon atoms in these linking groups is preferably 12 or less.

The cyclic organic group of A is not particularly limited as long as it has a cyclic structure, and examples thereof include an alicyclic group, an aromatic ring group, and a heterocyclic group (including not only an aromatic heterocyclic group but also a non-aromatic heterocyclic group).

The alicyclic group may be a monocycle or a polycycle, and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among these, from the viewpoint that diffusivity in the film in a post-exposure heating step can be suppressed and mask error enhancement factor (MEEF) is improved, an alicyclic group having a bulky structure and having 7 or more carbon atoms, such as a norbornyl group, a tricyclodecanyl group, a tetracyclodecanyl group, a tetracyclododecanyl group, and an adamantyl group is preferable.

Examples of the aromatic ring group include a benzene ring, a naphthalene ring, a phenanthrene ring, and an anthracene ring.

Examples of the heterocyclic group include groups derived from a decahydroisoquinoline ring, a furan ring, a thiophene ring, a benzofuran ring, a benzothiophene ring, a dibenzofuran ring, a dibenzothiophene ring, or a pyridine ring.

In addition, examples of the cyclic organic group also include a lactone structure, and specific examples thereof include the lactone structures represented by General Formulae (LC1-1) to (LC1-22) described above.

The above-described cyclic organic group may have a substituent. Examples of the above-described substituent include an alkyl group (may be linear or branched, or may include a cyclic structure; preferably having 1 to 12 carbon atoms), a cycloalkyl group (may be either a monocycle or a polycycle; in a case where the cycloalkyl group is a polycycle, the cycloalkyl group may be a spiro ring; preferably having 3 to 20 carbon atoms), an aryl group (preferably having 6 to 14 carbon atoms), a hydroxyl group, an alkoxy group, and an acid-decomposable group (acid-decomposable group a, acid-decomposable group b, and the like).

The above-described group having an acid-decomposable group may be the acid-decomposable group itself, or may be a group composed of a "-divalent linking group-acid-decomposable group". In addition, the above-described group having an acid-decomposable group may be bonded to the same or different carbon atom in the above-described cyclic organic group to form a cyclic group. In this case, the above-described group having an acid-decomposable group is, for example, the group represented by General Formulae (II-5) to (II-9).

The above-described substituent may have an ester group, an amide group, a urethane group, a ureido group, a thioether group, a sulfonamide group, a sulfonic acid ester group, and the like.

A carbon constituting the cyclic organic group (carbon contributing to ring formation) may be a carbonyl carbon.

Anion in General Formula (PB)

The anion in General Formula (PB) is represented by "A$^-$-L-B$^-$".

Since the compound represented by General Formula (PB) includes both of a structure having a function corresponding to a normal photoacid generator (a moiety corresponding to "M$^+$ A$^-$-") and a structure having a function corresponding to an acid diffusion control agent (a moiety corresponding to "—B$^-$ M$^+$") in one molecule, it is possible to keep a presence ratio of each of the structures constant in the resist film.

Therefore, the present inventors have presumed that, even in a case where the resist film is exposed, the amount and the diffusion of the acid generated in the resist film are likely to be uniform and the width of a pattern obtained after development is stabilized.

In General Formula (PB), L represents a divalent organic group.

Examples of the divalent organic group include —COO—, —CONH—, —CO—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), and a divalent linking group formed by a combination of a plurality of these groups.

One or more of methylene groups constituting a cycloalkane ring of the above-described cycloalkylene group may be substituted with a carbonyl carbon and/or a heteroatom (an oxygen atom and the like).

It is also preferable that these divalent linking groups further have a group selected from the group consisting of —O—, —S—, —SO—, and —SO$_2$—.

Among these, L is preferably a group represented by General Formula (L).

$$*A\text{-LA-LB-LC-LD-LE-}*B \qquad (L)$$

In General Formula (L), *A represents a bonding position to A$^-$ in General Formula (PB).

In General Formula (L), *B represents a bonding position to B$^-$ in General Formula (PB).

In General Formula (L), LA represents —(C(R$_{LA1}$)(R$_{LA2}$))$_{XA}$—.

XA represents an integer of 1 or more, and is preferably 1 to 10 and more preferably 1 to 3.

$R_{LA1}$ and $R_{LA2}$ each independently represent a hydrogen atom or a substituent.

The substituents of $R_{LA1}$ and $R_{LA2}$ are each independently preferably a fluorine atom or a fluoroalkyl group, more preferably a fluorine atom or a perfluoroalkyl group, and still more preferably a fluorine atom or a perfluoromethyl group.

In a case where XA is 2 or more, XA pieces of $R_{LA1}$'s may be the same or different from each other.

In a case where XA is 2 or more, XA pieces of $R_{LA2}$'s may be the same or different from each other.

—(C($R_{LA1}$)($R_{LA2}$))— is preferably —CH$_2$—, —CHF—, —CH(CF)—, or —CF$_2$—.

Among these, —(C($R_{LA1}$)($R_{LA2}$))— which is directly bonded to $A^-$ in General Formula (PB) is preferably —$CH_2$—, —CHF—, —CH($CF_3$)—, or —$CF_2$—.

—(C($R_{LA1}$)($R_{LA2}$))—'s other than —(C($R_{LA1}$)($R_{LA2}$))— which is directly bonded to $A^-$ in General Formula (PB) are each independently preferably —$CH_2$—, —CHF—, or —$CF_2$—.

In General Formula (L), LB represents a single bond, an ester group (—COO—), or a sulfonyl group (—$SO_2$—).

In General Formula (L), LC represents a single bond, an alkylene group, a cycloalkylene group, or a group formed by a combination thereof ("-alkylene group-cycloalkylene group-" and the like).

The above-described alkylene group may be linear or branched.

The number of carbon atoms in the above-described alkylene group is preferably 1 to 5, more preferably 1 or 2, and still more preferably 1.

The number of carbon atoms in the above-described cycloalkylene group is preferably 3 to 15 and more preferably 5 to 10.

The above-described cycloalkylene group may be a monocycle or a polycycle.

Examples of the above-described cycloalkylene group include a norbornanediyl group and an adamantanediyl group.

As a substituent which may be included in the above-described cycloalkylene group, an alkyl group (may be linear or branched; preferably having 1 to 5 carbon atoms) is preferable.

One or more of methylene groups constituting a cycloalkane ring of the above-described cycloalkylene group may be substituted with a carbonyl carbon and/or a heteroatom (an oxygen atom and the like).

In a case where LC is "-alkylene group-cycloalkylene group-", an alkylene group moiety is preferably present on an LB side.

In a case where the LB is a single bond, LC is preferably a single bond or a cycloalkylene group.

In General Formula (L), LD represents a single bond, an ether group (—O—), a carbonyl group (—CO—), or an ester group (—COO—).

In General Formula (L), LE represents a single bond or —(C($R_{LE1}$)($R_{LE2}$))$_{XE}$—.

XE in —(C($R_{LE1}$)($R_{LE2}$))$_{XE}$— represents an integer of 1 or more, and is preferably 1 to 10 and more preferably 1 to 3.

$R_{LE1}$ and $R_{LE2}$ each independently represent a hydrogen atom or a substituent.

In a case where XE is 2 or more, XE pieces of $R_{LE1}$'s may be the same or different from each other.

In a case where XE is 2 or more, XE pieces of $R_{LE2}$'s may be the same or different from each other.

Among these, —(C($R_{LE1}$)($R_{LE2}$))— is preferably —$CH_2$—.

In General Formula (L), in a case where LB, LC, and LD are single bonds, it is preferable that LE is also a single bond.

In General Formula (PB), $A^-$ represents an acid anion group.

The acid anion group is a group having an anion atom.

Specifically, $A^-$ is preferably a group represented by either of General Formula (A-1) or (A-2).

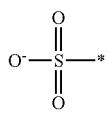

A-1

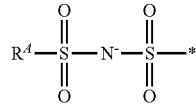

A-2

In General Formulae (A-1) and (A-2), * represents a bonding position.

In General Formula (A-2), $R^A$ represents an organic group.

$R^A$ is preferably an alkyl group.

The above-described alkyl group may be linear or branched.

The number of carbon atoms in the above-described alkyl group is preferably 1 to 10 and more preferably 1 to 5.

As a substituent which may be included in the above-described alkyl group, a fluorine atom is preferable.

The above-described alkyl group having a fluorine atom as a substituent may or may not be a perfluoroalkyl group.

In General Formula (PB), $B^-$ represents a group represented by any of General Formulae (B-1) to (B-4).

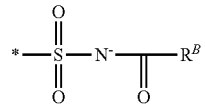

B-1

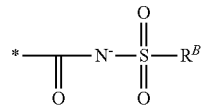

B-2

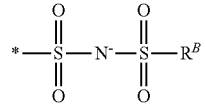

B-3

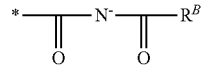

B-4

In General Formulae (B-1) to (B-4), * represents a bonding position.

In General Formulae (B-1) to (B-4), $R^B$ represents an organic group.

$R^B$ is preferably a cycloalkyl group, an alkyl group, or an aryl group.

In a case where $R^B$ is a cycloalkyl group, the number of carbon atoms in the cycloalkyl group is preferably 3 to 15 and more preferably 5 to 10.

The above-described cycloalkyl group may be a monocycle or a polycycle.

Examples of the above-described cycloalkyl group include a norbornyl group and an adamantyl group.

As a substituent which may be included in the above-described cycloalkyl group, an alkyl group (may be linear or branched; preferably having 1 to 5 carbon atoms) is preferable.

One or more of the carbon atoms which are ring member atoms of the above-described cycloalkyl group may be substituted with a carbonyl carbon atom.

In a case where $R^B$ is an alkyl group, the alkyl group may be linear or branched.

The number of carbon atoms in the above-described alkyl group is preferably 1 to 10 and more preferably 1 to 5.

As a substituent which may be included in the above-described alkyl group, a cycloalkyl group, a fluorine atom, or a cyano group is preferable.

Examples of the cycloalkyl group as the substituent include the same cycloalkyl groups described in a case where $R^B$ is the cycloalkyl group.

In a case where the above-described alkyl group has a fluorine atom as the substituent, the above-described alkyl group may or may not be a perfluoroalkyl group. In a case where the above-described alkyl group has a fluorine atom as the substituent, it is also preferable that a part or all of the above-described alkyl groups are perfluoromethyl groups.

The above-described aryl group may be monocyclic or polycyclic. The number of carbon atoms in the above-described aryl group is preferably 6 to 15. A fluorine atom or a fluoroalkyl group is preferable as the substituent which can be included in the above-described aryl group.

In a compound represented by HA-L-BH in which M+ of the compound represented by General Formula (PB) is substituted with a hydrogen atom, a pKa of a group represented by HA is lower than a pKa of a group represented by BH.

More specifically, in a case where an acid dissociation constant is determined for the compound represented by HA-L-BH, the pKa in a case where "HA-L-BH" serves as "A−-L-BH" is defined as the "pKa of a group represented by HA", and the pKa in a case where "A−-L-BH" serves as "A−-L-B−" is defined as the "pKa of a group represented by BH".

The "pKa of a group represented by HA" and the "pKa of a group represented by BH" are each determined using "Software Package 1" or "Gaussian 16".

Among these, the pKa of the group represented by HA is preferably −12.00 to 1.00, more preferably −7.00 to 0.50, and still more preferably −5.00 to 0.00.

The pKa of the group represented by HB is preferably −4.00 to 14.00, more preferably −2.00 to 12.00, and still more preferably −1.00 to 5.00.

A difference between the pKa of the group represented by HB and the pKa of the group represented by HA ("pKa of group represented by HB"-"pKa of group represented by HA") is preferably 0.10 to 20.00, more preferably 0.50 to 17.00, and still more preferably 2.00 to 15.00.

<Acid Diffusion Control Agent>

The resist film may further include an acid diffusion control agent. The acid diffusion control agent acts as a quencher which traps an acid generated from the photoacid generator and functions to control the phenomenon of acid diffusion in the resist film.

The acid diffusion control agent is not included in the photoacid generator, and even in a case where an acid can be generated from the acid diffusion control agent, the acid generated from the acid diffusion control agent (for example, acid which can be generated from a compound represented by General Formulae (d1-1) and (d1-3) described later) is not included in the above-described acid generated from the photoacid generator.

(Basic Compound)

The acid diffusion control agent may be, for example, a basic compound.

The basic compound is preferably a compound having a structure represented by General Formula (A) to General Formula (E).

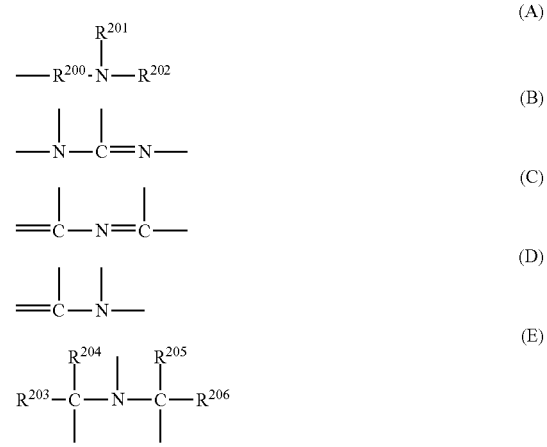

In General Formula (A) and General Formula (E), $R^{200}$, $R^{201}$, and $R^{202}$ may be the same or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms), in which $R^{201}$ and $R^{202}$ may be bonded to each other to form a ring.

With regard to the above-described alkyl group, an alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be the same or different from each other, and each represent an alkyl group having 1 to 20 carbon atoms.

It is more preferable that the alkyl groups in General Formula (A) and General Formula (E) are unsubstituted.

(Onium Salt which is Relatively Weak Acid with Respect to Photoacid-Generating Component)

An onium salt which is relatively a weak acid with respect to the photoacid-generating component can be used as the acid diffusion control agent.

In a case of being used in a form of coexistence of the photoacid-generating component and the onium salt that generates an acid which is relatively weak with respect to the acid generated from the photoacid-generating component, the acid generated from the photoacid-generating component due to the irradiation with actinic rays or radiation collides with an onium salt having an unreacted weak-acid anion, so that salt exchange releases the weak acid to yield an onium salt with a strong-acid anion. In this process, since the strong acid is exchanged for the weak acid having a lower catalytic activity, the acid is apparently inactivated and the acid diffusion can be controlled.

It is also preferable that the anion and/or cation of the above-described onium salt has an acid-decomposable group (acid-decomposable group a, acid-decomposable group b, and the like).

The onium salt which is relatively a weak acid with respect to the photoacid-generating component is different from the photoacid-generating component.

As the onium salt which is relatively a weak acid with respect to the photoacid-generating component, a compound represented by General Formula (d1-1) or a compound represented by General Formula (d1-3) is preferable.

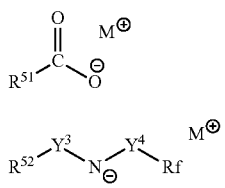

(d1-1)

(d1-3)

In the formulae, $R^{51}$ is an organic group. The number of carbon atoms is preferably 1 to 30.

$R^{52}$ is an organic group (an alkyl group and the like), $Y^3$ is —$SO_2$—, a linear, branched, or cyclic alkylene group, or an arylene group, $Y^4$ is —CO— or —$SO_2$—, and Rf is a hydrocarbon group having a fluorine atom (a fluoroalkyl group and the like).

The organic group of $R^{51}$ and $R^{52}$ may have an acid-decomposable group (acid-decomposable group a, acid-decomposable group b, and the like).

$M^+$'s are each independently an ammonium cation, a sulfonium cation, or an iodonium cation. These cations may have an acid-decomposable group (acid-decomposable group a, acid-decomposable group b, and the like). As $M^+$ in General Formulae (d1-1) and (d1-3), the cations mentioned in the description of the photoacid generator may be used.
(Compound (PA) that has Proton-Accepting Functional Group and Generates Compound which is Decomposed by Irradiation with Actinic Ray or Radiation to Exhibit Deterioration in Proton-Accepting Properties, No Proton-Accepting Properties, or Change from Proton-Accepting Properties to Acidic Properties)

The resist composition may include, as an acid diffusion control agent, a compound (hereinafter, also referred to as a "compound (PA)") that has a proton-accepting functional group and generates a compound which is decomposed by an irradiation with actinic ray or radiation to exhibit deterioration in proton-accepting properties, no proton-accepting properties, or a change from the proton-accepting properties to acidic properties. The compound (PA) is preferably different from the photoacid generator.

The proton-accepting functional group refers to a functional group having a group or electron capable of electrostatically interacting with a proton, and for example, means a functional group with a macrocyclic structure, such as a cyclic polyether, or a functional group having a nitrogen atom having an unshared electron pair not contributing to π-conjugation. For example, the nitrogen atom having the unshared electron pair, which does not contribute to the π-conjugation, is a nitrogen atom having a partial structure represented by the following general formula.

unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (PA) is decomposed by irradiation with actinic ray or radiation to generate a compound exhibiting deterioration in proton-accepting properties, no proton-accepting properties, or a change from the proton-accepting properties to acidic properties. Here, an expression of generating a compound which exhibits deterioration in proton-accepting properties, no proton-accepting properties, or a change from the proton-accepting properties to acidic properties is a change of proton-accepting properties due to the proton being added to the proton-accepting functional group. Specifically, the expression means a decrease in an equilibrium constant at chemical equilibrium in a case where a proton adduct is generated from the compound (PA) having the proton-accepting functional group and the proton.

The compound (PA) may have an acid-decomposable group (acid-decomposable group a, acid-decomposable group b, and the like). In a case where the compound (PA) consists of an anion and a cation, the anion and/or the cation may have an acid-decomposable group (acid-decomposable group a, acid-decomposable group b, and the like).

With regard to the compound (PA), reference can be made to those described in paragraphs [0421] to [0428] of JP2014-41328A or paragraphs [0108] to [0116] of JP2014-134686A, the contents of which are incorporated herein by reference.

A low-molecular-weight compound having a nitrogen atom and a group which is eliminated by the action of acid can also be used as the acid diffusion control agent. The above-described low-molecular-weight compound is preferably an amine derivative having, on the nitrogen atom, a group which is eliminated by the action of acid.

The group which is eliminated by the action of acid is preferably an acetal group, a carbonate group, a carbamate group, a tertiary ester group, a tertiary hydroxyl group, or a hemiaminal ether group, and more preferably a carbamate group or a hemiaminal ether group.

A molecular weight of the low-molecular-weight compound is preferably 100 to 1000, more preferably 100 to 700, and still more preferably 100 to 500.

The low-molecular-weight compound may have a carbamate group having a protective group on the nitrogen atom.

Examples of the acid diffusion control agent include compounds (amine compounds, amide group-containing compounds, urea compounds, nitrogen-containing heterocyclic compounds, and the like) described in paragraphs [0140] to [0144] of JP2013-11833A.

As the acid diffusion control agent, for example, the contents described in paragraphs [0123] to [0159] of JP2018-155788A can also be incorporated.

In a case where the resist film includes an acid diffusion control agent, a content of the acid diffusion control agent is preferably 0.001% to 25% by mass, more preferably 0.01% to 20% by mass, and still more preferably 5% to 20% by mass with respect to the total mass of the resist film. In addition, the content of the acid diffusion control agent is preferably 0.001 to 5 mmol/g, more preferably 0.01 to 2 mmol/g, and still more preferably 0.05 to 0.5 mmol/g with respect to the total mass of the resist film.

In addition, in a case where the compound represented by General Formula (PB) is included as the photoacid generator, the total content of the compound represented by General Formula (PB) and the acid diffusion control agent is preferably 0.001% to 25% by mass, more preferably 0.01% to 20% by mass, and still more preferably 5% to 18% by mass with respect to the total mass of the resist film. In addition, the above-described total content is preferably 0.001 to 5 mmol/g, more preferably 0.01 to 2 mmol/g, and still more preferably 0.05 to 0.5 mmol/g with respect to the total mass of the resist film.

The acid diffusion control agent may be used alone or in combination of two or more kinds thereof.

<Other Additives>

The resist film may further include a surfactant, a dissolution inhibiting compound, a dye, a plasticizer, a photosensitizer, a light absorbing agent, and/or a compound promoting a solubility in a developer (for example, a phenol compound having a molecular weight of 1000 or less or an alicyclic or aliphatic compound including a carboxylic acid group), or the like.

[Resist Composition (Actinic Ray-Sensitive or Radiation-Sensitive Composition)]

The above-described resist film is preferably formed of a resist composition.

Examples of the above-described resist composition include a resist composition including each component described as a component which can be included in the above-described resist film. The preferred content of each component with respect to the total solid content of the resist composition is consistent with the preferred content of each component with respect to the total mass of the resist film.

<Solvent>

The resist composition preferably includes a solvent as a component other than the solid content.

The solvent preferably includes at least one of (M1) propylene glycol monoalkyl ether carboxylate (propylene glycol monomethyl ether acetate (PGMEA) and the like) or (M2) at least one selected from the group consisting of propylene glycol monoalkyl ether (propylene glycol monomethyl ether (PGME), propylene glycol monoethyl ether (PGEE), and the like), lactate ester (ethyl lactate and the like), acetate ester, alkoxypropionic acid ester, chain ketone, cyclic ketone (2-heptanone, cyclohexanone, cyclopentanone, and the like), lactone (γ-butyrolactone and the like), and alkylene carbonate (propylene carbonate and the like). The solvent may further include a component other than the components (M1) and (M2).

It is preferable that the solvent includes the component (M1). The solvent is more preferably composed of substantially only the component (M1) or is a mixed solvent of the component (M1) and other components. In the latter case, it is still more preferable that the solvent includes both the component (M1) and the component (M2).

A mass ratio (M1/M2) of the component (M1) to the component (M2) is preferably "100/0" to "0/100", more preferably "100/0" to "15/85", still more preferably "100/0" to "40/60", and particularly preferably "100/0" to "60/40".

As described above, the solvent may further include a component other than the components (M1) and (M2). In this case, a content of the component other than the components (M1) and (M2) is preferably 5% to 30% by mass with respect to the total amount of the solvent.

A content of the solvent in the resist composition is preferably set such that the concentration of solid contents is 0.5% to 30% by mass, and more preferably set such that the concentration of solid contents is 1% to 20% by mass. That is, the content of the solvent is preferably 70% to 99.5% by mass and more preferably 80% to 99% by mass with respect to the total mass of the resist composition. With this content, the coating property of the resist composition can be further improved.

The solid content means all components excluding the solvent.

<Metal Atom>

In the resist composition used in the pattern forming method according to the embodiment of the present invention, it is preferable that a content of the metal atom is within a predetermined amount.

Specifically, it is preferable that contents of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo are each independently 1.0 ppt by mass or more and less than 1.0 ppm by mass with respect to the total mass of the resist composition.

The type and content of the above-described metal atom in the resist composition can be measured by an inductively coupled plasma mass spectrometry (ICP-MS method).

Examples of a device for the ICP-MS method include Agilent 8800 triple quadrupole inductively coupled plasma mass spectrometry (ICP-MS, for semiconductor analysis, option #200) manufactured by Agilent Technologies, Inc.

Since this process includes a plurality of heating steps, it is easily affected by ionic substances. In a case where the metal concentration in the resist is extremely low, ionic substances in the atmosphere may adhere to the film and the performance may be unstable. In addition, in a case where the metal is included in a high concentration, it may cause defects during etching. In a case where the metal is included in a high concentration, the metal atom may hinder movement of the acid and the performance may be unstable. Therefore, the metal content in the resist is preferably in predetermined range.

As a method of introducing such a metal atom into the resist composition with the above-described content, by using a raw material including an appropriate amount of each of the above-described metal atom, a predetermined amount of each metal atom may be introduced into the prepared resist composition. In addition, after obtaining a resist composition having a sufficiently low metal atom content, a predetermined amount of metal atom may be introduced therein to adjust the metal atom content.

<Method for Producing Resist Composition>

Hereinafter, a specific example of a method for preparing the resist composition will be shown.

The content of the metal atom in the resist composition tends to exceed the upper limit of the above-described suitable range. Therefore, in a case of preparing the resist composition, it is preferable to perform a method for reducing the content of the metal atom.

Hereinafter, a specific example of the method for reducing the content of the metal atom in the resist composition will be described first, and then a specific example of the method for preparing the resist composition will be described.

Examples of the method for reducing the content of the metal atom in the resist composition include a method for adjusting the content by filtration using a filter. As for a filter pore diameter, the pore size is preferably less than 100 nm, more preferably 10 nm or less, and still more preferably 5 nm or less. As a filter, a polytetrafluoroethylene-made filter, a polyethylene-made filter, or a nylon-made filter is preferable. The filter may be composed of a composite material in which the above-described filter material is combined with an ion exchange medium. As the filter, a filter which has been previously washed with an organic solvent may be used. In the step of filter filtration, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step.

In addition, examples of the method for reducing the content of the metal atom in the resist composition include a method of selecting raw materials having a low content of metals as raw materials constituting the various materials in the resist composition, a method of subjecting raw materials constituting the various materials in the resist composition to filter filtration, and a method of performing distillation under the condition for suppressing the contamination as much as possible by, for example, lining the inside of a device with TEFLON (registered trademark).

In addition, as the method for reducing the content of the metal atom in the resist composition, removal with an adsorbing material may be performed, in addition to the above-mentioned filter filtration, and the filter filtration and the adsorbing material may be used in combination. As the adsorbing material, known adsorbing materials can be used, and for example, inorganic adsorbing materials such as silica gel and zeolite and organic adsorbing materials such as activated carbon can be used.

In addition, it is necessary to prevent the incorporation of metal impurities in the production process in order to reduce the content of the metal atom in the resist composition. Sufficient removal of the metal impurities from a production device can be confirmed by measuring the content of metal components included in a washing solution used to wash the production device.

Next, a specific example of the method for preparing the resist composition will be described.

In the production of the resist composition, for example, it is preferable to dissolve the various components as the components of the resist film, such as the above-described resin A and the photoacid generator, in the solvent, and then perform a filtration (may be a circulatory filtration) using a plurality of filters having different materials. For example, it is preferable to connect a polyethylene-made filter having a pore diameter of 50 nm, a nylon-made filter having a pore diameter of 10 nm, and a polyethylene-made filter having a pore diameter of 3 to 5 nm in permuted connection, and then perform the filtration. As for the filtration, a method of performing the circulatory filtration twice or more is also preferable. The above-described filtration step also has an effect of reducing the content of the metal atom in the resist composition. A smaller pressure difference between the filters is more preferable, and the pressure difference is generally 0.1 MPa or less, preferably 0.05 MPa or less and more preferably 0.01 MPa or less. A smaller pressure difference between the filter and the charging nozzle is also preferable, and the pressure difference is generally 0.5 MPa or less, preferably 0.2 MPa or less and more preferably 0.1 MPa or less.

In addition, as a method for performing the circulatory filtration using a filter in the production of the resist composition, for example, a method of performing the circulatory filtration twice or more using a polytetrafluoroethylene-made filter having a pore diameter of 50 nm is also preferable.

It is preferable to subject the inside of a device for producing the resist composition to gas replacement with an inert gas such as nitrogen. Thus, it is possible to suppress active gas such as oxygen from being dissolved in the composition.

After being filtered by a filter, the resist composition is charged into a clean container. It is preferable that the composition charged in the container is stored in a refrigerator. As a result, performance deterioration over time is suppressed. A shorter time from the completion of charging the resist composition into the container to the start of the storage in a refrigerator is more preferable, and the time is generally 24 hours or shorter, preferably 16 hours or shorter, more preferably 12 hours or shorter, and still more preferably 10 hours or shorter. A storage temperature is preferably 0° C. to 15° C., more preferably 0° C. to 10° C., and still more preferably 0° C. to 5° C.

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

In addition, all of the series of procedures in Examples were carried out in a clean room atmosphere where the concentration of $NH_3$ was 1.0 ppq by volume or more and less than 1.0 ppm by volume, unless otherwise specified.

[Production of Composition]

<Resin>

Using each monomer shown in latter part, a resin having a content of a repeating unit derived from each monomer as shown in the table below was produced.

In the table below, the column of "Amount (wt)" indicates a mass ratio (% by mass) of the content of the repeating unit derived from each monomer in the resin.

The column of "Amount (vol)" indicates a volume ratio (% by volume) of the content of the repeating unit derived from each monomer in the resin.

The column of "pKa" indicates a pKa of a polar group generated by reaction of an acid-decomposable group of a repeating unit derived from a monomer 1 with an acid.

Repeating units derived from monomers M-001 to M-023 and M-025 correspond to the acid-decomposable group a-containing repeating unit. Monomer M-024 corresponds to the acid-decomposable group b-containing repeating unit.

In addition, repeating units derived from monomers M-019 to M-022 have both the acid-decomposable group a and the acid-decomposable group b, but the column of "pKa" for the repeating units derived from monomer M-019 to M-022 indicates a pKa of a polar group generated by reaction of only the acid-decomposable group a with an acid.

Repeating units derived from monomers M-101 to M-111 correspond to the acid-decomposable group b-containing repeating unit, and the pKa of a polar group generated by reaction of the acid-decomposable group b of these repeating units with an acid was all 4.8.

In the table, polymer35 is a mixture of polymer31 and polymer32, and the polymer35 as a whole includes repeating units derived from each monomer in a content as shown in the table.

TABLE 1

|  | Monomer 1 | | | | Monomer 2 | | | Monomer 3 | | | | |
| --- | --- | --- | --- | --- | --- | --- | --- | --- | --- | --- | --- | --- |
|  | Type | Amount (wt) | Amount (vol) | pKa | Type | Amount (wt) | Amount (vol) | Type | Amount (wt) | Amount (vol) | Mw | Mw/Mn |
| Polymer1 | M-022 | 5 | 4 | 14.7 | M-101 | 45 | 49 | M-305 | 50 | 47 | 5,000 | 1.4 |
| Polymer2 | M-002 | 5 | 6 | 13.1 | M-103 | 35 | 38 | M-310 | 60 | 55 | 6,000 | 1.5 |
| Polymer3 | M-018 | 35 | 36 | 13.2 | M-109 | 30 | 32 | M-314 | 35 | 32 | 5,500 | 1.8 |
| Polymer4 | M-001 | 10 | 10 | 13.1 | M-101 | 40 | 50 | M-326 | 50 | 40 | 6,500 | 1.7 |
| Polymer5 | M-012 | 10 | 11 | 10.3 | M-106 | 40 | 40 | M-320 | 50 | 48 | 5,000 | 1.1 |
| Polymer6 | M-001 | 30 | 29 | 13.1 | M-101 | 30 | 35 | M-321 | 40 | 37 | 12,000 | 1.3 |
| Polymer7 | M-024 | 10 | 10 | 5.8 | M-101 | 30 | 36 | M-301 | 60 | 55 | 6,000 | 1.5 |
| Polymer8 | M-007 | 35 | 39 | 14.5 | M-102 | 25 | 24 | M-325 | 40 | 38 | 3,500 | 1.4 |
| Polymer9 | M-001 | 15 | 17 | 13.1 | M-107 | 45 | 44 | M-318 | 40 | 39 | 4,000 | 1.5 |
| Polymer10 | M-025 | 35 | 34 | 6.8 | M-101 | 30 | 37 | M-311 | 35 | 29 | 4,500 | 1.6 |
| Polymer11 | M-023 | 20 | 15 | 13.8 | M-101 | 30 | 38 | M-313 | 50 | 47 | 5,000 | 1.5 |
| Polymer12 | M-003 | 30 | 24 | 9.7 | M-101 | 40 | 46 | M-308 | 30 | 30 | 6,000 | 1.3 |
| Polymer13 | M-010 | 10 | 9 | 14.9 | M-101 | 40 | 44 | M-303 | 50 | 46 | 8,000 | 1.2 |
| Polymer14 | M-016 | 15 | 14 | 9.3 | M-101 | 45 | 51 | M-301 | 40 | 35 | 9,000 | 1.9 |
| Polymer15 | M-001 | 20 | 20 | 13.1 | M-101 | 30 | 35 | M-323 | 50 | 45 | 10,000 | 1.6 |
| Polymer16 | M-013 | 30 | 31 | 9.9 | M-101 | 30 | 38 | M-322 | 40 | 31 | 5,000 | 1.7 |
| Polymer17 | M-017 | 5 | 5 | 13.7 | M-101 | 45 | 55 | M-317 | 50 | 40 | 4,500 | 1.6 |
| Polymer18 | M 019 | 35 | 36 | 14.4 | M-101 | 30 | 36 | M-319 | 35 | 28 | 6,000 | 1.4 |
| Polymer19 | M-004 | 10 | 9 | 9.3 | M-101 | 25 | 30 | M-306 | 65 | 61 | 8,000 | 1.3 |
| Polymer20 | M-015 | 30 | 29 | 9.4 | M-108 | 30 | 33 | M-324 | 40 | 39 | 7,500 | 1.2 |
| Polymer21 | M-011 | 20 | 19 | 9.4 | M-110 | 40 | 38 | M-301 | 40 | 43 | 10,500 | 1.4 |
| Polymer22 | M-014 | 25 | 25 | 14.6 | M-101 | 40 | 46 | M-315 | 35 | 29 | 11,000 | 1.5 |
| Polymer23 | M-001 | 25 | 27 | 13.1 | M-104 | 35 | 34 | M-312 | 40 | 39 | 4,000 | 1.9 |
| Polymer24 | M-005 | 30 | 27 | 13.7 | M-101 | 45 | 52 | M-301 | 25 | 22 | 6,000 | 1.6 |
| Polymer25 | M-009 | 15 | 12 | 11.8 | M-101 | 35 | 42 | M-304 | 50 | 46 | 7,000 | 1.6 |
| Polymer26 | M-008 | 15 | 15 | 14.4 | M-101 | 35 | 46 | M-309 | 50 | 40 | 4,500 | 1.4 |
| Polymer27 | M-021 | 30 | 33 | 10.2 | M-105 | 30 | 29 | M-302 | 40 | 39 | 6,000 | 1.3 |
| Polymer28 | M-001 | 20 | 19 | 13.1 | M-101 | 45 | 51 | M-307 | 35 | 31 | 6,500 | 1.2 |
| Polymer29 | M-020 | 30 | 31 | 13.4 | M-101 | 30 | 38 | M-316 | 40 | 31 | 7,000 | 1.5 |
| Polymer30 | M-006 | 35 | 34 | 24.2 | M-111 | 25 | 25 | M-301 | 40 | 41 | 8,000 | 1.6 |
| Polymer31 | — | 0 | 0 | 0.0 | M-101 | 60 | 66 | M-301 | 40 | 34 | 7,000 | 1.6 |
| Polymer32 | M-001 | 60 | 62 | 13.1 | — | 0 | 0 | M-301 | 40 | 38 | 5,500 | 1.7 |
| Polymer33 | M-201 | 30 | 31 | 4.9 | M-101 | 30 | 34 | M-301 | 40 | 35 | 8,000 | 1.3 |
| Polymer34 | M-007 | 30 | 30 | 14.5 | M-017 | 30 | 31 | M-301 | 40 | 39 | 4,500 | 1.8 |
| Polymer35 | M-001 | 20 | 19 | 13.1 | M-101 | 40 | 46 | M-301 | 40 | 35 | 7000/5500 | 1.6/1.7 |
| Polymer36 | M-010 | 10 | 11 | 14.9 | M-024 | 50 | 50 | M-301 | 40 | 39 | 8,000 | 1.6 |

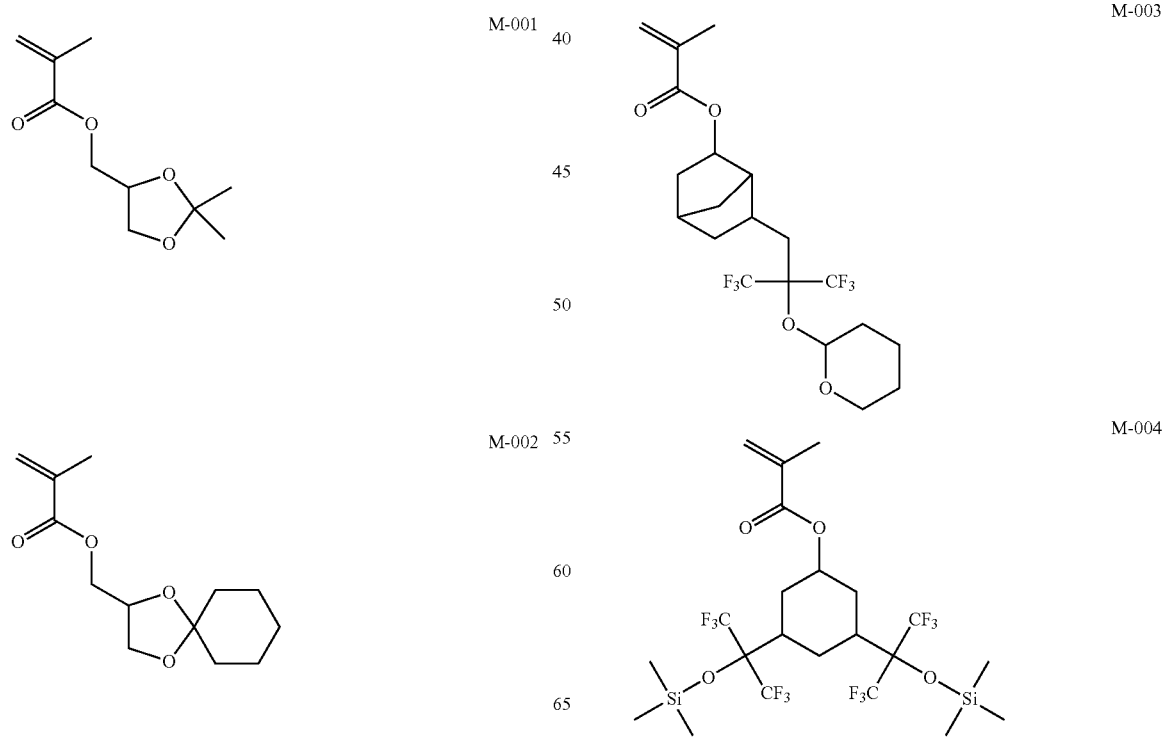

M-005
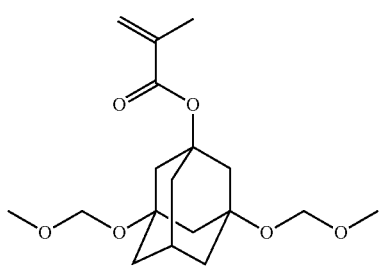
M-006
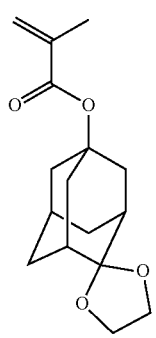
M-007
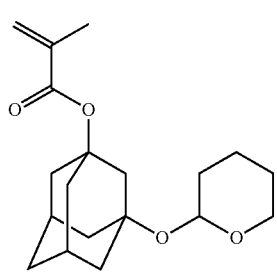
M-008
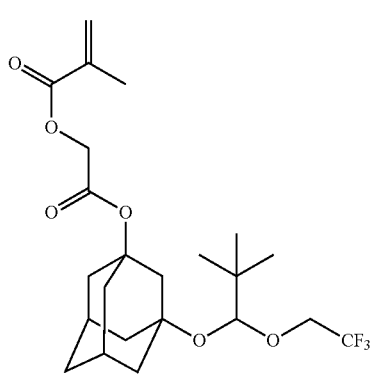
M-009
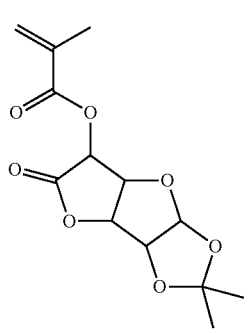
M-010
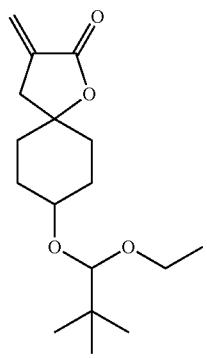
M-011
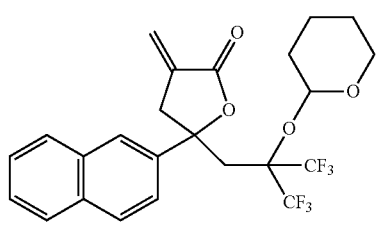
M-012
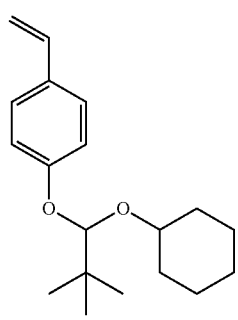
M-013
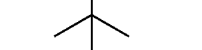
M-014
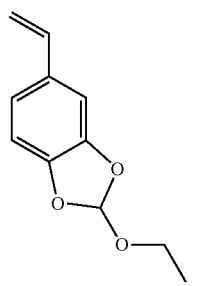

M-015 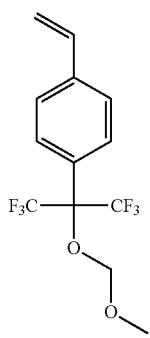
M-016 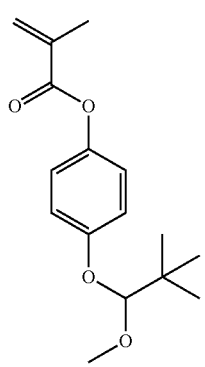
M-017 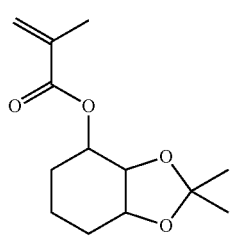
M-018 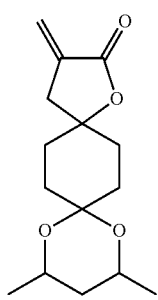
M-019 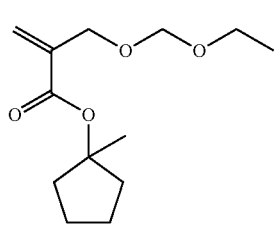
M-020 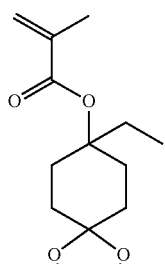
M-021 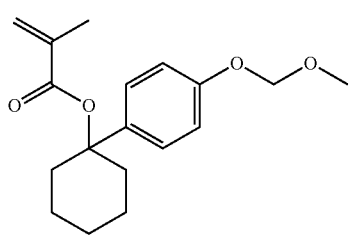
M-022 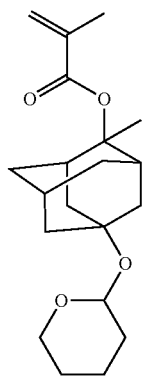
M-023 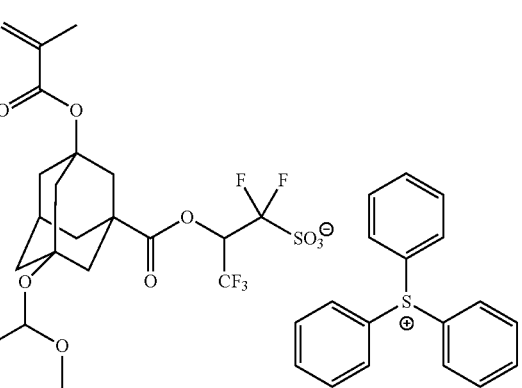
M-024 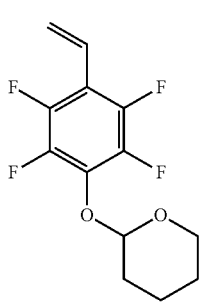

M-025
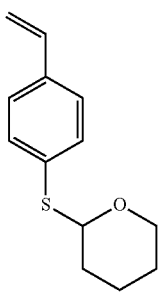
M-201
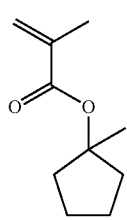
M-101
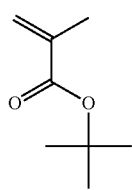
M-102
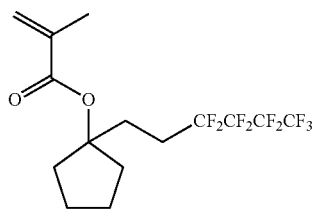
M-103
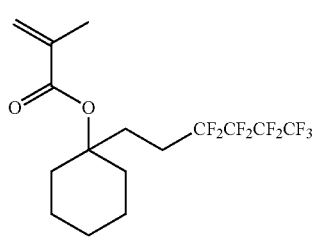
M-104
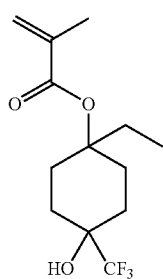
M-105
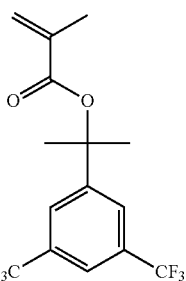
M-106
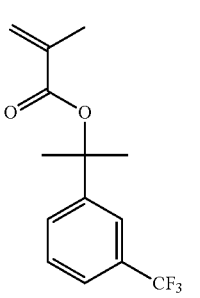
M-107
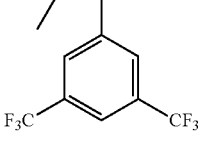
M-108
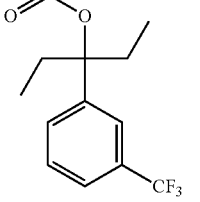
M-109
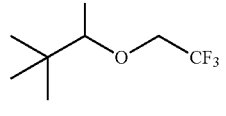
M-110
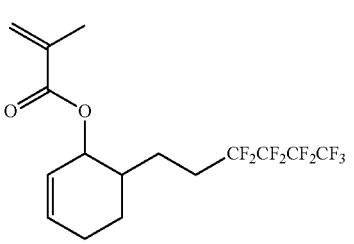

-continued
M-111
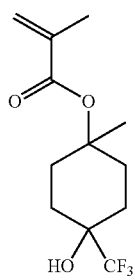
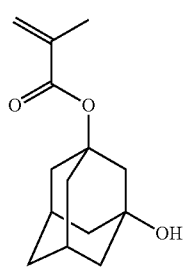
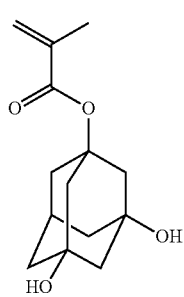
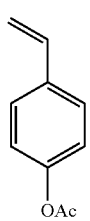
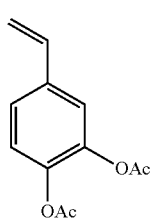
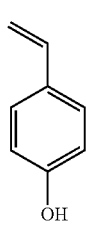
-continued
M-301
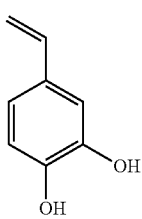
M-302
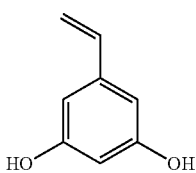
M-303
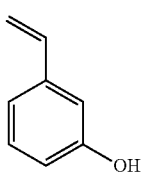
M-304
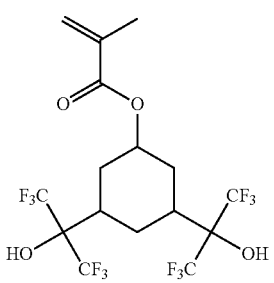
M-305
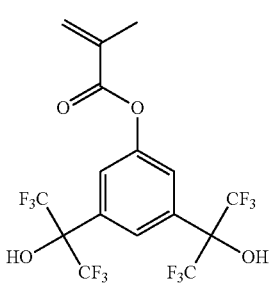
M-306
M-307
M-308
M-309
M-310
M-311
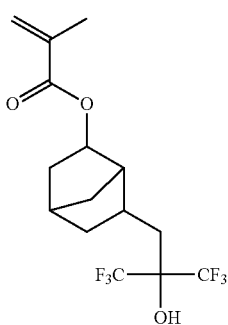

M-312
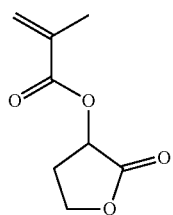
M-313
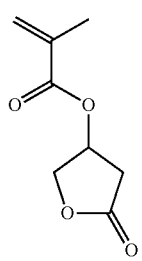
M-314
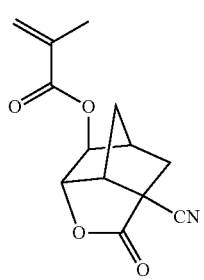
M-315
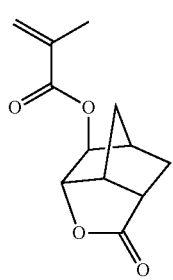
M-316
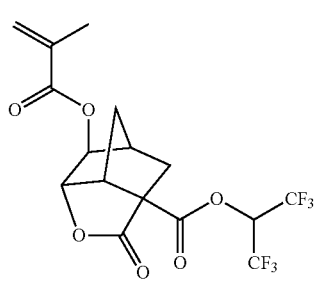
M-317
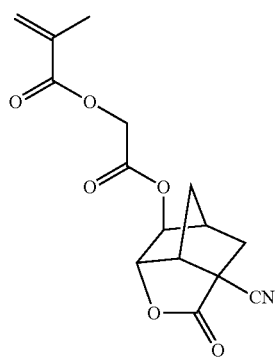
M-318
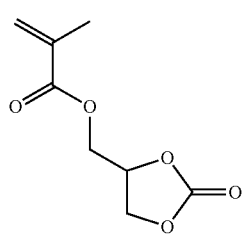
M-319
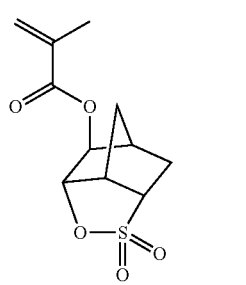
M-320
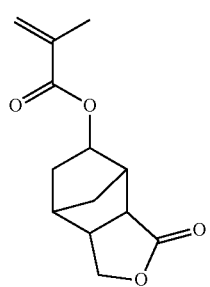
M-321
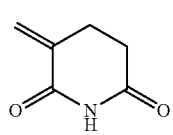
M-322
M-323

-continued
M-324
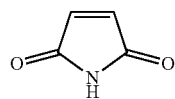
M-325
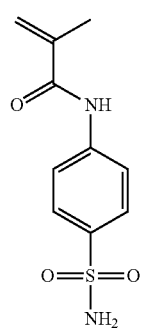
M-326
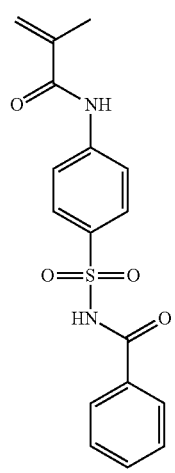
<Photoacid Generator>
Photoacid generators used in Examples are shown below.
PAG-001
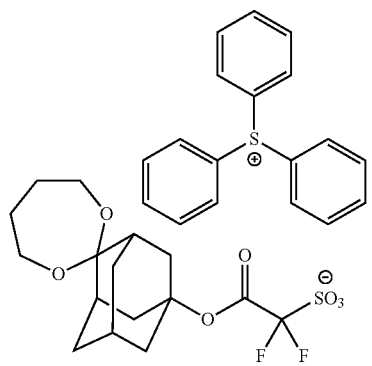
PAG-002
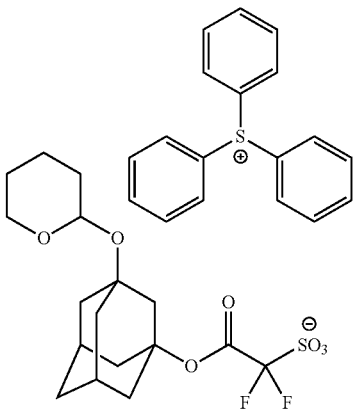
PAG-003
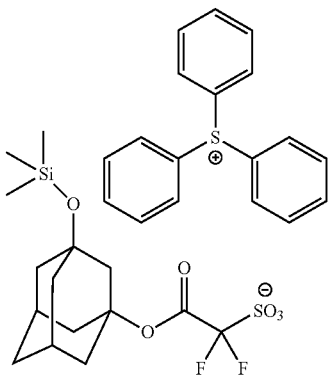
PAG-101
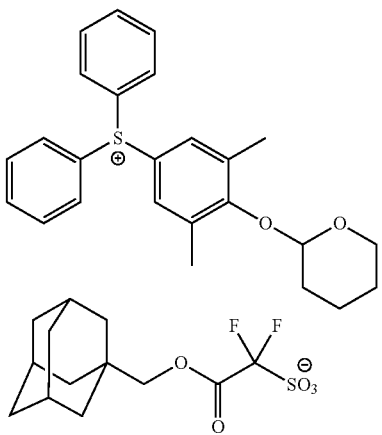

PAG-102
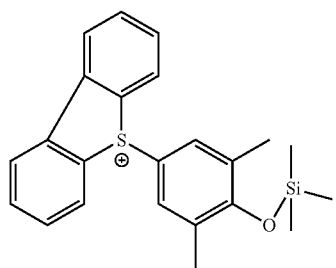
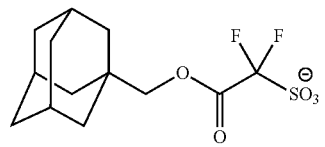
PAG-103
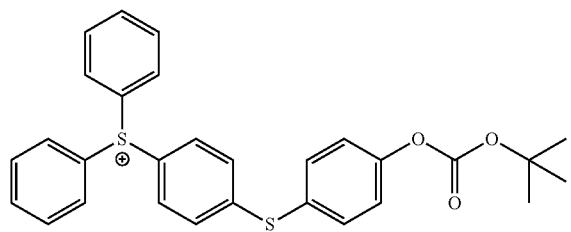
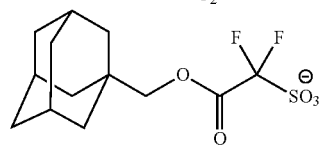
PAG-201
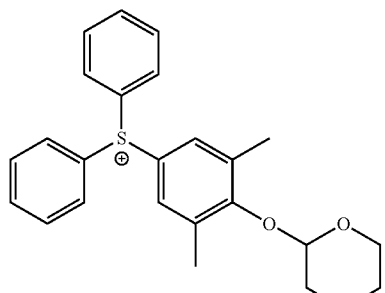
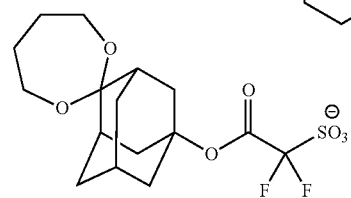
PAG-202
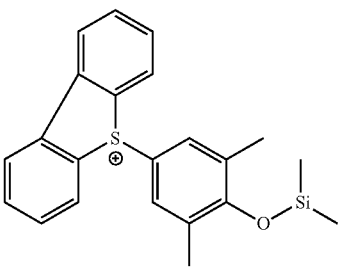
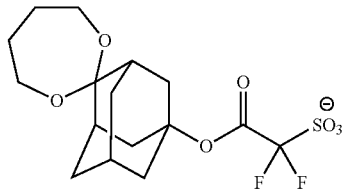
PAG-203
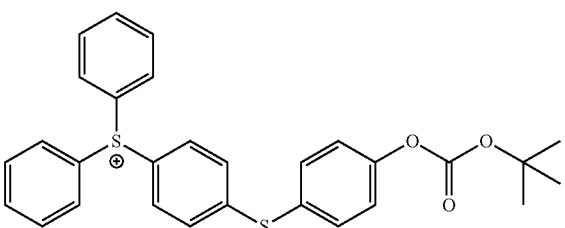
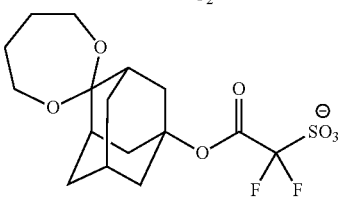
PAG-301
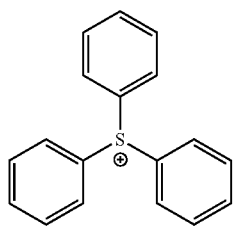
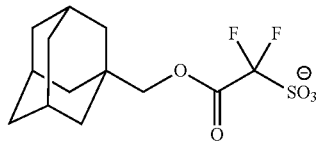

PAG-302
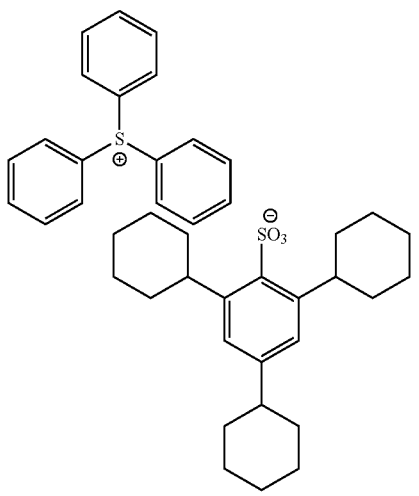
PAG-303
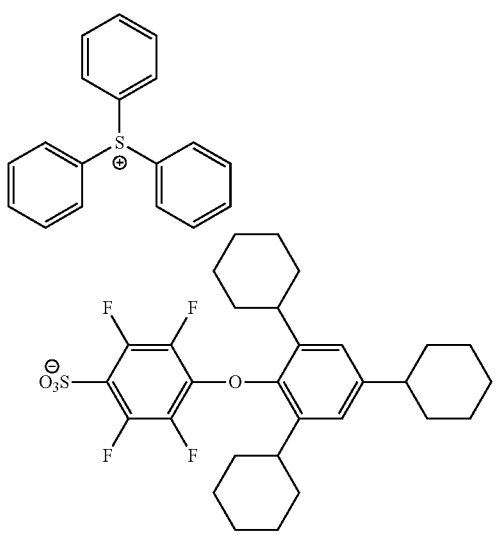
PAG-304
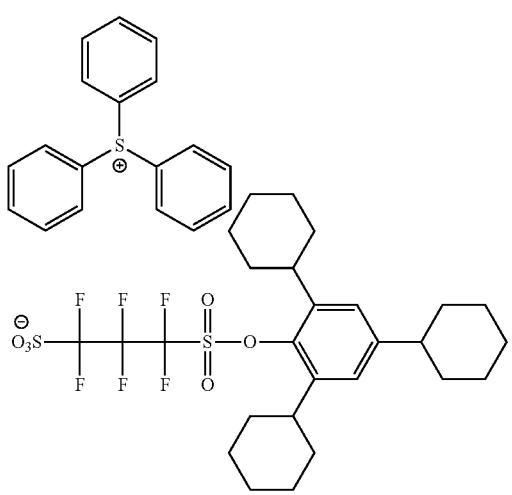
PAG-305
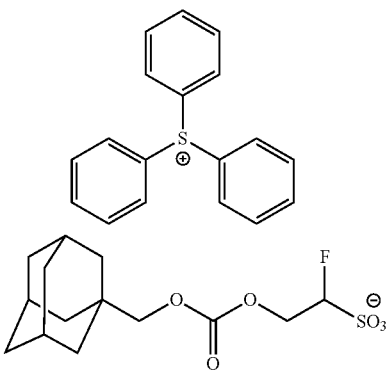
PAG-306
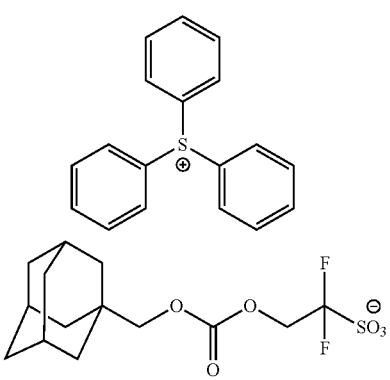
PAG-307
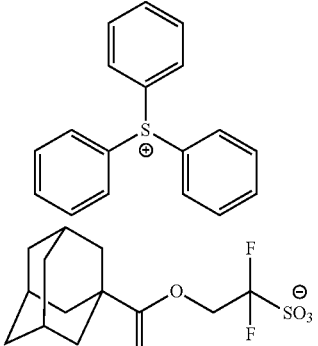
PAG-308
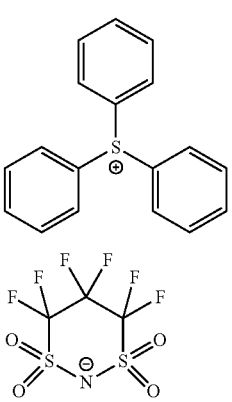

PAG-309
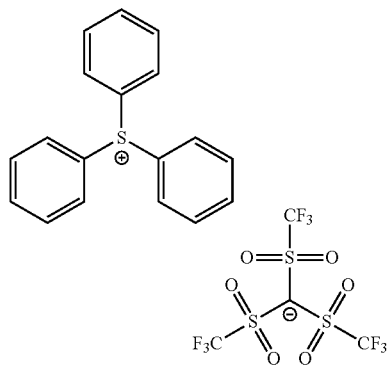
PAG-310
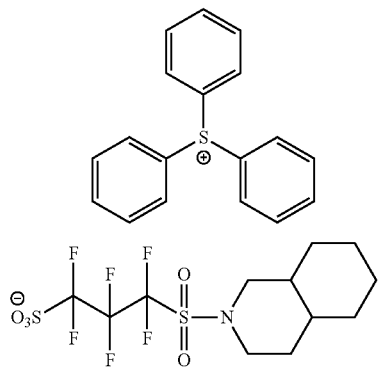
PCP-301
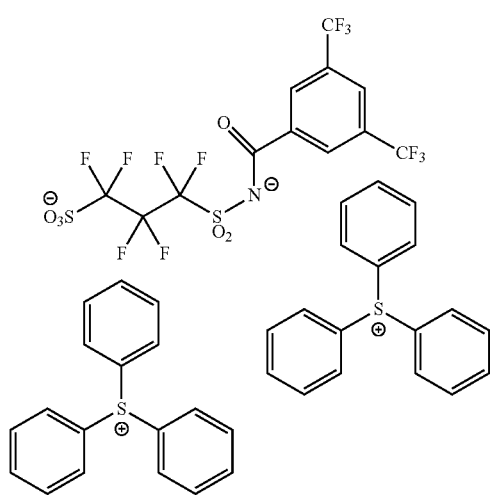
PCP-302
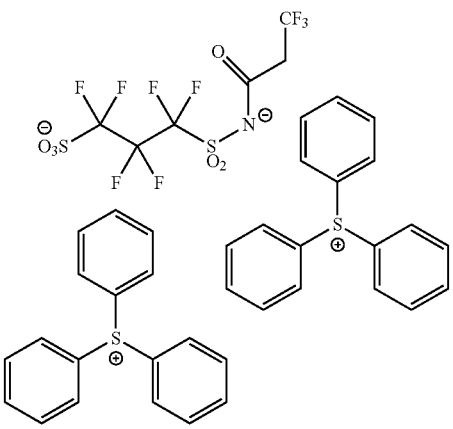
PCP-303
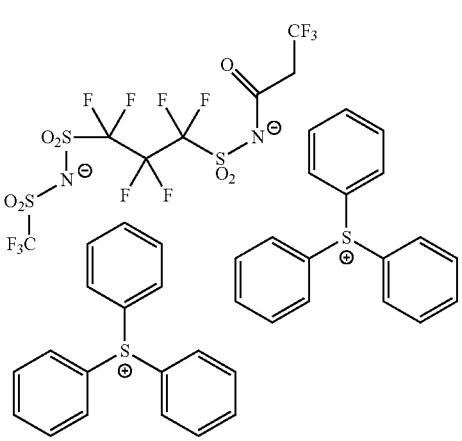
PCP-304
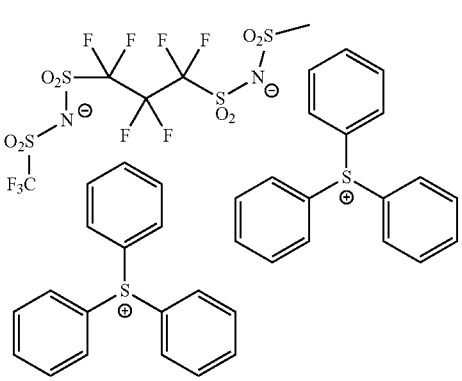
<Acid Diffusion Control Agent>
Hereinafter, the following acid diffusion control agents used in Examples are shown.
All of the following acid diffusion control agents correspond to an onium salt which is relatively a weak acid with respect to the photoacid-generating component.

PDQ-001
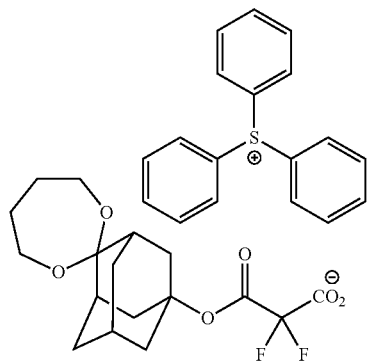
PQ-102
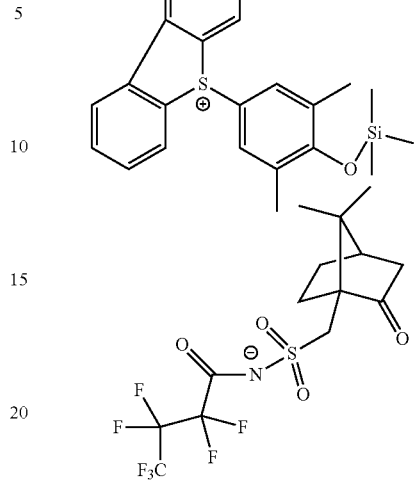
PDQ-002
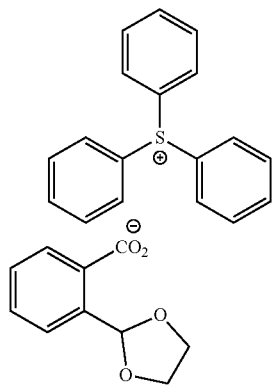
PQ-103
PDQ-101
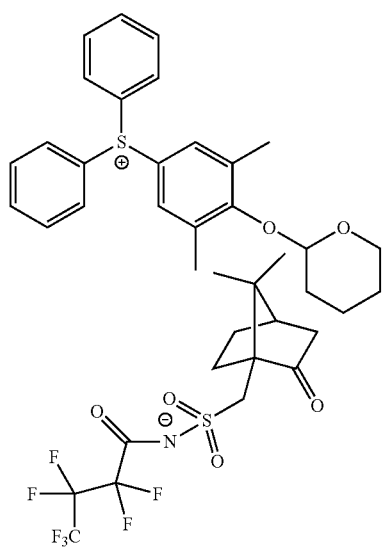
PQ-201
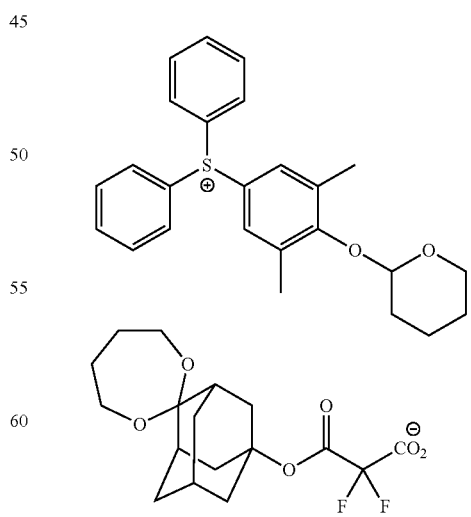

-continued
PDQ-202
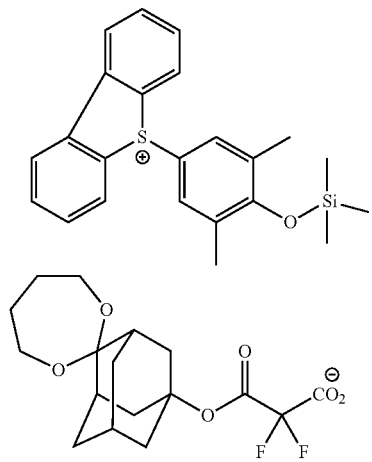
PDQ-203
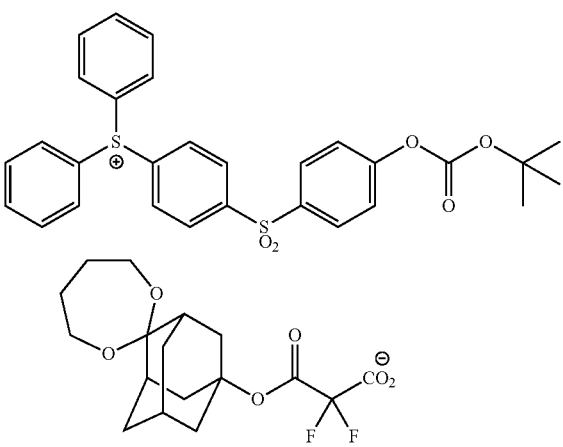
PDQ-301
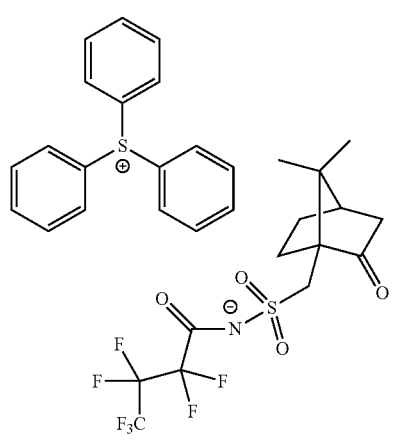
-continued
PDQ-302
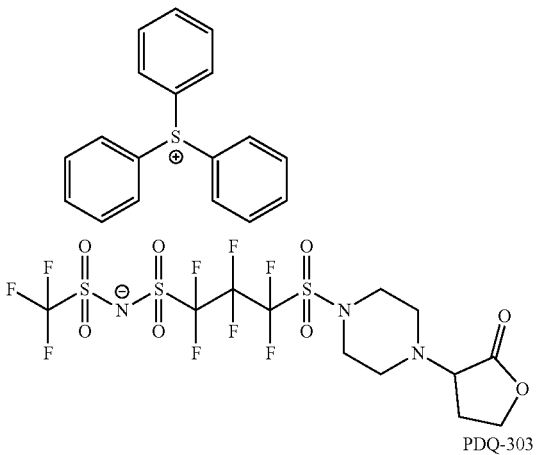
PDQ-303
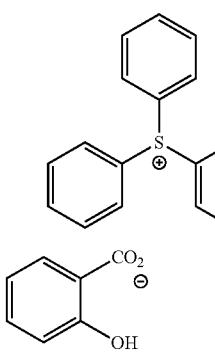
PDQ-304
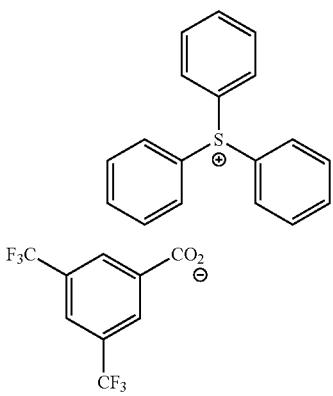
PDQ-305
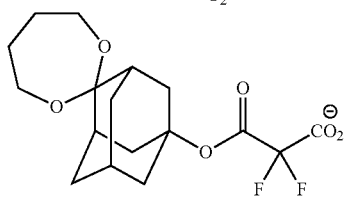
<Preparation of Resist Composition>
Each component shown in Table 2 was mixed in a mixed solvent of PGMEA/PGME=80/20 (mass ratio) such that a resist composition which satisfied a formulating ratio of solid content shown in the latter part of Table 2 and had a concentration of solid contents of 1.6% by mass could be finally obtained, thereby obtaining a mixed solution.

Next, the obtained mixed solution was filtered (filtration step) to obtain each resist composition (actinic ray-sensitive or radiation-sensitive composition). Each of the obtained resist compositions was subjected to each of Examples and Comparative Examples described later.

In addition, in the above-described method for preparing the resist composition, in a case of preparing a resist composition other than the resist compositions of Examples 34 and 35, as the filtration step, filtration was performed once with a polyethylene-made filter having a pore diameter of 50 nm, twice with a nylon-made filter having a pore diameter of 10 nm, and finally once with a polyethylene-made filter having a pore diameter of 5 nm. As a result, in each of the obtained resist compositions, contents of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo were each 1.0 ppt by mass or more and less than 1.0 ppm by mass with respect to the total mass of the resist composition.

In addition, in a case of preparing the resist composition of Example 34, as the filtration step, filtration was performed once with a polyethylene-made filter having a pore diameter of 50 nm and finally once with a polyethylene-made filter having a pore diameter of 5 nm (that is, filtration using a nylon-made filter was omitted). As a result, in the resist composition of Example 34, contents of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo were each 1.0 ppm by mass or more with respect to the total mass of the resist composition.

In addition, in a case of preparing the resist composition of Example 35, as the filtration step, filtration was performed once with a polyethylene-made filter having a pore diameter of 50 nm, 10 times with a nylon-made filter having a pore diameter of 10 nm, and finally once with a polyethylene-made filter having a pore diameter of 5 nm. As a result, in the resist composition of Example 35, contents of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo were each less than 1.0 ppt by mass with respect to the total mass of the resist composition.

The contents of metal atoms in the resist composition were measured using Agilent 8800 triple quadrupole inductively coupled plasma mass spectrometry (ICP-MS, for semiconductor analysis, option #200) manufactured by Agilent Technologies, Inc. In the measurement, the resist composition was appropriately darkened as necessary.

Table 2 shows formulation of the solid content of the resist composition used in each of Examples.

In the table below, the column of "Amount (wt)" indicates a mass ratio (% by mass) of the content of each component to the total solid content.

The column of "Amount (mmol/g)" indicates an amount of substance (mmol/g) of each component in 1 g of solid content.

The column of "Each metal content" indicates the degree of content of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo. In the resist composition, a case where the content of each metal atom was 1.0 ppm by mass or more is described as "high", a case of being 1.0 ppt by mass or more and less than 1.0 ppm by mass is described as "middle", and a case of being less than 1.0 ppt by mass is described as "low".

In the resist composition, the solid content means all the components excluding the solvent.

In addition, the resist compositions of Examples 32 and 33 have the same composition as the resist composition of Example 1, and only the conditions for carrying out the test described later are different.

TABLE 2

| | Resin | | Photoacid generator 1 | | | Photoacid generator 2 | | | Acid diffusion control agent | | | Each metal content |
|---|---|---|---|---|---|---|---|---|---|---|---|---|
| | Type | Amount (wt) | Type | Amount (mmol/g) | Amount (wt) | Type | Amount (mmol/g) | Amount (wt) | Type | Amount (mmol/g) | Amount (wt) | |
| Example 1 | Polymer1 | 76.7 | PAG-310 | 0.15 | 10.4 | — | 0 | 0.0 | PDQ-302 | 0.15 | 12.9 | middle |
| Example 2 | Polymer2 | 83.9 | — | 0 | 0.0 | PCP-301 | 0.15 | 16.1 | — | 0 | 0.0 | middle |
| Example 3 | Polymer3 | 76.9 | PAG-201 | 0.15 | 11.8 | — | 0 | 0.0 | PDQ-201 | 0.15 | 11.3 | middle |
| Example 4 | Polymer4 | 80.9 | PAG-301 | 0.15 | 8.8 | — | 0 | 0.0 | PDQ-301 | 0.15 | 10.3 | middle |
| Example 5 | Polymer5 | 83.9 | — | 0 | 0.0 | PCP-301 | 0.15 | 16.1 | — | 0 | 0.0 | middle |
| Example 6 | Polymer6 | 75.1 | PAG-101 | 0.15 | 10.7 | — | 0 | 0.0 | PDQ-103 | 0.15 | 14.2 | middle |
| Example 7 | Polymer8 | 75.3 | PAG-103 | 0.15 | 12.6 | — | 0 | 0.0 | PDQ-102 | 0.15 | 12.1 | middle |
| Example 8 | Polymer9 | 82.1 | PAG-309 | 0.15 | 10.1 | — | 0 | 0.0 | PDQ-305 | 0.15 | 7.8 | middle |
| Example 9 | Polymer10 | 75.2 | PAG-202 | 0.15 | 11.6 | — | 0 | 0.0 | PDQ-203 | 0.15 | 13.2 | middle |
| Example 10 | Polymer11 | 80.9 | PAG-301 | 0.15 | 8.8 | — | 0 | 0.0 | PDQ-301 | 0.15 | 10.3 | middle |
| Example 11 | Polymer12 | 85.8 | — | 0 | 0.0 | PCP-302 | 0.15 | 14.2 | — | 0 | 0.0 | middle |
| Example 12 | Polymer13 | 84.3 | — | 0 | 0.0 | PCP-304 | 0.15 | 15.7 | — | 0 | 0.0 | middle |
| Example 13 | Polymer14 | 76.2 | PAG-304 | 0.15 | 13.5 | — | 0 | 0.0 | PDQ-301 | 0.15 | 10.3 | middle |
| Example 14 | Polymer15 | 80.4 | PAG-306 | 0.15 | 9.3 | — | 0 | 0.0 | PDQ-301 | 0.15 | 10.3 | middle |
| Example 15 | Polymer16 | 77.2 | PAG-102 | 0.15 | 10.5 | — | 0 | 0.0 | PDQ-101 | 0.15 | 12.3 | middle |
| Example 16 | Polymer17 | 80.9 | PAG-307 | 0.15 | 8.8 | — | 0 | 0.0 | PDQ-301 | 0.15 | 10.3 | middle |
| Example 17 | Polymer18 | 77.2 | PAG-303 | 0.15 | 12.5 | — | 0 | 0.0 | PDQ-301 | 0.15 | 10.3 | middle |
| Example 18 | Polymer19 | 80.9 | PAG-301 | 0.15 | 8.8 | — | 0 | 0.0 | PDQ-301 | 0.15 | 10.3 | middle |
| Example 19 | Polymer20 | 79.8 | PAG-001 | 0.15 | 9.9 | — | 0 | 0.0 | PDQ-301 | 0.15 | 10.3 | middle |
| Example 20 | Polymer21 | 83.0 | PAG-302 | 0.15 | 10.0 | — | 0 | 0.0 | PDQ-303 | 0.15 | 7.0 | middle |
| Example 21 | Polymer22 | 79.6 | PAG-002 | 0.15 | 10.1 | — | 0 | 0.0 | PDQ-301 | 0.15 | 10.3 | middle |
| Example 22 | Polymer23 | 75.2 | PAG-203 | 0.15 | 13.7 | — | 0 | 0.0 | PDQ-202 | 0.15 | 11.1 | middle |
| Example 23 | Polymer24 | 81.7 | PAG-305 | 0.15 | 9.0 | — | 0 | 0.0 | PDQ-001 | 0.15 | 9.3 | middle |
| Example 24 | Polymer25 | 85.2 | PAG-301 | 0.15 | 8.8 | — | 0 | 0.0 | PDQ-304 | 0.15 | 6.0 | middle |
| Example 25 | Polymer26 | 81.3 | PAG-308 | 0.15 | 8.3 | — | 0 | 0.0 | PDQ-301 | 0.15 | 10.3 | middle |
| Example 26 | Polymer27 | 83.9 | — | 0 | 0.0 | PCP-301 | 0.15 | 16.1 | — | 0 | 0.0 | middle |

TABLE 2-continued

| | Resin | | Photoacid generator 1 | | | Photoacid generator 2 | | | Acid diffusion control agent | | | Each metal content |
|---|---|---|---|---|---|---|---|---|---|---|---|---|
| | Type | Amount (wt) | Type | Amount (mmol/g) | Amount (wt) | Type | Amount (mmol/g) | Amount (wt) | Type | Amount (mmol/g) | Amount (wt) | |
| Example 27 | Polymer28 | 84.4 | PAG-301 | 0.15 | 8.8 | — | 0 | 0.0 | PDQ-002 | 0.15 | 6.8 | middle |
| Example 28 | Polymer29 | 79.7 | PAG-003 | 0.15 | 9.9 | — | 0 | 0.0 | PDQ-301 | 0.15 | 10.3 | middle |
| Example 29 | Polymer30 | 83.8 | — | 0 | 0.0 | PCP-303 | 0.15 | 16.2 | — | 0 | 0.0 | middle |
| Example 30 | Polymer35 | 80.9 | PAG-301 | 0.15 | 8.8 | — | 0 | 0.0 | PDQ-301 | 0.15 | 10.3 | middle |
| Example 31 | Polymer36 | 80.9 | PAG-301 | 0.15 | 8.8 | — | 0 | 0.0 | PDQ-301 | 0.15 | 10.3 | middle |
| Example 32 | Polymer1 | 76.7 | PAG-310 | 0.15 | 10.4 | — | 0 | 0.0 | PDQ-302 | 0.15 | 12.9 | middle |
| Example 33 | Polymer1 | 76.7 | PAG-310 | 0.15 | 10.4 | — | 0 | 0.0 | PDQ-302 | 0.15 | 12.9 | middle |
| Example 34 | Polymer1 | 76.7 | PAG-310 | 0.15 | 10.4 | — | 0 | 0.0 | PDQ-302 | 0.15 | 12.9 | high |
| Example 35 | Polymer1 | 76.7 | PAG-310 | 0.15 | 10.4 | — | 0 | 0.0 | PDQ-302 | 0.15 | 12.9 | low |
| Comparative Example 1 | Polymer7 | 83.9 | — | 0 | 0.0 | PCP-301 | 0.15 | 16.1 | — | 0 | 0.0 | middle |
| Comparative Example 2 | Polymer1 | 80.9 | PAG-301 | 0.15 | 8.8 | — | 0 | 0.0 | PDQ-301 | 0.15 | 10.3 | middle |
| Comparative Example 3 | Polymer31 | 80.9 | PAG-301 | 0.15 | 8.8 | — | 0 | 0.0 | PDQ-301 | 0.15 | 10.3 | middle |
| Comparative Example 4 | Polymer32 | 80.9 | PAG-301 | 0.15 | 8.8 | — | 0 | 0.0 | PDQ-301 | 0.15 | 10.3 | middle |
| Comparative Example 5 | Polymer33 | 80.9 | PAG-301 | 0.15 | 8.8 | — | 0 | 0.0 | PDQ-301 | 0.15 | 10.3 | middle |
| Comparative Example 6 | Polymer34 | 80.9 | PAG-301 | 0.15 | 8.8 | — | 0 | 0.0 | PDQ-301 | 0.15 | 10.3 | middle |

In addition, the dispersion element, the dipole-dipole element, and the hydrogen bond element of the resin (resin A) used in the resist composition of each of Examples and Comparative Examples, the resin (resin A) in a case where all the acid-decomposable groups a reacted, and the acid generated from the photoacid generator are shown in the table below. In addition, the amount of change in SP value (MPa$^{0.5}$) and the segregation index calculated from these values are shown in Table 3.

The significance of each column in the table is as follows.
δD1: dispersion element of the resin
δP1: dipole-dipole element of the resin
δH1: hydrogen bond element of the resin
δD2: dispersion element of the resin in a case where all the acid-decomposable groups a of the resin reacted with the acid
δP2: dipole-dipole element of the resin in a case where all the acid-decomposable groups a of the resin reacted with the acid
δH2: hydrogen bond element of the resin in a case where all the acid-decomposable groups a of the resin reacted with the acid
δD3: dispersion element of the acid generated from the photoacid-generating component
δP3: dipole-dipole element of the acid generated from the photoacid-generating component
δH3: hydrogen bond element of the acid generated from the photoacid-generating component
(the unit is all MPa$^{0.5}$)

The details of the amount of change in SP value (MPa$^{0.5}$) and the segregation index are as described in the specification.

TABLE 3

| | SP1 | | | SP2 | | | SP3 | | | Amount of change in SP value | Segregation index |
|---|---|---|---|---|---|---|---|---|---|---|---|
| | δD1 | δP1 | δH1 | δD2 | δP2 | δH2 | δD3 | δP3 | δH3 | | |
| Example 1 | 16.7 | 4.1 | 6.5 | 16.7 | 4.1 | 6.7 | 17.5 | 15.2 | 12.9 | 0.1 | 1.8 |
| Example 2 | 15.0 | 3.0 | 3.8 | 15.0 | 3.1 | 4.2 | 16.4 | 18.5 | 13.2 | 0.4 | 7.6 |
| Example 3 | 16.6 | 5.9 | 3.8 | 16.7 | 7.5 | 4.2 | 18.9 | 16.9 | 13.7 | 1.6 | 23.1 |
| Example 4 | 17.1 | 9.7 | 5.8 | 17.2 | 10.0 | 6.6 | 17.8 | 11.4 | 12.9 | 0.9 | 6.0 |
| Example 5 | 16.6 | 4.2 | 3.1 | 16.6 | 4.4 | 3.5 | 16.4 | 18.5 | 13.2 | 0.4 | 7.0 |
| Example 6 | 16.5 | 7.4 | 6.3 | 16.6 | 8.3 | 8.6 | 17.8 | 11.4 | 12.9 | 2.5 | 16.6 |
| Example 7 | 17.4 | 9.1 | 5.2 | 17.5 | 10.0 | 6.5 | 17.8 | 11.4 | 12.9 | 1.6 | 11.5 |
| Example 8 | 16.2 | 7.2 | 4.2 | 16.3 | 7.7 | 5.4 | 15.4 | 26.0 | 8.2 | 1.4 | 25.6 |
| Example 9 | 16.7 | 3.5 | 3.9 | 16.1 | 3.1 | 4.2 | 18.9 | 16.9 | 13.7 | 0.7 | 11.6 |
| Example 10 | 16.2 | 6.6 | 5.9 | 16.2 | 6.8 | 6.1 | 17.8 | 11.4 | 12.9 | 0.2 | 2.1 |
| Example 11 | 16.2 | 3.4 | 5.1 | 16.2 | 3.6 | 5.8 | 16.5 | 22.8 | 16.4 | 0.7 | 15.3 |
| Example 12 | 16.8 | 3.8 | 4.5 | 16.6 | 4.0 | 4.9 | 16.3 | 28.1 | 11.7 | 0.5 | 13.5 |
| Example 13 | 16.1 | 4.1 | 4.8 | 16.2 | 4.2 | 5.4 | 17.8 | 9.2 | 8.3 | 0.6 | 3.5 |
| Example 14 | 16.3 | 7.5 | 5.6 | 16.4 | 8.1 | 7.2 | 17.5 | 12.1 | 12.1 | 1.6 | 11.9 |
| Example 15 | 16.0 | 6.2 | 4.4 | 16.1 | 6.6 | 6.1 | 17.8 | 11.4 | 12.9 | 1.8 | 16.5 |
| Example 16 | 16.1 | 5.1 | 4.6 | 16.2 | 5.3 | 5.0 | 17.8 | 11.4 | 12.9 | 0.4 | 3.9 |
| Example 17 | 16.3 | 5.4 | 4.1 | 16.5 | 5.7 | 5.3 | 18.5 | 8.1 | 8.5 | 1.2 | 6.2 |
| Example 18 | 17.2 | 5.1 | 9.3 | 17.4 | 5.4 | 9.9 | 17.8 | 11.4 | 12.9 | 0.7 | 4.7 |
| Example 19 | 17.1 | 9.9 | 6.3 | 17.2 | 10.4 | 7.3 | 18.9 | 16.9 | 13.7 | 1.1 | 10.7 |
| Example 20 | 16.5 | 3.7 | 4.2 | 16.5 | 4.0 | 4.7 | 18.8 | 6.6 | 9.1 | 0.6 | 3.3 |
| Example 21 | 15.9 | 4.2 | 3.5 | 16.2 | 4.4 | 4.5 | 18.5 | 13.4 | 16.1 | 1.0 | 15.7 |

TABLE 3-continued

| | SP1 | | | SP2 | | | SP3 | | | Amount of change in SP value | Segregation index |
|---|---|---|---|---|---|---|---|---|---|---|---|
| | δD1 | δP1 | δH1 | δD2 | δP2 | δH2 | δD3 | δP3 | δH3 | | |
| Example 22 | 16.4 | 6.3 | 5.8 | 16.6 | 7.1 | 7.9 | 18.9 | 16.9 | 13.7 | 2.3 | 28.5 |
| Example 23 | 16.1 | 4.5 | 4.5 | 16.2 | 4.5 | 5.4 | 17.7 | 10.8 | 12.5 | 0.9 | 8.9 |
| Example 24 | 16.5 | 4.1 | 5.1 | 16.5 | 4.5 | 6.1 | 17.8 | 11.4 | 12.9 | 1.1 | 11.0 |
| Example 25 | 15.0 | 3.6 | 3.9 | 15.1 | 3.6 | 4.4 | 16.8 | 23.9 | 9.5 | 0.5 | 10.0 |
| Example 26 | 17.2 | 5.1 | 5.5 | 17.2 | 5.0 | 6.2 | 16.4 | 18.5 | 13.2 | 0.7 | 11.5 |
| Example 27 | 16.4 | 4.5 | 6.9 | 16.5 | 4.9 | 8.4 | 17.8 | 11.4 | 12.9 | 1.6 | 13.5 |
| Example 28 | 16.8 | 4.1 | 3.9 | 16.8 | 4.3 | 3.7 | 18.5 | 13.4 | 16.1 | 0.3 | 4.5 |
| Example 29 | 17.2 | 5.3 | 5.6 | 17.2 | 6.1 | 5.6 | 15.8 | 26.3 | 10.4 | 0.8 | 16.1 |
| Example 30 | 16.1 | 4.3 | 5.0 | 16.2 | 4.7 | 6.4 | 17.8 | 11.4 | 12.9 | 1.5 | 15.3 |
| Example 31 | 17.0 | 4.8 | 4.9 | 16.8 | 5.2 | 5.4 | 17.8 | 11.4 | 12.9 | 0.7 | 6.5 |
| Example 32 | 16.7 | 4.1 | 6.5 | 16.7 | 4.1 | 6.7 | 17.5 | 15.2 | 12.9 | 0.1 | 1.8 |
| Example 33 | 16.7 | 4.1 | 6.5 | 16.7 | 4.1 | 6.7 | 17.5 | 15.2 | 12.9 | 0.1 | 1.8 |
| Example 34 | 16.7 | 4.1 | 6.5 | 16.7 | 4.1 | 6.7 | 17.5 | 15.2 | 12.9 | 0.1 | 1.8 |
| Example 35 | 16.7 | 4.1 | 6.5 | 16.7 | 4.1 | 6.7 | 17.5 | 15.2 | 12.9 | 0.1 | 1.8 |
| Comparative Example 1 | 16.4 | 4.6 | 5.4 | 16.5 | 4.6 | 5.7 | 16.4 | 18.5 | 13.2 | 0.3 | 5.3 |
| Comparative Example 2 | 16.7 | 4.1 | 6.5 | 16.7 | 4.1 | 6.7 | 17.8 | 11.4 | 12.9 | 0.1 | 1.4 |
| Comparative Example 3 | 15.8 | 3.9 | 4.7 | 15.8 | 3.9 | 4.7 | 17.8 | 11.4 | 12.9 | 0.0 | 0.0 |
| Comparative Example 4 | 16.6 | 5.1 | 5.5 | 17.1 | 6.9 | 10.9 | 17.8 | 11.4 | 12.9 | 5.7 | 40.8 |
| Comparative Example 5 | 16.3 | 3.9 | 4.7 | 16.1 | 4.4 | 6.3 | 17.8 | 11.4 | 12.9 | 1.7 | 17.3 |
| Comparative Example 6 | 16.9 | 4.8 | 4.7 | 17.0 | 5.1 | 5.6 | 17.8 | 11.4 | 12.9 | 1.0 | 9.7 |

[Test]
<Pattern Formation>

A composition for forming an underlayer film, AL412 (manufactured by Brewer Science, Inc.), was applied to a silicon wafer and baked at 205° C. for 60 seconds to form an underlayer film having a film thickness of 20 nm. The resist composition of each of Examples and Comparative Examples was applied thereto and baked at 120° C. for 60 seconds to form a resist film having a film thickness of 35 nm (resist film forming step).

The silicon wafer having the obtained resist film was subjected to a pattern irradiation using an EUV exposure device (manufactured by ASML, NXE3400, NA 0.33, Quadrupol, outer sigma 0.87, inner sigma 0.65). As a reticle, a mask having a line size=16 nm and a line:space=1:1 was used. The exposure amount was set so as to resolve a line pattern having an average line width of 16 nm in a case where the above-described mask was used.

The exposed resist film was heated on a hot plate at a temperature described in the column of "1st PEB (° C.) of the table below and baked for 60 seconds (first heating step). Thereafter, the resist film was further heated at a temperature described in the column of "2nd PEB (° C.) of the table below and baked for 60 seconds (second heating step).

Thereafter, the above-described resist film was developed with 2.38% by mass of TMAH aqueous solution for 30 seconds and spin-dried to obtain a positive tone pattern (development step).

In Example 32, the pattern formation was performed in an environment in which the concentration of $NH_3$ was 1.0 ppm by volume or more, in Example 33, the pattern formation was performed in an environment in which the concentration of $NH_3$ was less than 1.0 ppq by volume, and in Examples or Comparative Examples other than these Examples, the pattern formation was performed in an environment in which the concentration of $NH_3$ was 1.0 ppm by volume or more and less than 1.0 ppq by volume.

In addition, in Comparative Example 2, the first heating step was omitted.

<Confirmation of Reaction>

Each confirmation resist composition was prepared in the same manner as in the resist composition of each of Examples, except that the resin was changed to a resin composed only of repeating units derived from the monomer 1 and the monomer 3 in the table shown in the upper part.

For example, in a case where the resist composition of Example includes Polymer2, the above-described resin composed only of repeating units derived from the monomer 1 and the monomer 3 is a resin Polymer2X having a repeating unit derived from M-002 and a repeating unit derived from M-310 in a mass ratio of 5:60. The weight-average molecular weight and the dispersity of the Polymer2X were the same as those of Polymer2.

However, for repeating units derived from M-019 to M-022, in order to eliminate the influence of the acid-decomposable group b of these repeating units, these repeating units were changed to repeating units derived from M-019b to M-022b shown below, respectively.

The procedure up to the first heating step was performed in the same manner as in the procedure described in <Pattern formation> above, except that the obtained confirmation resist composition was used and the exposure was the entire exposure, and the change in film thickness before and after the first heating step was confirmed. As a result, even in a case where the confirmation resist composition of any of Examples was used, the film thickness of the resist film subjected to the first heating step was reduced by 5% to 40%, assuming that the film thickness of the resist film after exposure was 100%. It is considered that such a decrease in film thickness is due to the fact that the acid-decomposable group a of the resin reacts with the acid, the protective group is eliminated, and the resin is volatilized.

From these results, it was confirmed that, even in the first heating step of each of Examples, at least a part of the acid-decomposable group a reacted to generate a polar group having a pKa of 6.0 or more.

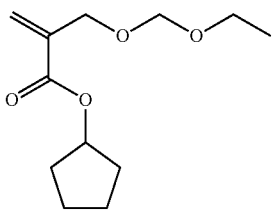
M-019b

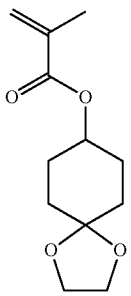
M-020b

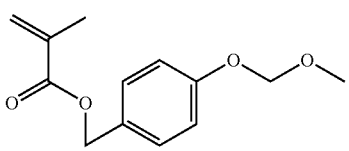
M-021b

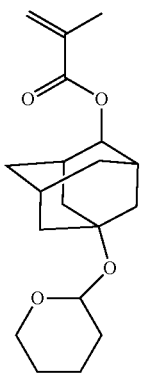
M-022b

Each confirmation resist composition was prepared in the same manner as in the resist composition of each of Examples, except that the resin was changed to a resin composed only of repeating units derived from the monomer 2 and the monomer 3 in the table shown in the upper part.

For example, in a case where the resist composition of Example includes Polymer2, the above-described resin composed only of repeating units derived from the monomer 2 and the monomer 3 is a resin Polymer2X having a repeating unit derived from M-103 and a repeating unit derived from M-310 in a mass ratio of 35:60. The weight-average molecular weight and the dispersity of the Polymer2Y were the same as those of Polymer2, respectively.

The procedure up to the second heating step was performed in the same manner as in the procedure described in <Pattern formation> above, except that the obtained confirmation resist composition was used and the exposure was the entire exposure, and the change in film thickness of the resist film before and after the second heating step was confirmed. As a result, even in a case where the confirmation resist composition of any of Examples was used, the film thickness of the resist film subjected to the second heating step was reduced by 5% to 40%, assuming that the film thickness of the resist film after the first heating step was 100%. It is considered that such a decrease in film thickness is due to the fact that the acid-decomposable group b of the resin reacts with the acid, the protective group is eliminated, and the resin is volatilized.

From these results, it was confirmed that, even in the second heating step of each of Examples, at least a part of the acid-decomposable group b reacted to generate a polar group having a pKa of less than 6.0.

<Evaluation>

(Evaluation of LER)

Using a scanning electron microscope (CG-6300 manufactured by Hitachi, Ltd.), a distance from a first reference line where the edge should be was measured at any 30 points in a length direction of 3.6 μm for a 16 nm (1:1) line-and-space pattern formed at the optimum exposure amount so as to resolve a line pattern having an average line width of 16 nm. The standard deviation of this distance was obtained, 3σ (nm) was calculated, and the value was used as an LER value.

As the LER value is smaller, the performance is better.

(Evaluation of Bridge Defects)

With regard to the same pattern as evaluated in (Evaluation of LER) described above, using a defect inspection apparatus KLA 2935 (trade name) manufactured by KLA Tencor Ltd., the pattern was measured in random mode by setting a pixel size of the defect inspection apparatus to 0.05 μm and a threshold value to 50. Differences caused by superposition of comparative images and pixel units were extracted, and defects in the pattern formation region of each of Examples or Comparative Examples were detected. The detected defects were observed with eDR 7380 (trade name) manufactured by KLA Tencor Ltd., and the number of bridge defects per unit area (piece/cm$^2$) was evaluated.

As the number of bridge defects is smaller, the performance is better.

(Evaluation of Sensitivity Variation)

Pattern formation was performed on 10 silicon wafers using the same resist composition in the same procedure as shown in <Pattern formation> described above. The exposure amount (optimum exposure amount (mJ/cm$^2$)) in which a line pattern having an average line width of 16 nm could be obtained in all 10 pattern formations was determined for each time.

The standard deviation 3σ (mJ/cm$^2$) of the optimum exposure amount for all 10 times and the average value (mJ/cm$^2$) of the optimum exposure amount for all 10 times were calculated, and the sensitivity variation (%) was calculated based on the following expression.

Sensitivity variation (%)=Standard deviation 3σ of optimum exposure amount÷Average value of optimum exposure amount×100    Expression:

The following table shows the heating temperature in the first heating step and the second heating step, the concentration of NH$_3$ in the environment during the pattern formation, and the test results in each of Examples or Comparative Examples.

TABLE 4

| | Segregation index | 1st PEB (° C.) | 2nd PEB (° C.) | NH₃ concentration | Evaluation LER | Bridge defects | Sensitivity variation |
|---|---|---|---|---|---|---|---|
| Example 1 | 1.8 | 80 | 100 | 1.0 ppq by volume or more and less than 1.0 ppm by volume | 2.7 | 138 | <5% |
| Example 2 | 7.6 | 80 | 120 | 1.0 ppq by volume or more and less than 1.0 ppm by volume | 2.4 | 25 | <5% |
| Example 3 | 23.1 | 70 | 100 | 1.0 ppq by volume or more and less than 1.0 ppm by volume | 1.6 | 4 | <5% |
| Example 4 | 6.0 | 70 | 100 | 1.0 ppq by volume or more and less than 1.0 ppm by volume | 2.4 | 49 | <5% |
| Example 5 | 7.0 | 80 | 120 | 1.0 ppq by volume or more and less than 1.0 ppm by volume | 2.2 | 38 | <5% |
| Example 6 | 16.6 | 80 | 110 | 1.0 ppq by volume or more and less than 1.0 ppm by volume | 2.1 | 13 | <5% |
| Example 7 | 11.5 | 80 | 120 | 1.0 ppq by volume or more and less than 1.0 ppm by volume | 2.1 | 24 | <5% |
| Example 8 | 25.6 | 90 | 110 | 1.0 ppq by volume or more and less than 1.0 ppm by volume | 2.5 | 15 | <5% |
| Example 9 | 11.6 | 90 | 120 | 1.0 ppq by volume or more and less than 1.0 ppm by volume | 1.8 | 9 | <5% |
| Example 10 | 2.1 | 90 | 100 | 1.0 ppq by volume or more and less than 1.0 ppm by volume | 3.0 | 120 | <5% |
| Example 11 | 15.3 | 90 | 110 | 1.0 ppq by volume or more and less than 1.0 ppm by volume | 2.6 | 25 | <5% |
| Example 12 | 13.5 | 90 | 110 | 1.0 ppq by volume or more and less than 1.0 ppm by volume | 2.5 | 17 | <5% |
| Example 13 | 3.5 | 80 | 100 | 1.0 ppq by volume or more and less than 1.0 ppm by volume | 2.8 | 88 | <5% |
| Example 14 | 11.9 | 90 | 100 | 1.0 ppq by volume or more and less than 1.0 ppm by volume | 2.9 | 27 | <5% |
| Example 15 | 16.5 | 80 | 120 | 1.0 ppq by volume or more and less than 1.0 ppm by volume | 1.9 | 16 | <5% |
| Example 16 | 3.9 | 70 | 100 | 1.0 ppq by volume or more and less than 1.0 ppm by volume | 2.5 | 67 | <5% |
| Example 17 | 6.2 | 90 | 100 | 1.0 ppq by volume or more and less than 1.0 ppm by volume | 2.9 | 43 | <5% |
| Example 18 | 4.7 | 90 | 110 | 1.0 ppq by volume or more and less than 1.0 ppm by volume | 2.8 | 68 | <5% |
| Example 19 | 10.7 | 80 | 120 | 1.0 ppq by volume or more and less than 1.0 ppm by volume | 2.0 | 21 | <5% |
| Example 20 | 3.3 | 80 | 100 | 1.0 ppq by volume or more and less than 1.0 ppm by volume | 2.9 | 84 | <5% |
| Example 21 | 15.7 | 80 | 120 | 1.0 ppq by volume or more and less than 1.0 ppm by volume | 1.8 | 11 | <5% |
| Example 22 | 28.5 | 70 | 110 | 1.0 ppq by volume or more and less than 1.0 ppm by volume | 1.3 | 3 | <5% |
| Example 23 | 8.9 | 90 | 120 | 1.0 ppq by volume or more and less than 1.0 ppm by volume | 2.2 | 20 | <5% |
| Example 24 | 11.0 | 80 | 100 | 1.0 ppq by volume or more and less than 1.0 ppm by volume | 2.6 | 33 | <5% |
| Example 25 | 10.0 | 70 | 120 | 1.0 ppq by volume or more and less than 1.0 ppm by volume | 2.5 | 25 | <5% |
| Example 26 | 11.5 | 80 | 110 | 1.0 ppq by volume or more and less than 1.0 ppm by volume | 2.4 | 27 | <5% |
| Example 27 | 13.5 | 70 | 120 | 1.0 ppq by volume or more and less than 1.0 ppm by volume | 2.1 | 15 | <5% |
| Example 28 | 4.5 | 70 | 110 | 1.0 ppq by volume or more and less than 1.0 ppm by volume | 2.1 | 35 | <5% |
| Example 29 | 16.1 | 80 | 100 | 1.0 ppq by volume or more and less than 1.0 ppm by volume | 2.4 | 12 | <5% |
| Example 30 | 15.3 | 90 | 110 | 1.0 ppq by volume or more and less than 1.0 ppm by volume | 2.5 | 19 | <5% |
| Example 31 | 6.5 | 90 | 110 | 1.0 ppq by volume or more and less than 1.0 ppm by volume | 2.7 | 38 | <5% |
| Example 32 | 1.8 | 80 | 100 | ≥1.0 ppm by volume | 2.9 | 208 | <5% |
| Example 33 | 1.8 | 80 | 100 | <1.0 ppq by volume | 2.7 | 140 | <5% |
| Example 34 | 1.8 | 80 | 100 | 1.0 ppq by volume or more and less than 1.0 ppm by volume | 2.9 | 301 | <5% |
| Example 35 | 1.8 | 80 | 100 | 1.0 ppq by volume or more and less than 1.0 ppm by volume | 2.8 | 142 | <5% |
| Comparative Example 1 | 5.3 | 70 | 110 | 1.0 ppq by volume or more and less than 1.0 ppm by volume | 3.4 | 1,016 | <5% |
| Comparative Example 2 | 1.4 | — | 120 | 1.0 ppq by volume or more and less than 1.0 ppm by volume | 3.3 | 481 | <5% |

TABLE 4-continued

|  | Segregation index | 1st PEB (° C.) | 2nd PEB (° C.) | NH₃ concentration | Evaluation | | |
|---|---|---|---|---|---|---|---|
|  |  |  |  |  | LER | Bridge defects | Sensitivity variation |
| Comparative Example 3 | 0.0 | 80 | 120 | 1.0 ppq by volume or more and less than 1.0 ppm by volume | 3.2 | 1,738 | <5% |
| Comparative Example 4 | 40.8 | 80 | 120 | 1.0 ppq by volume or more and less than 1.0 ppm by volume | 3.7 | 4,071 | <5% |
| Comparative Example 5 | 17.3 | 80 | 120 | 1.0 ppq by volume or more and less than 1.0 ppm by volume | 3.0 | 1,451 | <5% |
| Comparative Example 6 | 9.7 | 80 | 120 | 1.0 ppq by volume or more and less than 1.0 ppm by volume | 3.7 | 3,886 | <5% |

As shown in the table, it was confirmed that the problems of the present invention can be solved by forming a pattern using the pattern forming method according to the embodiment of the present invention.

From the viewpoint that the LER performance was more excellent, it was confirmed that, in the resist film or the resist composition, it is preferable that the photoacid generator has an anion and a cation, and the anion and/or the cation has an acid-decomposable group (see the results of Examples 3, 6, 7, 9, 15, 19, 21, 22, 23, 27, 28, and the like).

From the viewpoint that the LER performance was more excellent, it was confirmed that, in the resist film or the resist composition, it is also preferable that the acid diffusion control agent that is the onium salt which is relatively a weak acid with respect to the photoacid-generating component is included, and the anion and/or the cation of the onium salt has an acid-decomposable group (see the results of Examples 3, 6, 7, 9, 15, 22, 23, 27, and the like).

In addition, from the viewpoint that the bridge defect suppression was more excellent, it was confirmed that the segregation index of the resist film or the resist composition is preferably more than 1.0, more preferably 2.0 or more, still more preferably 3.8 or more, and particularly preferably 26.0 or more.

In a case where the contents of each metal atom of the group consisting of Na, K, Ca, Fe, Cu, Mg, Mn, Al, Cr, Ni, Li, Sn, Ti, Zn, Ag, Pb, Ba, Cd, V, W, Co, and Mo were each independently 1.0 ppt by mass or more and less than 1.0 ppm by mass with respect to the total mass of the resist composition, it was confirmed that the sensitivity variation of the resist film formed from the resist composition is further suppressed (see the comparison of the results between Examples 34 and 35 and Examples 1 to 31).

From the viewpoint that the bridge defect suppression was more excellent, it was confirmed that the amount of change in SP value of the resist film or the resin including the resist composition is preferably 0.3 MPa$^{0.5}$ or more (see the comparison between Examples 1, 10, 32 to 35, and other Examples).

In a case where the pattern formation was performed in an environment in which the concentration of NH₃ was 1.0 ppq by volume or more and less than 1.0 ppm by volume, it was confirmed that the sensitivity variation is further suppressed (see the comparison of the results between Examples 32 and 33 and Examples 1 to 31).

What is claimed is:

1. A pattern forming method comprising, in the following order:
   an exposure step of exposing a resist film to generate an acid in the resist film, the resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component;
   a first heating step of heating the exposed resist film and reacting at least a part of the acid-decomposable group a with the acid to generate the polar group having a pKa of 6.0 or more;
   a second heating step of heating the resist film obtained by the first heating step and reacting at least a part of the acid-decomposable group b with the acid to generate the polar group having a pKa of less than 6.0; and
   a development step of developing the resist film with a developer to form a pattern,
   wherein a segregation index of the resin, which is obtained by the following expression (SP), is more than 1.0, segregation index=$[[\delta D3-(\delta D1+\delta D2)/2]^2+[\delta P3-(\delta P1+\delta P2)/2]^2+[\delta H3-(\delta H1+\delta H2)/2]^2]^{0.5}\times[(\delta D2-\delta D1)^2+(\delta P2-\delta P1)^2+(\delta H2-\delta H1)^2]^{0.5}$     expression (SP):

$\delta D1$: a dispersion element of the resin (unit: MPa$^{0.5}$)
   $\delta P1$: a dipole-dipole element of the resin (unit: MPa$^{0.5}$)
   $\delta H1$: a hydrogen bond element of the resin (unit: MPa$^{0.5}$)
   $\delta D2$: a dispersion element of the resin in a case where all the acid-decomposable groups a of the resin react with the acid (unit: MPa$^{0.5}$)
   $\delta P2$: a dipole-dipole element of the resin in a case where all the acid-decomposable groups a of the resin react with the acid (unit: MPa$^{0.5}$)
   $\delta H2$: a hydrogen bond element of the resin in a case where all the acid-decomposable groups a of the resin react with the acid (unit: MPa$^{0.5}$)
   $\delta D3$: a dispersion element of the acid generated from the photoacid-generating component (unit: MPa$^{0.5}$)
   $\delta P3$: a dipole-dipole element of the acid generated from the photoacid-generating component (unit: MPa$^{0.5}$)
   $\delta H3$: a hydrogen bond element of the acid generated from the photoacid-generating component (unit: MPa$^{0.5}$).

2. The pattern forming method according to claim 1, wherein the resist film includes a resin,
   the resin is one or more kinds selected from the group consisting of a resin W which does not have the acid-decomposable group a and the acid-decomposable group b, a resin X which has the acid-decomposable group a and the acid-decomposable group b, a resin Y which has the acid-decomposable group a and does not have the acid-decomposable group b, and a resin Z which has the acid-decomposable group b and does not have the acid-decomposable group a, and
   the resin satisfies at least one of a requirement of including the resin X or a requirement of including the resin Y and the resin Z.

3. The pattern forming method according to claim 2, wherein at least one of the resin X or the resin Y has an acid-decomposable group a-containing repeating unit having the acid-decomposable group a, and a content of the acid-decomposable group a-containing repeating unit is 5% by mass or more with respect to a total mass of the resin.

4. The pattern forming method according to claim 2, wherein at least one of a requirement that the resin has a specific repeating unit having both the acid-decomposable group a and the photoacid generating group, or a requirement that the resist film includes a photoacid generator which is a low-molecular-weight compound having the acid-decomposable group a is satisfied.

5. The pattern forming method according to claim 4, wherein at least one of a requirement that the resin has the specific repeating unit, the specific repeating unit has an anionic moiety and a cationic moiety, and the cationic moiety has the acid-decomposable group a, or a requirement that the resist film includes the photoacid generator, the photoacid generator has an anion and a cation, and the cation has the acid-decomposable group a is satisfied.

6. The pattern forming method according to claim 1, wherein a heating temperature of the resist film in the first heating step is 30° C. to 100° C.

7. The pattern forming method according to claim 1, wherein a heating temperature of the resist film in the second heating step is 70° C. to 140° C.

8. The pattern forming method according to claim 1, wherein a heating temperature of the resist film in the second heating step is 10° C. or more higher than a heating temperature of the resist film in the first heating step.

9. The pattern forming method according to claim 1, wherein a heating time of the resist film in the first heating step is 30 seconds or longer.

10. The pattern forming method according to claim 1, wherein the pattern forming method is performed in an environment in which a concentration of $NH_3$ is 1.0 ppq by volume or more and less than 1.0 ppm by volume.

11. A method for manufacturing an electronic device, comprising:
the pattern forming method according to claim 1.

12. The pattern forming method according to claim 1, wherein at least one of a requirement that the resin has a specific repeating unit having both the acid-decomposable group a and the photoacid generating group, or a requirement that the resist film includes a photoacid generator which is a low-molecular-weight compound having the acid-decomposable group a is satisfied.

13. A pattern forming method comprising, in the following order:
an exposure step of exposing a resist film to generate an acid in the resist film, the resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component;
a first heating step of heating the exposed resist film and reacting at least a part of the acid-decomposable group a with the acid to generate the polar group having a pKa of 6.0 or more;
a second heating step of heating the resist film obtained by the first heating step and reacting at least a part of the acid-decomposable group b with the acid to generate the polar group having a pKa of less than 6.0; and
a development step of developing the resist film with a developer to form a pattern,
wherein the resist film includes a resin,
the resin is one or more kinds selected from the group consisting of a resin W which does not have the acid-decomposable group a and the acid-decomposable group b, a resin X which has the acid-decomposable group a and the acid-decomposable group b, a resin Y which has the acid-decomposable group a and does not have the acid-decomposable group b, and a resin Z which has the acid-decomposable group b and does not have the acid-decomposable group a, and
the resin satisfies at least one of a requirement of including the resin X or a requirement of including the resin Y and the resin Z,
wherein an amount of change in SP value of the resin, which is obtained by the following expression (DSP), is 0.3 $MPa^{0.5}$ or more, $$\text{amount of change in SP value} = [(\delta D1-\delta D2)^2+(\delta P1-\delta P2)^2+(\delta H1-\delta H2)^2]^{0.5} \quad \text{expression (DSP)}$$

$\delta D1$: a dispersion element of the resin (unit: $MPa^{0.5}$)
$\delta P1$: a dipole-dipole element of the resin (unit: $MPa^{0.5}$)
$\delta H1$: a hydrogen bond element of the resin (unit: $MPa^{0.5}$)
$\delta D2$: a dispersion element of the resin in a case where all the acid-decomposable groups a of the resin react with the acid (unit: $MPa^{0.5}$)
$\delta P2$: a dipole-dipole element of the resin in a case where all the acid-decomposable groups a of the resin react with the acid (unit: $MPa^{0.5}$)
$\delta H2$: a hydrogen bond element of the resin in a case where all the acid-decomposable groups a of the resin react with the acid (unit: $MPa^{0.5}$).

14. A pattern forming method comprising, in the following order:
an exposure step of exposing a resist film to generate an acid in the resist film, the resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component;
a first heating step of heating the exposed resist film and reacting at least a part of the acid-decomposable group a with the acid to generate the polar group having a pKa of 6.0 or more;
a second heating step of heating the resist film obtained by the first heating step and reacting at least a part of the acid-decomposable group b with the acid to generate the polar group having a pKa of less than 6.0; and
a development step of developing the resist film with a developer to form a pattern,
wherein the resist film includes a resin,
the resin is one or more kinds selected from the group consisting of a resin W which does not have the acid-decomposable group a and the acid-decomposable group b, a resin X which has the acid-decomposable group a and the acid-decomposable group b, a resin Y which has the acid-decomposable group a and does not have the acid-decomposable group b, and a resin Z which has the acid-decomposable group b and does not have the acid-decomposable group a, and
the resin satisfies at least one of a requirement of including the resin X or a requirement of including the resin Y and the resin Z, wherein at least one of a requirement that the resin has a specific repeating unit having both the acid-decomposable group a and the photoacid generating group, the specific repeating unit has an anionic moiety and a cationic moiety, and the anionic moiety has the acid-decomposable group a, or a requirement that the resist film includes a photoacid generator which is a low-molecular-weight compound having the acid-decomposable group a, the photoacid generator has an anion and a cation, and the anion has the acid-decomposable group a is satisfied.

15. A pattern forming method comprising, in the following order:

an exposure step of exposing a resist film to generate an acid in the resist film, the resist film including an acid-decomposable group a which reacts with the acid to generate a polar group having a pKa of 6.0 or more, an acid-decomposable group b which reacts with the acid to generate a polar group having a pKa of less than 6.0, and a photoacid-generating component;

a first heating step of heating the exposed resist film and reacting at least a part of the acid-decomposable group a with the acid to generate the polar group having a pKa of 6.0 or more;

a second heating step of heating the resist film obtained by the first heating step and reacting at least a part of the acid-decomposable group b with the acid to generate the polar group having a pKa of less than 6.0; and a development step of developing the resist film with a developer to form a pattern, wherein the resist film includes a resin, the resin is one or more kinds selected from the group consisting of a resin W which does not have the acid-decomposable group a and the acid-decomposable group b, a resin X which has the acid-decomposable group a and the acid-decomposable group b, a resin Y which has the acid-decomposable group a and does not have the acid-decomposable group b, and a resin Z which has the acid-decomposable group b and does not have the acid-decomposable group a, and the resin satisfies at least one of a requirement of including the resin X or a requirement of including the resin Y and the resin Z, wherein at least one of a requirement that the resin has a specific repeating unit having both the acid-decomposable group a and the photoacid generating group, the specific repeating unit has an anionic moiety and a cationic moiety, and both the anionic moiety and the cationic moiety have the acid-decomposable group a, or a requirement that the resist film includes a photoacid generator which is a low-molecular-weight compound having the acid-decomposable group a, the photoacid generator has an anion and a cation, and both the anion and the cation have the acid-decomposable group a is satisfied.

* * * * *